(12) United States Patent
Mitani et al.

(10) Patent No.: US 6,191,463 B1
(45) Date of Patent: Feb. 20, 2001

(54) APPARATUS AND METHOD OF IMPROVING AN INSULATING FILM ON A SEMICONDUCTOR DEVICE

(75) Inventors: Yuichiro Mitani, Yokohama; Hideki Satake, Chigasaki; Akira Toriumi, Yokohama, all of (JP)

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 09/115,233

(22) Filed: Jul. 14, 1998

(30) Foreign Application Priority Data

Jul. 15, 1997 (JP) .................................................. 9-190303
Sep. 17, 1997 (JP) .................................................. 9-252356
Sep. 17, 1997 (JP) .................................................. 9-252448

(51) Int. Cl.[7] .................................................. H01L 29/78
(52) U.S. Cl. .................................................. 257/411; 257/410
(58) Field of Search .................................................. 257/410, 411

(56) References Cited

U.S. PATENT DOCUMENTS

| | | | |
|---|---|---|---|
| 4,240,096 | * | 12/1980 | Hiraki et al. .................. 257/523 |
| 5,393,676 | * | 2/1995 | Anjum et al. .................. 437/24 |
| 5,571,734 | * | 11/1996 | Tseng et al. .................. 437/40 |
| 5,660,895 | * | 8/1997 | Lee et al. .................. 427/579 |
| 5,712,208 | * | 1/1998 | Tseng et al. .................. 438/770 |
| 5,714,788 | * | 2/1998 | Ngaoaram .................. 257/411 |
| 5,753,564 | * | 5/1998 | Fukada .................. 437/238 |
| 5,814,863 | * | 9/1998 | Pan .................. 257/410 |
| 5,831,319 | * | 11/1998 | Pan .................. 257/410 |
| 5,866,930 | * | 2/1999 | Saida et al. .................. 257/316 |
| 5,869,858 | * | 2/1999 | Ozawa et al. .................. 257/296 |

* cited by examiner

*Primary Examiner*—David Hardy
(74) *Attorney, Agent, or Firm*—Oblon, Spivak, McClelland, Maier & Neustadt, P.C.

(57) ABSTRACT

A semiconductor device includes a semiconductor substrate, a first insulating film formed on the semiconductor substrate, and an electrode formed on the first insulating film. The first insulating film contains a halogen element and a combination of silicon and nitrogen or a combination of silicon, oxygen, and nitrogen. The maximum concentration of the halogen element in the first insulating film ranges from $10^{20}$ atoms/cm$^3$ to $10^{21}$ atoms/cm$^3$ inclusive. With this structure, the dielectric breakdown strength and the like of the insulating film increase, and the reliability of the insulating film improves.

11 Claims, 45 Drawing Sheets

FUG. 26J

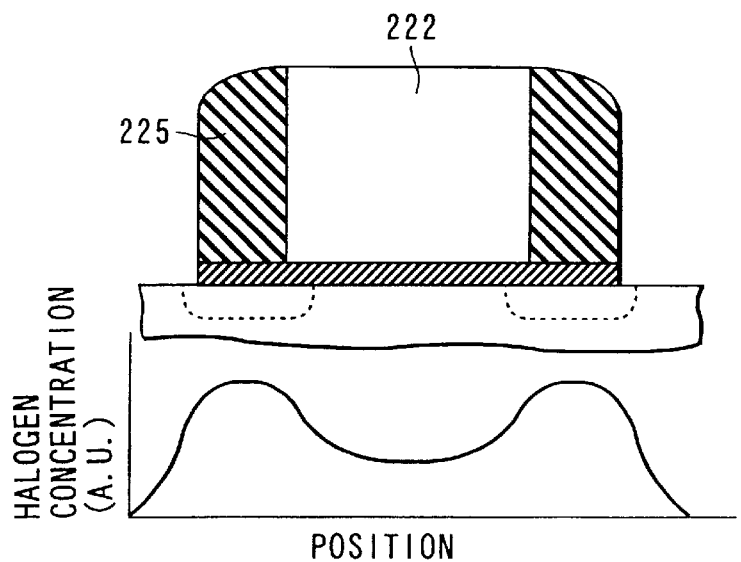
FIG. 44A
FIG. 44B
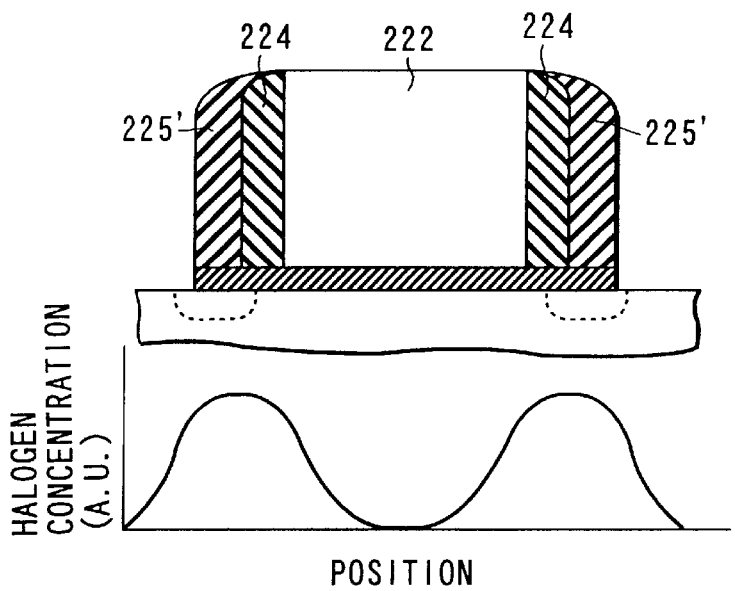
FIG. 45A
FIG. 45B
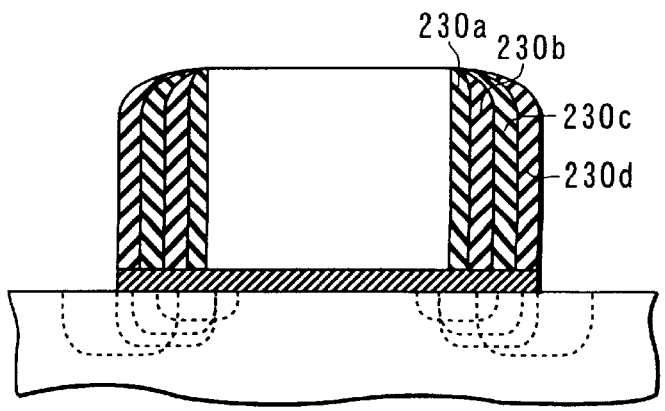
FIG. 46

APPARATUS AND METHOD OF IMPROVING AN INSULATING FILM ON A SEMICONDUCTOR DEVICE

BACKGROUND OF THE INVENTION

The present invention relates to a semiconductor device and a method of manufacturing the same and, more particularly, to a semiconductor device and a method of manufacturing the same, which can improve the reliability and the like of the gate insulating film of a MOS semiconductor device.

Recently, in a device using a gate oxide film as a tunnel oxide film, represented by an electrically programmable and erasable nonvolatile semiconductor memory (EEPROM), a high electric field of 10 MV/cm or more has been applied to the gate oxide film to write and erase data. Higher electric fields tend to be applied to the gate oxide film of a logic operation device to maintain high performance with advances in micropatterning. When the above high electric field is applied to the gate oxide film, electrons gaining high energy from the electric field pass through the gate oxide film. For this reason, high dielectric breakdown strength is required for the gate oxide film.

An empirical method of setting conditions has been used. More specifically, various oxide films are formed first while parameters such as a film formation temperature and a film formation atmosphere are variously changed. The electrical characteristics of the formed films are then evaluated to use conditions that meet the required specifications. With the current trend toward thinner gate oxide films, however, it is difficult to meet the above specifications. In addition, with the current trend toward a larger number of types of products and faster change of generations, the above empirical method of setting conditions is very inefficient. This leads to a serious problem of an increase in product cost.

As described above, although high dielectric breakdown strength is required for the tunnel insulating film of a nonvolatile memory and the gate insulating film of a logic operation device, it is very difficult to meet satisfactory specifications, resulting in a deterioration of the reliability of the device.

A gate oxide film having a thickness of 5 nm or less is required for a transistor used for a logic operation device to attain a reduction in power consumption.

To meet such requirements, i.e., to improve the reliability of a gate oxide film, e.g., to increase the dielectric breakdown strength, it is taken for granted that introduction of fluorine (F) atoms into the gate oxide film is effective. If, however, F atoms are excessively implanted into the gate oxide film, the number of electron traps increases, resulting in a deterioration in the reliability of the device.

BRIEF SUMMARY OF THE INVENTION

It is an object of the present invention to provide a semiconductor device and a method of manufacturing the same, which can improve the reliability of a gate insulating film, e.g., increasing the dielectric breakdown strength, thus improving the reliability of the device.

In order to achieve the above object, according to the first aspect of the present invention, there is provided a semiconductor device comprising:

a semiconductor substrate;

a first insulating film formed on the semiconductor substrate; and an electrode formed on the first insulating film wherein the first insulating film contains a halogen element and any one of a combination of silicon and nitrogen and a combination of silicon, oxygen, and nitrogen, and a maximum concentration of the halogen element in the first insulating film ranges from $10^{20}$ atoms/cm$^3$ to $10^{21}$ atoms/cm$^3$ inclusive.

The halogen element is preferably fluorine.

The semiconductor device further comprises a pair of impurity diffusion layers formed on the semiconductor substrate to extend along two ends of the electrode, and the electrode is interposed between the pair of impurity diffusion layers.

In the above semiconductor device, the semiconductor substrate, the insulating film, and the electrode can constitute a capacitor.

A method of manufacturing the semiconductor device according to the first aspect comprises the steps of:

forming a gate insulating film containing any one of a combination of silicon and oxygen and a combination of silicon, oxygen, and nitrogen on a semiconductor substrate; and introducing a halogen element into the gate insulating film with a maximum concentration ranging from $10^{20}$ atoms/cm$^3$ to $10^{21}$ atoms/cm$^3$ inclusive.

Note that the maximum concentration is the maximum concentration of the halogen element in the gate insulating film in the direction of thickness.

In a region near the interface between the gate insulating film and the silicon substrate, Si—F bonds with high bonding energy can be formed by terminating the dangling bonds of silicon with fluorine or substituting fluorine atoms for the hydrogen atoms of Si—H bonds with low bonding energy. In addition, fluorine may be reacted with a distorted Si—O—Si bond to separate it into an Si—O bond and an Si—F bond, thereby reducing the stress. By introducing fluorine into the gate insulating film in this manner, characteristics associated with the reliability of the gate insulating film, e.g., the TDDB (Time-Dependence-Dielectric-Breakdown) characteristics, can be improved when a high electric field is applied to the gate insulating film for a long period of time.

FIG. 1 shows the effects obtained when fluorine is introduced into a gate oxide film. Referring to FIG. 1, the abscissa represents the amount of charge (Charge-to-Breakdown: Qbd) injected into the gate oxide film when a constant electric field is kept applied to the film until dielectric breakdown occurs, and the ordinate represents an accumulated failure rate P due to dielectric breakdown as ln(−ln(1−P)). Without fluorine, the shape of the distribution indicates that many breakdowns occur at a low Qbd. With fluorine, the distribution exhibits a sharp shape, indicating that MOS semiconductor devices having oxide film quality made uniform by introducing fluorine into the films can be obtained.

FIG. 2 shows the 50% Qbd (average value of Qbd) and the Qbd$^{ex}$ failure rate (the ratio of the number of chips undergoing dielectric breakdown within short periods of time to the total number of chips) with respect to the maximum fluorine concentration in a gate oxide film. As is obvious from FIG. 2, when the maximum fluorine concentration exceeds $10^{21}$ atoms/cm$^3$, the 50% Qbd abruptly decreases, whereas when the maximum fluorine concentration becomes lower than $10^{20}$ atoms/cm$^3$, the Qbd$^{ex}$ failure rate abruptly increases to 10% or more.

FIG. 3 shows SiF/Si (i.e., the ratio of Si—F bonds) and SiF$_2$/Si (i.e., the ratio of Si—F$_2$ bonds) with respect to the maximum fluorine concentration in a gate oxide film. As is obvious from FIG. 3, when the maximum fluorine concentration in the gate oxide film exceeds $10^{21}$ atoms/cm$^3$, the number of Si—F$_2$ bonds that degrade the reliability of the gate oxide film abruptly increases.

The above description is associated with the case in which a silicon oxide film is used as a gate insulating film. The same applies to a case in which a silicon nitride film or an oxynitride film containing silicon, oxygen, and nitrogen is used.

As described above, to obtain a highly reliable gate insulating film, the maximum fluorine concentration in the gate insulating film is preferably set to $10^{20}$ atoms/cm$^3$ to $10^{21}$ atoms/cm$^3$. With this setting, even if a gate insulating film is thin (e.g., 8 nm or less), the dielectric breakdown characteristics, low-electric-field leakage current characteristics, and the like of the gate insulating film can be improved, and hence the reliability of the gate insulating film can be improved. This leads to an improvement in the reliability of the device.

The step of introducing a halogen element such as fluorine into the gate insulating film and the subsequent steps are preferably free from the annealing step at 850° C. or more for 30 min or more. If such annealing steps are performed, the halogen element is further implanted from the halogen element source into the gate insulating film. As a result, the gate insulating film may contain the halogen element at $10^{21}$ atoms/cm$^3$ or more.

For example, an annealing step such as annealing at 850° C. or more for 30 min or more is performed to activate the impurity in a semiconductor film serving as a gate electrode.

According to the present invention, in the method of manufacturing the semiconductor device, the step of introducing the halogen element into the gate electrode comprises the steps of:

forming a semiconductor film for formation of a gate electrode on the gate insulating film, the semiconductor film containing the activated halogen element; and introducing the halogen element into the gate insulating film by annealing after the step of forming the semiconductor film.

Alternatively, the step of introducing the halogen element into the gate insulating film comprises the step of introducing the halogen element contained in a region around the gate insulating film into the gate insulating film by annealing.

In this case, the step of introducing a halogen element such as fluorine into the gate insulating film and the subsequent steps are preferably free from the annealing step at 850° C. or more for 30 min or more.

If the step of forming, on the gate insulating film, the gate electrode formation semiconductor film, which contains the activated halogen element can be performed without the annealing step at a high temperature for a long period of time, e.g., annealing at 850° C. or more for 30 min or more, the step of introducing the halogen element into the gate insulating film can be performed before this step.

In the present invention, when a halogen element is to be introduced into the gate insulating film, the halogen element contained in the gate electrode formation semiconductor film or a region around the gate insulating film is preferably introduced into the gate insulating film by annealing. More specifically, the halogen element can be introduced into the gate insulating film as follows.

(a) The halogen element contained in the gate electrode formation semiconductor film is introduced into the gate insulating film by annealing.

(b) The halogen element contained in the side wall insulating films (silicon nitride films or the like) formed on the side walls of the gate electrode is introduced into the gate insulating film by annealing.

(c) The halogen element contained in the element isolation insulating films (silicon oxide films or the like) is introduced into the gate insulating film by annealing.

(d) The halogen element contained in the insulating film formed on the gate electrode is introduced into the gate insulating film by annealing.

(e) The halogen element contained in films serving as interconnections (e.g., metal films connected to the source and the drain) is introduced into the gate insulating film by annealing.

(f) When the semiconductor substrate is a so-called SOI substrate, the halogen element contained in the insulating layer (silicon oxide film or the like) buried under the semiconductor layer in which a device is to be manufactured is introduced into the gate insulating film by annealing.

(g) After a halogen element or halide in the form of a gas or liquid is adsorbed to the upper surface of the gate insulating film, a gate electrode formation semiconductor film is formed on the gate insulating film. The adsorbed halogen element is then introduced into the gate insulating film by annealing. In this case, the step of causing the upper surface of the gate insulating film to adsorb the halogen element or the like and the step of forming the semiconductor film on the gate insulating film are preferably performed continuously in a vacuum or an inoxidizable atmosphere.

(h) A halogen element is introduced from the lower surface side of the semiconductor substrate into the semiconductor substrate, and the halogen element contained in the semiconductor substrate is introduced into the gate insulating film by annealing.

(i) An amorphous silicon film containing a halogen element is formed between the silicon film serving as a gate electrode and the gate insulating film, and the halogen element contained in the amorphous silicon film is introduced into the gate insulating film by annealing.

In the present invention, for example, the halogen element contained in the gate electrode formation semiconductor film (silicon film) is introduced into the gate insulating film as follows.

(a) A silicon film is formed on the gate insulating film. A Group III or V impurity element or ions containing it are introduced into this silicon film. This impurity element is activated by annealing. Thereafter, the halogen element or ions containing it are introduced into the silicon film, and the halogen element is diffused into the gate insulating film by annealing.

(b) A silicon film is formed on the gate insulating film. A halogen element or ions containing it are introduced into this silicon film. The halogen element is diffused into the gate insulating film by annealing. Thereafter, a Group III or V impurity element or ions containing it are introduced into the silicon film. This impurity element is activated by annealing. In this case, the annealing step of activating the impurity element is preferably performed under conditions other than the following conditions: annealing temperature=850° C. or more and annealing time=30 min or more.

(c) A silicon containing a Group III or V impurity element is formed on the gate insulating film (by using, for example, a gas containing silicon and a gas containing an impurity element). Thereafter, a halogen element or ions containing it are introduced into the silicon film, and the halogen element is diffused into the gate insulating film by annealing.

(d) A silicon film containing a Group III or V impurity element and a halogen element is formed on the gate insulating film (by using, for example, a gas containing silicon and a gas containing an impurity element; a halogen element is contained in at least one of these gases). Thereafter, the halogen element in the silicon film is diffused into the gate insulating film by annealing.

(e) A silicon film is formed on the gate insulating film, and halide ions of a Group III or V impurity element are introduced into this silicon film. In addition, Group III or V impurity element ions are introduced into the silicon film, and the halogen element is diffused into the gate insulating film by annealing.

The present invention can also be applied to a nonvolatile memory cell having a first insulating film (tunnel oxide film), a first electrode (floating gate), a second insulating film, and a second electrode (control gate) stacked on a semiconductor substrate, as well as a general MOS transistor having a gate electrode formed on a semiconductor substrate through a gate insulating film. In this case, a halogen element is preferably introduced into the first and second insulating films (for example, the halogen element contained in the second electrode is introduced into the first and second insulating films by annealing after the halogen element is introduced into the second electrode).

According to the second aspect of the present invention, there is provided a semiconductor device comprising:

a semiconductor substrate;

a first insulating film formed on the semiconductor substrate and containing a halogen element;

a gate electrode formed on the first insulating film; and a pair of impurity diffusion regions formed on the semiconductor substrate to extend along two end portions of the gate electrode, wherein halogen element concentrations near an interface between th e first insulating film and the semiconductor substrate and an interface between the first insulating film and the gate electrode are not less than a halogen element concentration near a central portion of the first insulating film in a direction of thickness.

The maximum concentration of the halogen element in the first insulating film preferably ranges from $10^{20}$ atoms/cm$^3$ to $10^{21}$ atoms/cm$^3$ inclusive.

Typically, a silicon substrate is used as the semiconductor substrate; fluorine, as the halogen element; a silicon film, an oxygen/nitrogen insulating film (oxynitride film), or a silicon/nitrogen insulating film (silicon nitride film), as the insulating film; and a polysilicon electrode, as the electrode. Note that a ferroelectric film having a perovskite structure can also be used as an insulating film.

FIG. 4 shows the reliability improving effect obtained when fluorine is introduced into two interfaces of an oxynitride film as an insulating film of an n-channel MIS transistor. Referring to FIG. 4, the abscissa represents the amount of charge (Charge-to-Breakdown: Qbd) injected into the gate oxide film when a constant electric field is kept applied to the film until dielectric breakdown occurs, and the ordinate represents an accumulated failure rate P due to dielectric breakdown as ln(−ln(1−P)). As is obvious from this graph, the distribution shape is improved by introducing fluorine into the two interfaces of the gate insulating film.

Assume that a predetermined concentration of fluorine is introduced into one interface (the interface of the gate insulating film on the polysilicon side serving as a gate electrode) of the gate insulating film. In this case, an improving effect can be obtained when electrons are injected from the silicon substrate. No improving effect, however, can be obtained when electrons are injected from the gate electrode. In contrast to this, when fluorine is introduced into the two interfaces of the gate insulating film, the Weibull distribution of Qbd is improved in shape regardless of the direction in which electrons are injected.

As described above, according to the present invention, the introduction of the halogen element reduces the defect densities of the two interfaces of the gate insulating film, thereby increasing the dielectric breakdown resistance. In addition, this can suppress an increase in low-electric-field leakage current after application of a high electric field stress on the gate insulating film. Therefore, the reliability of the gate insulating film is improved, and hence the reliability and characteristics of the device can be improved.

A method of manufacturing the semiconductor device according to the second aspect comprises the steps of:

forming an electrode on a semiconductor substrate through an insulating film ;

forming impurity diffusion regions on the semiconductor substrate to extend along two end portions of the electrode; and diffusing a halogen element contained in one of the semiconductor substrate, the insulating film, and the electrode into two interfaces of the insulating film.

Typically, halogen element ions are implanted into the semiconductor substrate, the gate insulating film, and the gate electrode formation film such that the peak concentration appears in the gate insulating film. The halogen element is then diffused into the two interfaces of the gate insulating film by annealing.

Typically, after halogen element ions are implanted into the semiconductor substrate, a gate electrode formation film is formed through the gate insulating film. Halogen element ions are then implanted into the gate insulating film. The halogen element introduced into the semiconductor substrate and the gate electrode formation film is diffused into the two interfaces of the gate insulating film.

According to each method described above, since a halogen element can be effectively introduced into the two interfaces of the gate insulating film (for example, the diffused halogen element piles up in the interfaces of the gate insulating film, and the halogen element concentrations near the interfaces increase), an improvement in the reliability of the gate insulating film, e.g., an improvement in TDDB characteristics, can be attained, as described above.

Assume that fluorine is to be introduced into a polysilicon film serving as a gate electrode, and the fluorine is to be introduced into the gate insulating film by thermal diffusion. In this case, if the gate insulating film is an oxide film, since fluorine can be relatively easily diffused into the oxide film, fluorine can be introduced into the two interfaces of the oxide film. If, however, an oxynitride film or nitride film that suppress diffusion of fluorine is used as a gate insulating film, a predetermined concentration of fluorine cannot be introduced into the interface between the silicon substrate and the gate insulating film.

FIG. 5 shows a fluorine profile in the direction of depth which is obtained when fluorine is diffused from only a polysilicon film formed on an oxynitride film. Diffusion of fluorine is suppressed by a nitrogen-containing region to make it difficult to introduce fluorine into the interface between the silicon substrate and oxynitride film.

FIG. 6 shows a fluorine profile in the direction of depth which is obtained when fluorine is introduced into the gate insulating film by the method of the present invention. Fluorine can be introduced into the two interfaces of the oxynitride film at high concentrations.

According to the manufacturing method described above, since bonds in the gate insulating film are broken when halogen element ions are implanted, an insulating film structure can be reconstructed by annealing afterward.

Assume that annealing cannot be performed at a high temperature after ion implantation of a halogen element. In this case, if halogen element ions are implanted to pass through the gate insulating film, a gate insulating film structure is difficult to reconstruct. According to the second method, since the halogen element introduced into the semiconductor substrate and the gate electrode formation film is diffused into the gate insulating film., the halogen element can be effectively introduced into the two interfaces of the gate insulating film without breaking bonds in the gate insulating film upon ion implantation.

There is provided a modification of the semiconductor device according to the second aspect described above, wherein the gate electrode comprises a first electrode formed on the first insulating film, a second insulating film formed on the first electrode and containing the halogen element, and a second electrode formed on the second insulating film, and concentrations of the halogen element near an interface between the second insulating film and the first electrode and an interface between the second insulating film and the second electrode are not less than a concentration of the halogen element near a central portion of the second insulating film in a direction of thickness.

The maximum concentration of the halogen element in the second insulating film preferably ranges from $10^{20}$ atoms/cm$^3$ to $10^{21}$ atoms/cm$^3$ inclusive.

Typically, a silicon substrate is used as the semiconductor substrate; fluorine, as the halogen element; a silicon film, an oxygen/nitrogen insulating film (oxynitride film), or a silicon/nitrogen insulating film (silicon nitride film), as the first insulating film; and polysilicon electrodes, as the first and second electrodes.

In the above modification as well, by introducing a halogen element into the two interfaces of the insulating film, the reliability of the insulating film is improved, and hence the reliability and characteristics of the device can be improved.

By introducing a halogen element into the two interfaces of each of the first and second insulating films, the dielectric breakdown strength and stress leakage characteristics of the first insulating film through which electrons tunnel can be improved. In addition, the second insulating film under the second electrode that controls input/output of electrons acquires uniform characteristics.

In the method of manufacturing the semiconductor device corresponding to the modification, the step of forming the gate electrode comprises the step of forming a first electrode on the first insulating film, a second insulating film on the first electrode, and a second electrode on the second insulating film, and the step of diffusing the halogen element into the two interfaces of the first insulating film comprises the step of diffusing the halogen element contained in the first and second electrodes into two interfaces of the second insulating film.

Alternatively, the step of forming the gate electrode comprises the step of forming a first electrode on the first insulating film, a second insulating film on the first electrode, and a second electrode on the second insulating film, the method further comprises the step of forming a third insulating film containing a halogen element and covering the first insulating film, the first electrode, the second insulating film, and the second electrode, after the step of forming the gate electrode, and the step of diffusing the halogen element into the two interfaces of the first insulating film comprises the step of diffusing the halogen element contained in the third insulating film into the first and second insulating films.

According to the manufacturing method of each modification described above, since a halogen element can be effectively introduced into portions near the two interfaces of each of the first and second insulating films, the reliability of the insulating film is improved, and hence the reliability and characteristics of the device can be improved.

According to the third aspect of the present invention, there is provided a semiconductor device comprising:

a semiconductor substrate;

an insulating film formed on the semiconductor substrate and containing a halogen element;

a gate electrode formed on the insulating film; and a pair of impurity diffusion regions formed on the semiconductor substrate to extend along two end portions of the gate electrode, wherein a concentration of the halogen element contained in a portion of the insulating film which is located near at least one of the pair of impurity diffusion regions is higher than a concentration of the halogen element contained in a portion of the insulating film which is located near a central portion between the pair of impurity diffusion regions.

A maximum concentration of the halogen element in the gate insulating film preferably ranges from $10^{20}$ atoms/cm$^3$ to $10^{21}$ atoms/cm$^3$ inclusive.

The maximum concentration of the halogen element appears at two end portions of the gate insulating film which are in contact with the impurity diffusion layers.

A method of manufacturing the semiconductor according to the third aspect comprises the steps of:

forming an electrode on a substrate through an insulating film;

forming a pair of impurity diffusion regions along two end portions of the electrode; and causing a portion of the insulating film which is located near at least one of the pair of impurity diffusion regions to contain a halogen element at a higher concentration than a portion of the insulating film which is located near a central portion between the pair of impurity diffusion regions.

The halogen element may be contained in both the portions of the gate insulating film which are located near the source and drain regions at high concentrations. It suffices, however, if the halogen element is contained in the portion of the gate insulating film which is located near at least one of the regions, especially the drain region.

According to the present invention, an increase in dielectric breakdown strength can be attained by increasing the concentration of the halogen element especially in the portion of the gate insulating film which is located near the drain region in which electrons gain high energy. An increase in the number of electron traps can be suppressed by decreasing the concentration of the halogen element in the portion of the gate insulating film which is located in the channel region sandwiched between the source and drain regions. By causing the halogen element concentration in the gate insulating film to have a predetermined distribution, an increase in the number of traps in the gate insulating film and a deterioration in dielectric breakdown strength can be suppressed. This can improve the characteristics and reliability of the semiconductor device.

The present invention can also be applied to a semiconductor device having a channel formed vertically with respect to the major surface of the semiconductor substrate, as well as a general semiconductor device having a channel formed horizontally with respect to the major surface of the semiconductor substrate.

In the semiconductor device in which the channel is formed in the horizontal direction, for example, after a gate electrode is patterned, an insulating film may be formed to cover the patterned gate electrode, and the halogen element contained in the insulating film may be diffused into the gate insulating film. With this process, since the gate electrode is formed on the gate insulating film near the channel region, diffusion of the halogen element is suppressed, and the halogen element can be effective introduced into the portions of the gate insulating film which are located near the source and drain regions at high concentrations.

Semiconductor devices each having a channel formed in the vertical direction include a device in which a gate electrode is formed on a side wall of a trench in the upper surface of a semiconductor substrate, and source and drain regions are formed in correspondence with the two end portions of the gate electrode. A semiconductor device having such a structure can be effectively manufactured by the following manufacturing methods.

According to the first method, a trench in which a gate insulating film and a gate electrode are formed is filled up with an insulating film having a halogen element concentration distribution in the vertical direction of the trench, and the halogen element in this insulating film is diffused into the gate insulating film.

The concentration distribution is set such that the halogen element concentration in at least one of the upper and lower portions of trench is higher than that in the central portion of the trench. By diffusing the halogen element from the insulating film having such a concentration distribution into the gate insulating film, the halogen element can be effectively introduced into the portions of the gate insulating film which are located near the source and drain regions at high concentrations.

According to the second method, an insulating film is formed in a trench having a gate insulating film and a gate electrode formed on its inner wall such that a space is formed above the bottom portion of the trench. A halogen element is implanted into the insulating film from above the substrate. The implanted halogen element is diffused into the gate insulating film.

According to this method, since ion implantation is performed from above the substrate, the halogen element is not implanted much into the portion of the insulating film which is formed on the middle portion of the side wall of the trench, and the halogen element is implanted into the portions of the insulating film which are formed in the regions on the bottom portion and the upper portion of the trench at high concentrations. By diffusing the halogen element from the insulating film having such a concentration distribution into the gate insulating film, the halogen element can be effectively introduced into the portions of the gate insulating film which are located near the source and the drain at high concentrations.

Note that the present invention can also be effectively applied to a memory cell used for a nonvolatile semiconductor memory. More specifically, in a semiconductor device in which a first insulating film, a first electrode, a second insulating film, and a second electrode are stacked on each other, and source and drain regions are formed in correspondence with the two end portions of the first electrode, a high concentration of halogen element is introduced into a portion of the first insulating film which is located near at least one of the source and drain regions. In this case as well, as described above, an insulating film having excellent characteristics and reliability can be obtained.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 26A to 26K are sectional views sequentially showing the steps in manufacturing a CMOS transistor according to the 16th embodiment of the present invention;

FIG. 44A is a sectional view showing the structure of a gate electrode in the 26th embodiment;

FIG. 44B is a graph showing the concentration distribution of a halogen element along the gate electrode (in the channel direction) in FIG. 44A;

FIG. 45A is a sectional view showing a modification of the side wall insulating films in the 26th embodiment;

FIG. 45B is a graph showing the concentration distribution of a halogen element along a gate electrode (channel direction) in FIG. 45A; and FIG. 46 is a sectional view showing another modification of the side wall insulating films in the 26th embodiment.

DETAILED DESCRIPTION OF THE INVENTION

Embodiments of the present invention will be described below with reference to the views of the accompanying drawing.

First Embodiment

Figure 1:
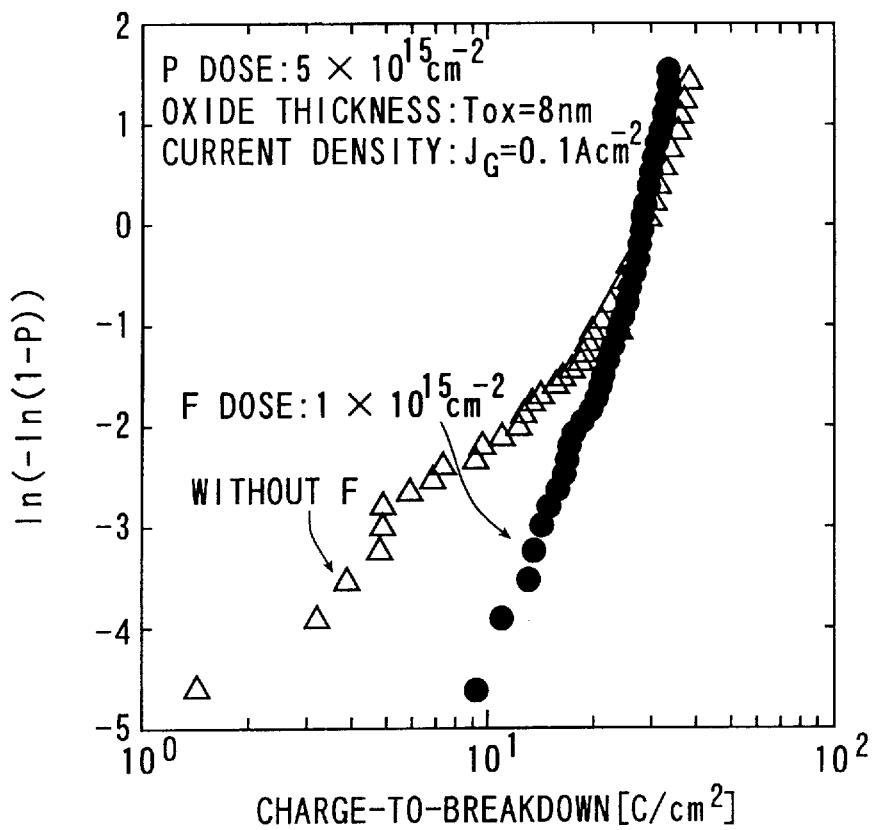
FIG. 1 is a graph showing the difference between dielectric breakdown strength increasing effects with and without fluorine.
Figure 2:
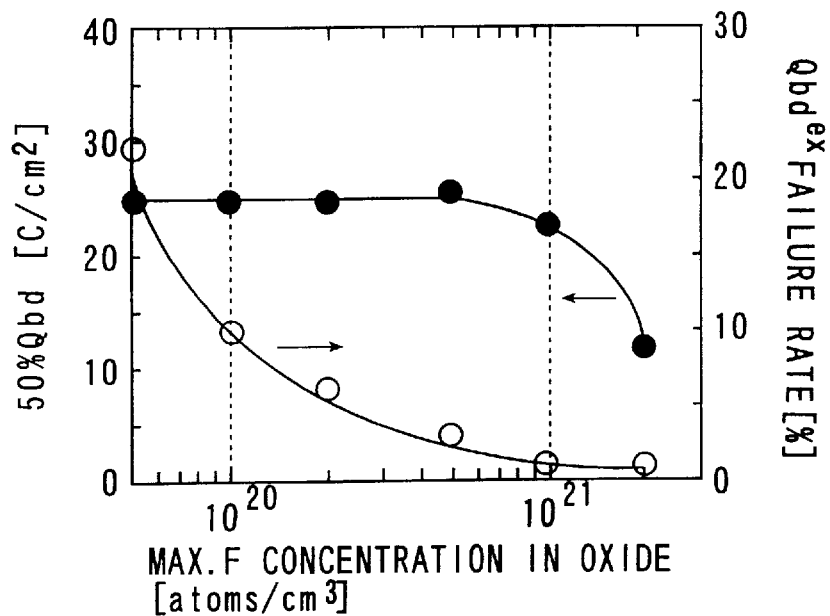
FIG. 2 is a graph showing the relationship between the 50% Qbd with respect to the maximum fluorine concentration in a gate oxide film and the $Qbd^{ex}$ failure rate.
Figure 3:
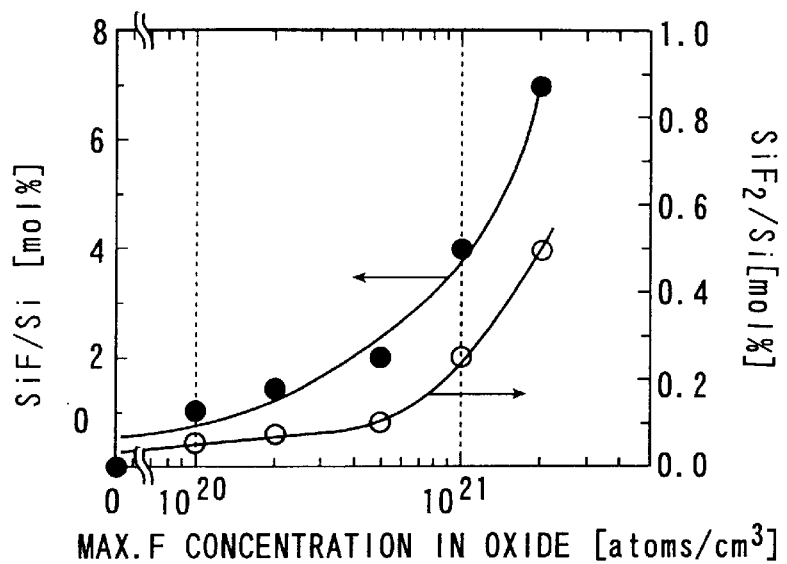
FIG. 3 is a graph showing the relationship between SiF/Si and $SiF_2$/Si with respect to the maximum fluorine concentration in the gate oxide film.
Figure 4:
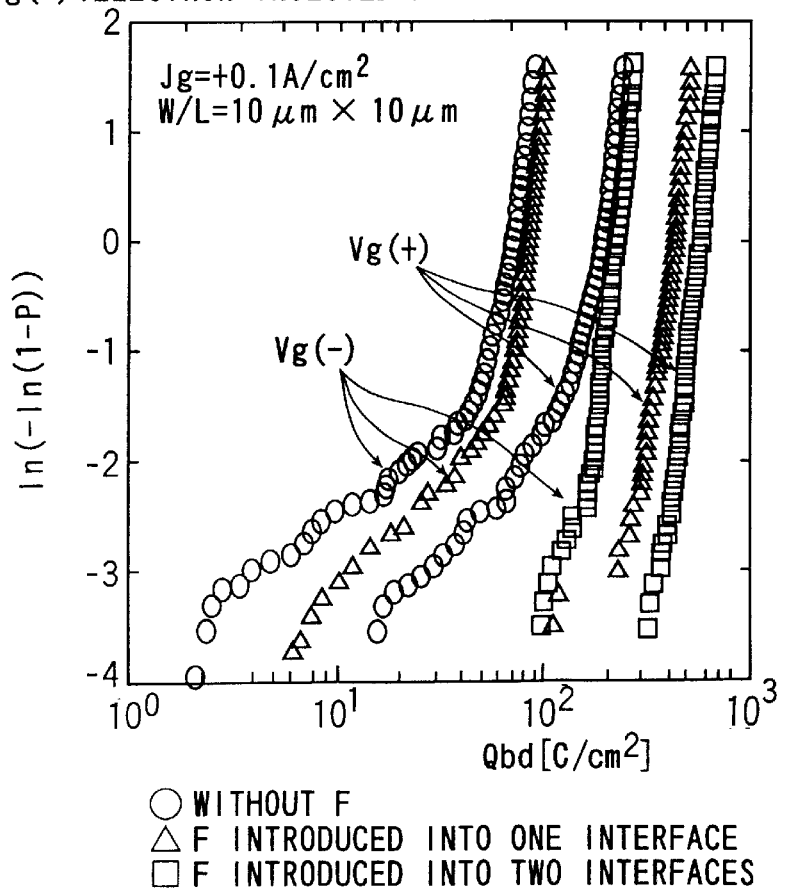
FIG. 4 is a graph showing Weibull distributions of Qbd.
Figure 5:
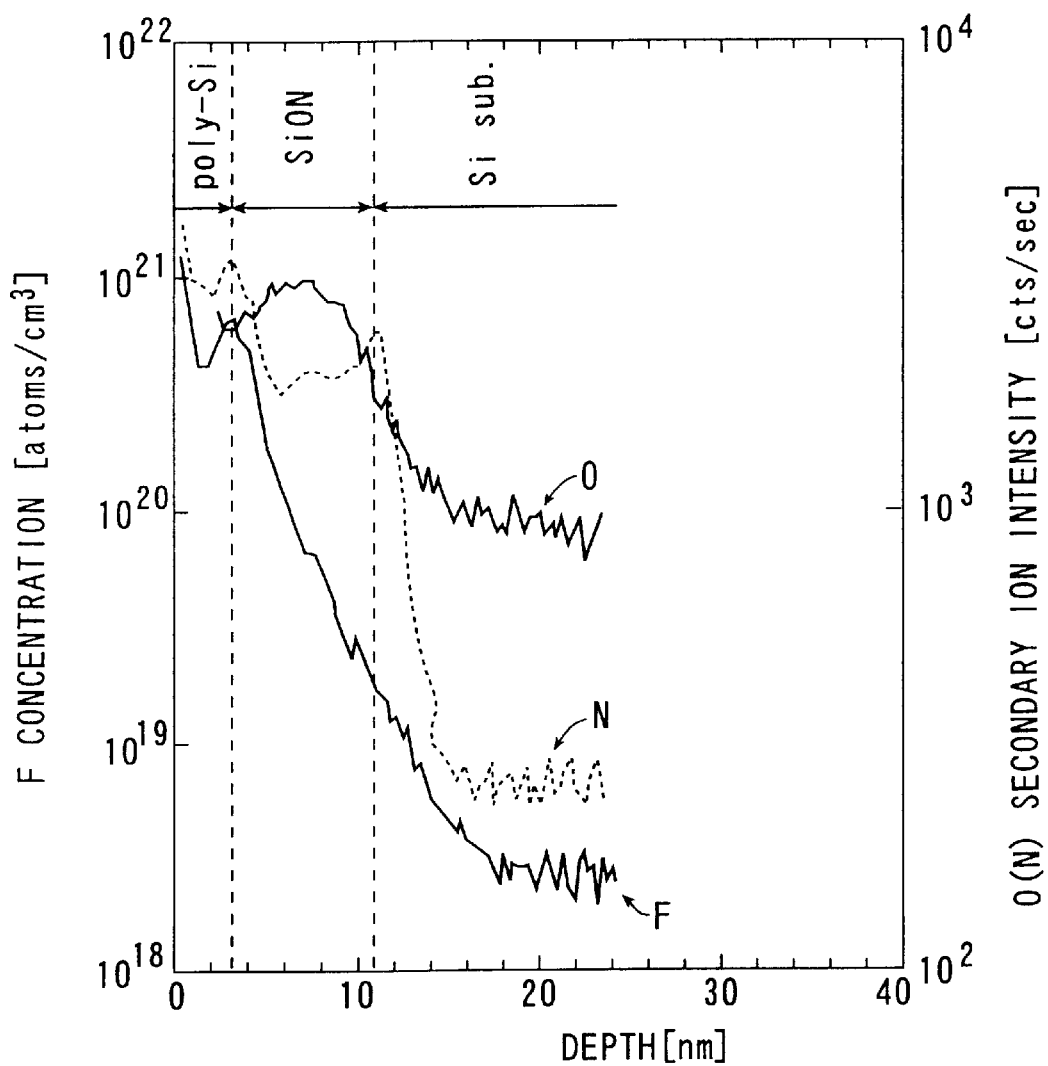
FIG. 5 is a graph showing the fluorine profiles in the direction of depth, each of which is obtained when fluorine is introduced into one interface of an oxynitride film.
Figure 6:
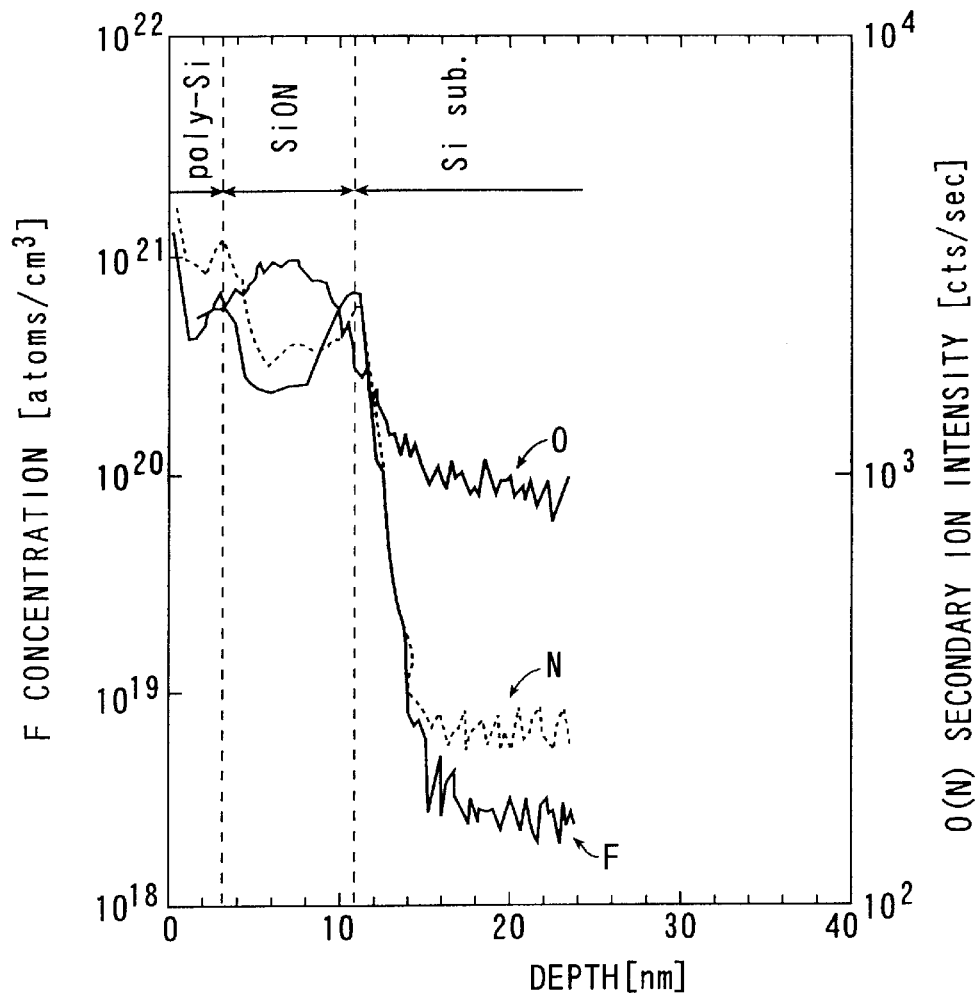
FIG. 6 is a graph showing the fluorine profiles in the direction of depth, each of which is obtained when fluorine is introduced into two interfaces of an oxynitride film.
Figure 7:
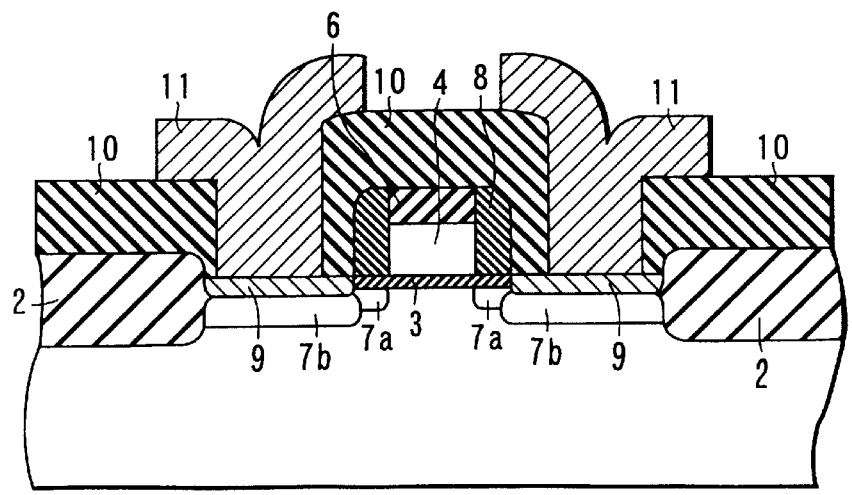
FIG. 7 is a sectional view showing a MOS transistor according to the first embodiment of the present invention.

FIG. 7 is a sectional view of an n-channel transistor in the first embodiment. Silicon thermal oxide films 2 for element isolation are formed on a p-type silicon substrate 1. N-type source and drain diffusion layers 7a and 7b are formed in the upper surface of the silicon substrate by ion implantation of phosphorus. An insulating film mainly consisting of silicon, oxygen, and nitrogen is formed as a gate insulating film 3 on the upper surface of the silicon substrate. Fluorine atoms are introduced into the gate insulating film 3. A CVD silicon oxide film 6 is formed on a polysilicon film 4 serving as a gate electrode. Silicon nitride films 8 are formed on side walls of the gate electrode. Silicide films 9 are formed in the source and drain regions. Contact holes are formed in a CVD silicon oxide film 10, and an Al electrode 11 serving as interconnections are formed in the contact holes by sputtering. The Al electrode 11 is patterned.

FIGS. 8A to 8L are sectional views sequentially showing the steps in a method of manufacturing the n-channel MOS transistor in FIG. 7.

Figure 8A:
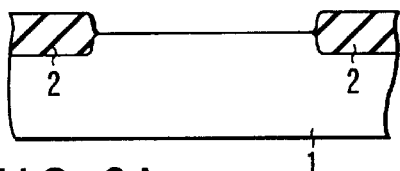
FIGS. 8A to 8L are sectional views sequentially showing the steps in manufacturing the MOS transistor according to the first (and fourth) embodiment of the present invention.

As shown in FIG. 8A, for example, the (100)-oriented p-type silicon substrate 1 with a resistivity of 4 to 6 Ωcm is prepared. The silicon thermal oxide films 2, each having a thickness of about 0.6 µm, are formed on the upper surface of the p-type silicon substrate 1 by a general selective oxidation method.

Figure 8G:
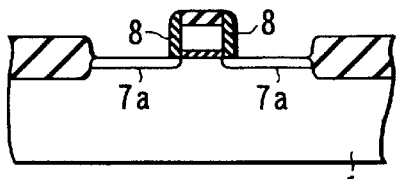
Figure 8B:
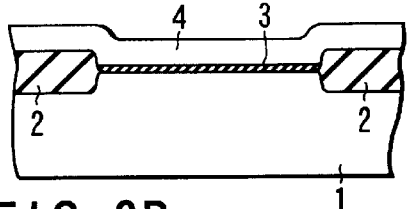

As shown in FIG. 8B, the gate insulating film 3 having a thickness of 8 nm is formed on the p-type silicon substrate 1 by, for example, thermal oxidation using dry oxygen. The 200-nm thick polysilicon film 4 is deposited as a gate electrode on the gate insulating film 3. Phosphorus ions are implanted into this polysilicon film 4 at an acceleration voltage of 30 keV and a dose of $5\times10^{15}$ cm$^{-2}$. In this case, the phosphorus distribution immediately after ion implantation has its peak concentration in the polysilicon film 4. The resultant structure is annealed in a nitrogen atmosphere at 900° C. for 30 min. As a result, the implanted phosphorus is activated to decrease the resistance of the polysilicon film 4.

Figure 8H:
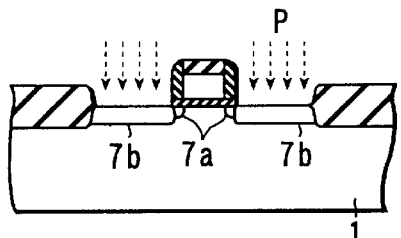
Figure 8C:
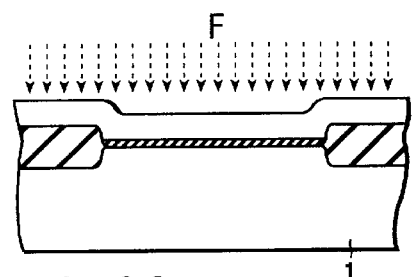

As shown in FIG. 8C, fluorine ions are implanted into the entire surface of the polysilicon film 4 at an acceleration voltage of 20 keV and a dose of $1\times10^{15}$ cm$^{-2}$. In this case, the fluorine distribution immediately after ion implantation has its peak concentration in the polysilicon film 4, but no fluorine ions are implanted into the gate insulating film 3. Annealing is then performed under conditions other than "850° C. or more and 30 min or more". For example, annealing is performed in a nitrogen atmosphere at 800° C. for 30 min. As a result, the implanted fluorine ions are diffused into the gate insulating film 3.

Figure 8I:
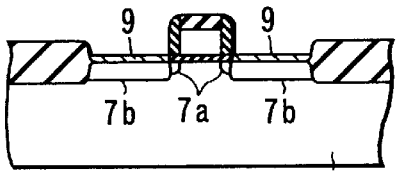
Figure 8D:
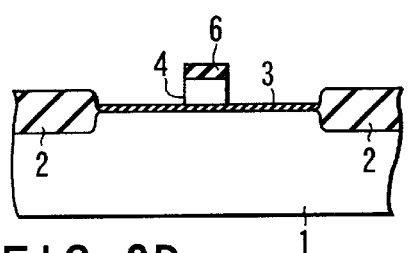

As shown in FIG. 8D, the 150-nm thick CVD silicon oxide film 6 is deposited on the polysilicon film 4 by LP-CVD. After patterning is performed by using a resist mask, the polysilicon film 4 and the CVD silicon oxide film 6 are etched by reactive ion etching to form a gate portion.

Figure 8J:
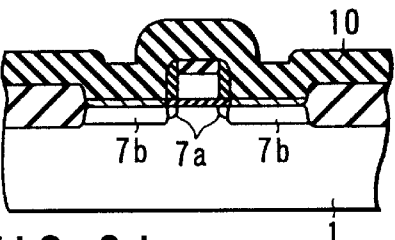
Figure 8E:
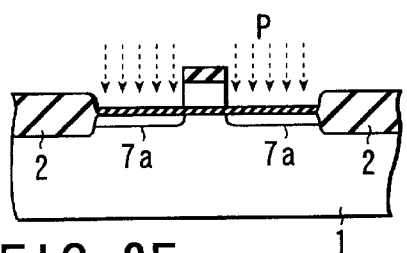

As shown in FIG. 8E, phosphorus ions are implanted at a dose of $1\times10^{15}$ cm$^{-2}$ to form source and drain regions. The implanted ions are distributed in the silicon substrate mainly at the peak depth dependent on the acceleration energy. Thereafter, the resultant structure is annealed at 950° C. for 30 sec to diffuse and activate the phosphorus ions in the silicon substrate. As a result, the diffusion layers 7a serving as source and drain regions are formed.

Figure 8K:
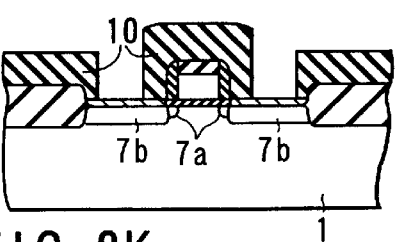
Figure 8F:
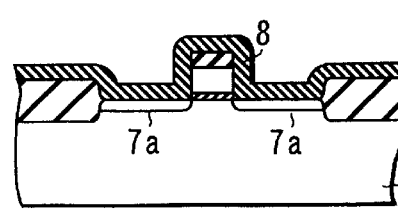

As shown in FIG. 8F, for example, the 100-nm thick silicon nitride film 8 is deposited on the entire surface of the resultant structure to form side wall insulating films on side walls of the gate portion.

As shown in FIG. 8G, the silicon nitride film is etched by reactive ion etching to form the gate side wall portions 8.

As shown in FIG. 8H, phosphorus ions are implanted into the resultant structure by using the gate electrode as a mask. The implanted phosphorus ions are distributed in the silicon substrate mainly at the peak depth dependent on the acceleration energy. Thereafter, annealing is performed at, for example, 950° C. for 30 sec to diffuse and activate the phosphorus ions in the silicon substrate. As a result, the diffusion layers 7b serving as source and drain regions are formed.

As shown in FIG. 8I, a 25-nm thick titanium film and a 50-nm thick titanium nitride film are sequentially deposited on the entire surface of the resultant structure. Annealing is then performed in a nitrogen atmosphere at 700° C. for 1 min to cause the entire titanium film to react with the silicon substrate. As a result, the titanium silicide films 9 is formed in only the source and drain regions.

Subsequently, the titanium nitride film and the unreacted titanium film on the insulating film are selectively peeled off by, for example, an aqueous solution of hydrofluoric acid and a solution mixture of sulfuric acid and hydrogen peroxide.

As shown in FIG. 8J, the 300-nm thick silicon oxide film 10 is deposited on the entire surface of the resultant structure.

As shown in FIG. 8K, contact holes are formed in the silicon oxide film 10 by anisotropic dry etching.

Figure 8L:
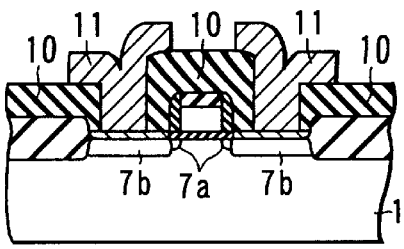

As shown in FIG. 8L, an 800-nm thick aluminum film containing, for example, 0.5% of silicon and 0.5% of copper is formed on the CVD silicon oxide film 10 and is patterned to form the source and drain electrodes 11. Thereafter, the sample is annealed in a nitrogen atmosphere containing 10% of hydrogen at 450° C. for 15 min.

In the first embodiment, after phosphorus as a dopant is ion-implanted into the polysilicon film 4 serving as a gate electrode and is activated, fluorine ions are implanted and diffused into the gate insulating film 3. However, phosphorus ions may be implanted after fluorine ions are implanted. For example, first of all, fluorine ions are implanted into the polysilicon film at an acceleration voltage of 20 keV and a dose of $1\times10^{15}$ cm$^{-2}$ to have its peak concentration in the polysilicon film. The resultant structure is annealed at 850° C. or more for 30 min or less to diffuse the implanted fluorine ions into the gate oxide film. Thereafter, for example, phosphorus ions are implanted into the polysilicon film at an acceleration voltage of 30 keV and a dose of $5\times10^{15}$ cm$^{-2}$. The resultant structure is annealed in a nitrogen atmosphere at 850° C. or more for 30 min or less (e.g., 850° C. for 20 min) to activate the implanted phosphorus ions.

As a polysilicon film serving as a gate electrode, a polysilicon film containing phosphorus can also be formed by using a gas mixture of silane (SiH$_4$) and phosphine (PH$_3$). In this case, for example, fluorine ions are implanted into the polysilicon film at an acceleration voltage of 20 keV and a dose of $1\times10^{15}$ cm$^{-2}$. The resultant structure is annealed in a nitrogen atmosphere at 800° C. for 30 min to diffuse the fluorine ions into the gate oxide film. With this process, the same effect as described above can be obtained.

As a method of forming a polysilicon film containing phosphorus, a method of forming a polysilicon film containing phosphorus and fluorine by using a gas mixture of difluorosilane (SiH$_2$F$_2$) and phosphine (PH$_3$) may be used. When the resultant structure is annealed in a nitrogen atmosphere at 800° C. for 30 min to diffuse the fluorine ions in the polysilicon film into the insulating film, the same effect as described above can be obtained.

Consider a p-channel MOSFET. In this case, for example, BF$_2$ ions are implanted into the polysilicon film at an acceleration voltage of 30 keV and a dose of $1\times10^{15}$ cm$^{-2}$. Boron ions are then implanted into the polysilicon film at an acceleration voltage of 10 keV and a dose of $4\times10^{15}$ cm$^{-2}$. In this case, since the upper surface layer of the polysilicon film is formed into an amorphous layer by ion implantation of BF$_2$, the implanted boron ions cause no channeling and can be distributed in only the polysilicon film. Subsequently, the resultant structure is annealed in a nitrogen atmosphere at 800° C. for 30 min. As a result, the implanted boron ions are activated, and at the same time, the fluorine ions are diffused into the gate oxide film, thereby obtaining the same effect as that obtained in the case of the n-channel MOSFET. In addition, $BF_2$ can prevent excessive introduction of fluorine.

Figure 9:
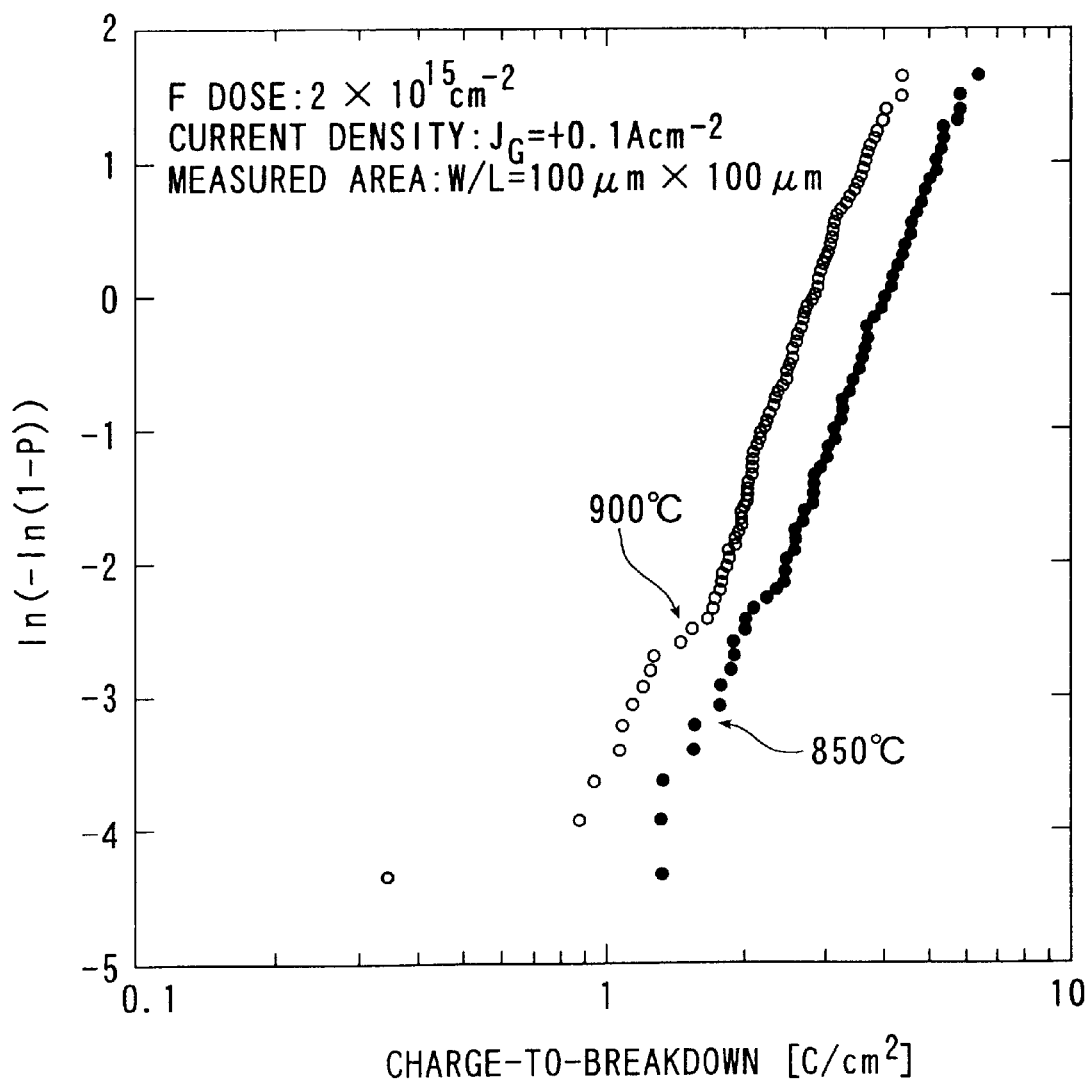
FIG. 9 is a graph showing the difference between the dielectric breakdown strength increasing effects obtained at different annealing temperatures after introduction of fluorine.

FIG. 9 shows Weibull distributions of Qbd (Charge-to-Breakdown) respectively obtained when the annealing process is performed at 850° C. for 30 min and at 900° C. for 30 min after implantation of fluorine into the n-channel MOSFET. According to this graph, when annealing is performed at 900° C. for 30 min, the average Qbd becomes lower than when annealing is performed at 850° C. for 30 min. In addition, points indicating Qbd values lower than the average appear. Obviously, the long-term reliability with respect to the dielectric breakdown of the oxide film deteriorates. It is therefore preferable to avoid annealing at 850° C. or more for 30 min after the fluorine implantation process.

Second Embodiment

In this embodiment, the present invention is applied to a semiconductor device using a Salicide (Self-Aligned-Silicide) process. FIGS. 10A to 10L sequentially show the steps in a method of manufacturing this device.

Figure 10A:
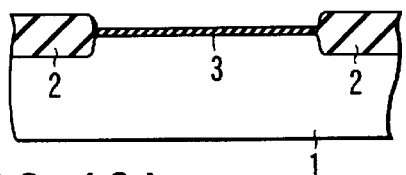
FIGS. 10A to 10L are sectional views sequentially showing the steps in manufacturing a MOS transistor according to the second embodiment of the present invention.

First of all, as shown in FIG. 10A, for example, a (100)-oriented p-type silicon substrate 1 with a resistivity of 4 to 6 Ωcm is prepared. Element isolation insulating films 2, each having a thickness of about 0.6 μm, are formed on the upper surface of the p-type silicon substrate 1 by a general selective oxidation method. In addition, an 8-nm thick gate oxide film 3 is formed on the p-type silicon substrate 1 by thermal oxidation using dry oxygen.

Figure 10B:
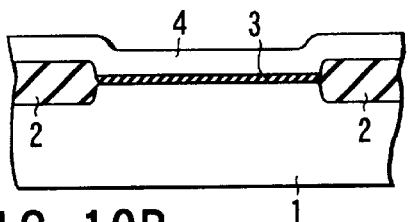

As shown in FIG. 10B, a 200-nm thick polysilicon film 4 is deposited as a gate electrode on the gate oxide film 3.

Figure 10C:
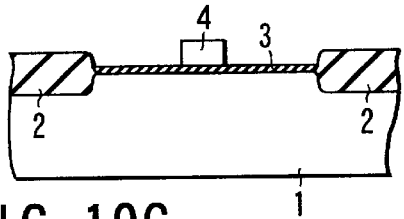

As shown in FIG. 10C, the polysilicon film 4 is etched by reactive ion etching using a resist mask to form a gate portion.

Figure 10D:
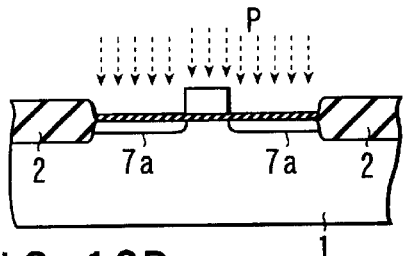

As shown in FIG. 10D, phosphorus ions are implanted into the polysilicon film 4 and the p-type silicon substrate 1 at an acceleration voltage of 30 keV and a dose of $1\times10^{15}$ $cm^{-2}$. The resultant structure is annealed in a nitrogen atmosphere at 950° C. for 30 sec to activate the phosphorus ions in the polysilicon film 4, thereby forming source and drain diffusion layers 7a.

Figure 10E:
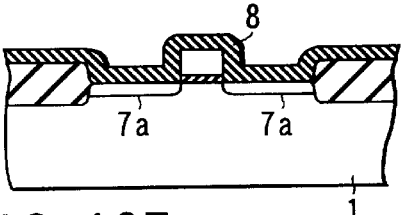

As shown in FIG. 10E, a 50-nm thick silicon nitride film 8 is deposited on the entire surface of the resultant structure by CVD to form side wall insulating films on side walls of the gate portion.

Figure 10F:
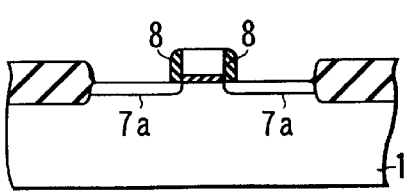

Subsequently, as shown in FIG. 10F, the silicon nitride film 8 is etched by reactive ion etching to form the gate side wall portions 8.

Figure 10G:
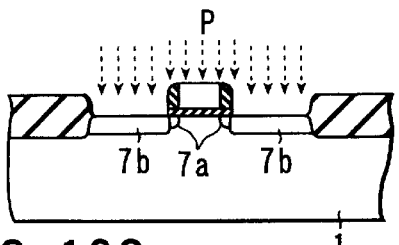

As shown in FIG. 10G, phosphorus ions are implanted at dose of $5\times10^{15}$ $cm^{-2}$ by using the gate electrode as a mask. Thereafter, the resultant structure is annealed, for example, at 950° C. for 30 sec to activate the phosphorus ions in the silicon substrate. As a result, diffusion layers 7b serving as source and drain regions are formed.

Figure 10H:
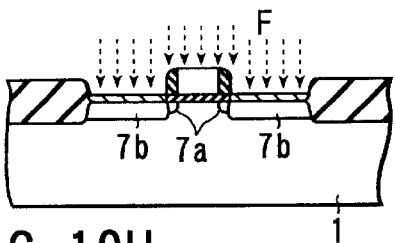

As shown in FIG. 10H, fluorine ions are implanted into the entire surface of the resultant structure, for example, at an acceleration voltage of 20 keV and a dose of $1\times10^{15}$ $cm^{-2}$. In this case, the fluorine distribution immediately after ion implantation has its peak concentrations in the polysilicon film 4 and the source and drain diffusion layers 7b, and no fluorine ions are implanted into the gate oxide film 3.

Thereafter, the resultant structure is annealed in a nitrogen atmosphere at 800° C. for 30 min to diffuse the implanted fluorine ions into the gate oxide film 3.

Figure 10I:
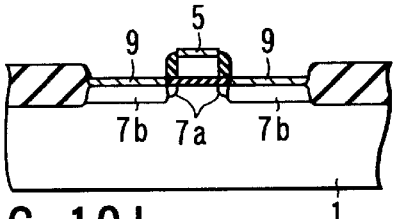

As shown in FIG. 10I, a 25-nm thick titanium film and a 50-nm thick titanium nitride film are sequentially deposited on the entire surface of the resultant structure by sputtering. The resultant structure is annealed in a nitrogen atmosphere at 700° C. for one min to cause the titanium film to react with the polysilicon film 4 and the silicon substrate 1, thereby forming titanium silicide films 5 and 9 on only a polysilicon film portion serving as a gate electrode and in the source and drain regions. After this, the titanium nitride film and the unreacted titanium film on the insulating film are selectively peeled off by, for example, an aqueous solution of hydrofluoric acid and a solution mixture of sulfuric acid and hydrogen peroxide.

Figure 10J:
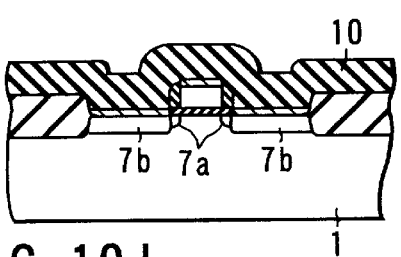
Figure 10K:
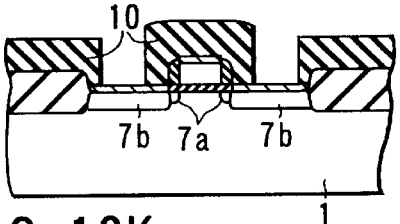
Figure 10L:
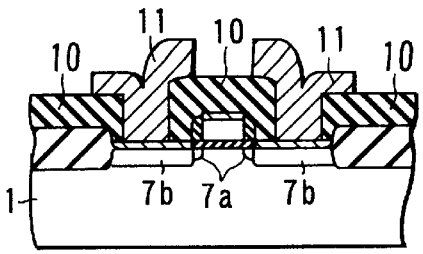

Since the steps in FIGS. 10J to 10L are the same as those in FIGS. 8J to 8L, a description thereof will be omitted.

In the above embodiment, ion implantation of fluorine is performed before the Salicide process. However, the present invention is not limited to this. For example, the same effect as described above can be obtained even if a Salicide process is performed first, and fluorine ions are then implanted into the entire surface of the resultant structure, and annealing is performed.

Figure 11:
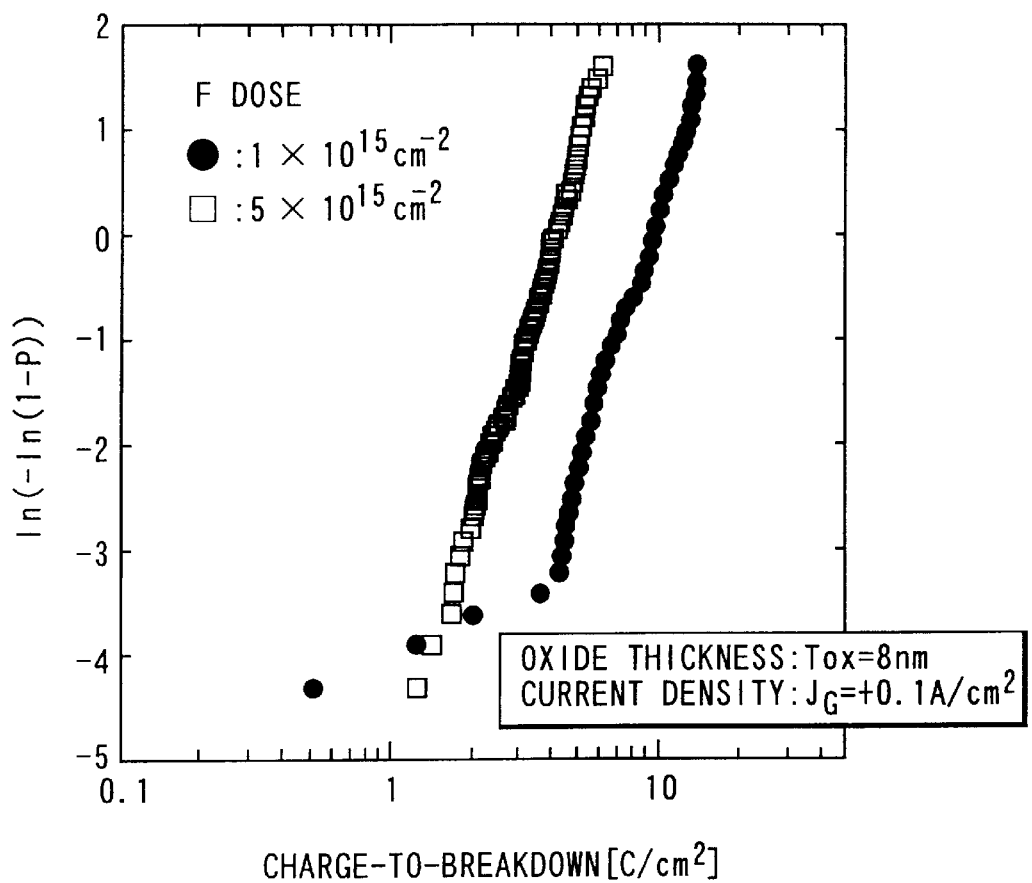
FIG. 11 is a graph showing the difference between the effects obtained with different fluorine doses.

FIG. 11 is a graph showing the reliability characteristics of gate oxide films in the first embodiment, and more specifically, Weibull distributions of Qbd. Referring to FIG. 11, the bullets represent the characteristics obtained when fluorine ions are implanted into the polysilicon film as the gate electrode at dose of $1\times10^{15}$ $cm^{-2}$ to set the dose of fluorine implanted into the oxide film to be smaller than the number of silicon atoms in the N-type source and drain diffusion layers 7a and 7b are formed in the upper surface of the silicon substrate by ion implantation of phosphorus.

A first gate insulating film 3a is formed on the upper surface of the silicon substrate. Fluorine atoms are introduced into the first gate insulating film 3a by performing annealing at 850° C. or more for 30 min or less. A first polysilicon film 4a is formed on the first gate insulating film 3a. A second polysilicon film 4b is formed on a second gate insulating film 3b.

A CVD insulating film 6a is formed on the second polysilicon film 4b of the gate electrode portion. Side wall insulating films 6b are formed on side walls of the gate electrode portion. In addition, contact holes are formed in a CVD insulating film 10 serving as an insulating interlayer. Interconnections 11 are formed in the contact holes.

Figure 12:
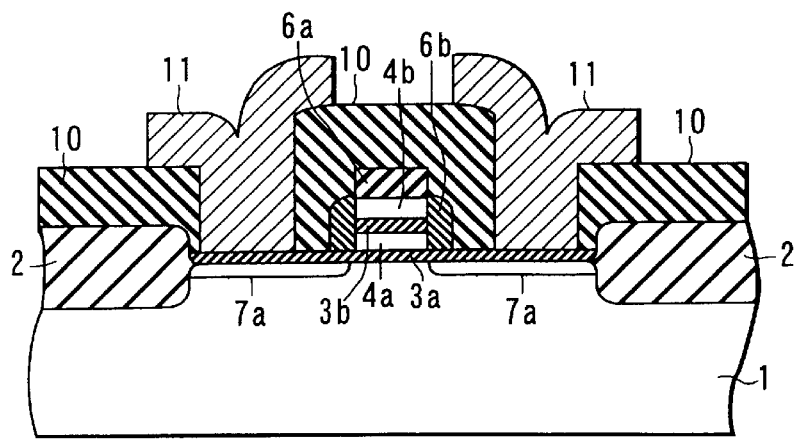
FIG. 12 is a sectional view showing a nonvolatile memory cell according to the third embodiment of the present invention.

FIGS. 13A to 13J are sectional views sequentially showing the steps in a method of manufacturing the nonvolatile semiconductor memory in FIG. 12.

Figure 13A:
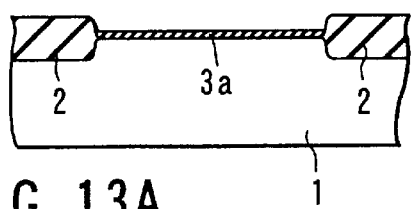
FIGS. 13A to 13J are sectional views sequentially showing the steps in manufacturing the nonvolatile memory cell according to the third embodiment.

First of all, as shown in FIG. 13A, for example, the (100)-oriented p-type silicon substrate 1 with a resistivity of 4 to 6 Ωcm is prepared. The element isolation insulating films 2, each having a thickness of about 0.6 μm, are formed on the upper surface of the p-type silicon substrate 1 by a general selective oxidation method. The 8-nm thick gate insulating oxide film. The white rectangles in FIG. 11 represent the characteristics obtained when fluorine ions are implanted into the polysilicon film as the gate electrode at dose of $5\times10^{15}$ $cm^{-2}$ to set the dose of fluorine implanted into the oxide film to be larger than the number of silicon atoms in the oxide film.

When the dose of fluorine implanted into the oxide film is larger than the number of silicon atoms in the oxide film, the average Qbd decreases. This is because, when fluorine is excessively implanted, fluorine also reacts with an Si—O—Si network in the oxide film other than the upper surface region, and the network is separated into Si—F bonds and Si—O bonds as the film quality in the upper surface region improves. For this reason, the amount of electrons trapped in the gate oxide film abruptly increases to decrease the Qbd. The dose of fluorine implanted into the gate oxide film must therefore be set such that the number of fluorine atoms in the gate oxide film becomes smaller than the number of silicon atoms in the gate oxide film.

Third Embodiment

FIG. 12 is a sectional view of a nonvolatile semiconductor memory (EEPROM) capable of electrically writing and erasing data according to the third embodiment of the present invention.

Silicon thermal oxide films 2 for element isolation are formed on a p-type silicon substrate 1. film 3a is formed on the p-type silicon substrate 1 by thermal oxidation using dry oxygen.

Figure 13F:
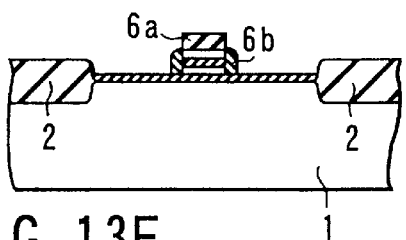
Figure 13B:
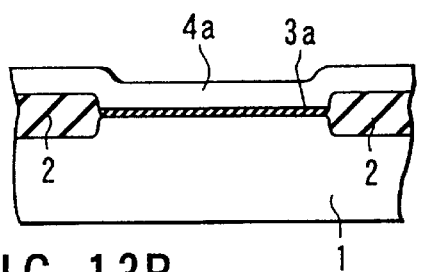

As shown in FIG. 13B, the 200-nm thick polysilicon film 4a is deposited as a gate electrode on the gate insulating film 3a. For example, phosphorus ions are implanted into this polysilicon film 4a at an acceleration voltage of 30 keV and a dose of $5\times10^{15}$ cm$^{-2}$. In this case, the phosphorus distribution immediately after ion implantation has its peak concentration in the polysilicon film 4a. The resultant structure is annealed in a nitrogen atmosphere at 900° C. for 30 min to activate the implanted phosphorus ions. As a result, the resistance of the polysilicon film decreases.

Figure 13G:
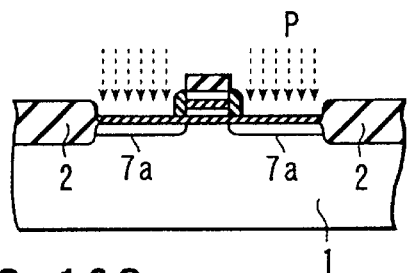
Figure 13C:
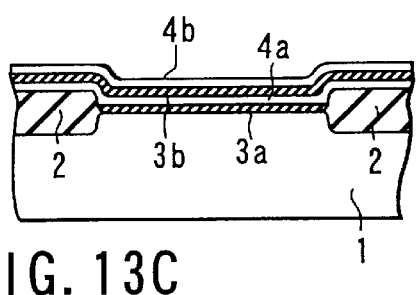

As shown in FIG. 13C, the 5-nm thick CVD silicon oxide film 3b and the 200-nm thick polysilicon film 4b are continuously deposited on the polysilicon film 4a. For example, phosphorus ions are implanted into the entire surface of the polysilicon film 4b at a dose of $5\times10^{15}$ cm$^{-2}$. The implanted phosphorus ions are distributed into the polysilicon film 4b mainly at the peak depth dependent on the acceleration energy. The resultant structure is annealed at 950° C. for 30 sec to diffuse and activate the phosphorus ions in the polysilicon film 4b and the silicon substrate 1.

Figure 13H:
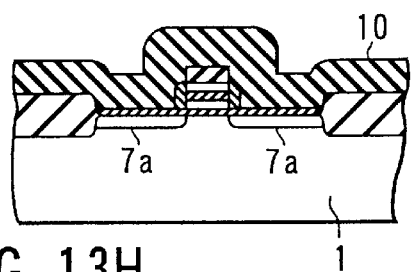
Figure 13D:
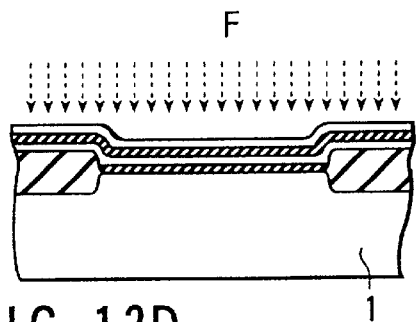

As shown in FIG. 13D, fluorine ions are implanted into the polysilicon film 4b at an acceleration voltage of 20 keV and a dose of $1\times10^{15}$ cm$^{-2}$. In this case, the fluorine distribution immediately after ion implantation is set such that no fluorine ions reach the CVD silicon oxide film 3b. The resultant structure is then annealed in a nitrogen atmosphere at 800° C. for 30 min. As a result, the implanted fluorine ions are diffused into the gate oxide film 3a and the CVD silicon oxide film 3b at once.

Figure 13I:
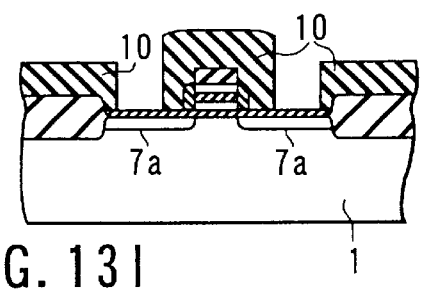
Figure 13E:
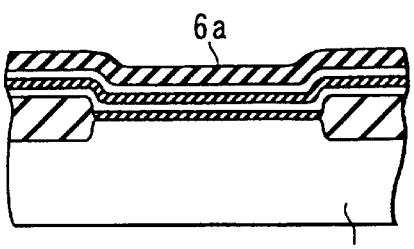

As shown in FIG. 13E, the CVD oxide film 6a is deposited on the entire surface of the resultant structure.

As shown in FIG. 13F, the gate oxide film 3a, the CVD oxide film 3b, the polysilicon films 4a and 4b, and the CVD oxide film 6a are patterned by reactive ion etching. The oxide films 6b are formed on the side walls of the gate electrode by pyrogenic oxidation using a gas mixture of hydrogen and oxygen.

As shown in FIG. 13G, phosphorus ions are implanted into the entire surface of the resultant structure at a dose of $5\times10^{15}$ cm$^{-2}$. Thereafter, annealing is performed at 950° C. for 30 sec to diffuse the phosphorus ions into the silicon substrate 1 and activate them. As a result, the diffusion layers 7a serving as source and drain regions are formed.

Figure 13J:
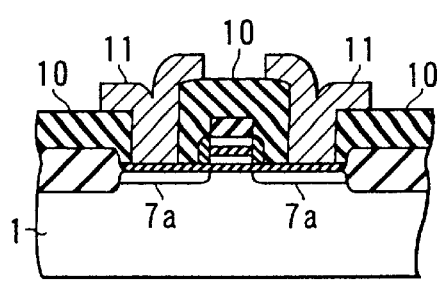

Since the steps in FIGS. 13H to 13J are the same as those in FIGS. 8J to 8L in the first embodiment, a description thereof will be omitted.

In the above embodiment, fluorine ions are implanted into the second polysilicon film 4b. However, the present invention is not limited to this. For example, the same effect as described above can be obtained by implanting ions into the first polysilicon film 4a and the second polysilicon film 4b. In this case, however, after the step of implanting fluorine ions, annealing at 850° C. or more for 30 min or more is preferably avoided for the resultant structure.

Fourth Embodiment

The fourth embodiment is basically the same as the first embodiment, and hence will be described with reference to FIGS. 8A to 8L. The fourth embodiment differs from the first embodiment in the methods of forming gate portions.

First of all, as shown in FIG. 8A, for example, a (100)-oriented p-type silicon substrate 1 with a resistivity of 4 to 6 Ωcm is prepared. Element isolation insulating films 2, each having a thickness of about 0.6 μm, are formed on the upper surface of the p-type silicon substrate 1 by a general selective oxidation method.

As shown FIG. 8B, an 8-nm thick gate oxide film 3 is formed at 850° C. by using dichlorosilane (SiH$_2$Cl$_2$) and nitrous oxide (N$_2$O). Subsequently, a 200-nm thick polysilicon film 4 is formed as a gate electrode on the gate oxide film 3. For example, phosphorus ions are implanted into the polysilicon film 4 at an acceleration voltage of 30 keV and a dose of $5\times10^{15}$ cm$^{-2}$. In this case, the phosphorus distribution immediately after ion implantation has its peak concentration in the polysilicon film 4. The resultant structure is annealed in a nitrogen atmosphere at 900° C. for 30 min to activate the implanted phosphorus ions. As a result, the resistivity of the polysilicon film 4 decreases.

As shown in FIG. 8C, for example, fluorine ions are implanted into the polysilicon film 4 at an acceleration voltage of 20 keV and a dose of $1\times10^{15}$ cm$^{-2}$. In this case, the fluorine distribution immediately after ion implantation has its peak concentration in the polysilicon film 4, but no fluorine ions are implanted into the gate oxide film 3. The resultant structure is annealed in a nitrogen atmosphere at 800° C. for 30 min to diffuse the implanted fluorine ions into the gate oxide film 3.

As shown in FIG. 8D, after a 100-nm thick silicon oxide film 6 is formed on the entire surface of the resultant structure by LP-CVD, the multilayer film constituted by the silicon oxide film 6 and the polysilicon film 4 is etched by reactive ion etching to form a gate portion.

Since the steps in FIGS. 8E to 8L are the same as those in the first embodiment, a description thereof will be omitted.

When a 5-nm thick gate oxide film is formed at 850° C. by using, for example, dichlorosilane (SiH$_2$Cl$_2$) and nitrous oxide (N$_2$O), the silicon/oxide film interface has various interface states. In addition, many electrons are trapped in the resultant film. If, however, fluorine is introduced into this film to terminate the dangling bonds of silicon near the interface and in the film, the interface state density can be decreased.

A gate insulating film may be formed by introducing fluorine atoms into an oxynitride film that is formed by exposing a silicon oxide film to an ammonia (NH$_3$) gas atmosphere to introduce nitrogen atom s therein. This process can suppress an increase in low-electric-field leak current after a high-electric-field stress is applied to the gate insulating film. In addition, introduction of fluorine decreases the defect density to obtain uniform film quality.

As a gate insulating film, an oxide film formed by pyrogenic oxidation using deuterium (D$_2$) gas and oxygen gas or an oxide film formed by using deuterium oxide ($D_2O$) may be used. In this case, since deuterium is introduced into the gate oxide film, deuterium substitutes for H of Si—H bonds having weak bonding strength to obtain Si—D bonds having strong bonding strength. In addition, introduction of fluorine reduces the stress produced by distorted Si—O—Si bonds in the interface transition layer, thereby making the gate insulating film quality more resistant to high-electric-field stress.

The same effect as described above can be obtained when a silicon oxide film using active oxygen is used as a gate oxide film. In this case, the oxide film is formed by supplying oxygen to the substrate after activating it by microwave discharge or ultraviolet ray irradiation. The oxide film formed in this manner is dense and has few traps. In addition, the interface between the oxide film and the silicon substrate is flat. In this case as well, however, there is a interface transition layer near the interface between the oxide film and the silicon substrate. The stress produced by the interface transition layer is reduced by fluorine. This can improve reliability, e.g., the dielectric breakdown resistance characteristics.

The same effect as described above can be obtained when a silicon nitride film using $SiH_2Cl_2$ or $SiCl_4$ and $NH_3$ or a silicon nitride film formed by directly nitridating the silicon substrate with $NH_3$ or the like is used.

Fifth Embodiment

FIGS. 14A to 14L are sectional views sequentially showing the steps in a method of manufacturing an n-channel MOS transistor according to the fifth embodiment of the present invention.

Figure 14A:
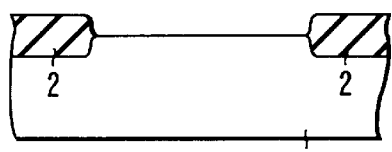
FIGS. 14A to 14L sectional views sequentially showing the steps in manufacturing a MOS transistor according to the fifth embodiment of the present invention.

First of all, as shown in FIG. 14A, for example, a (100)-oriented p-type silicon substrate 1 with a resistivity of 4 to 6 Ωcm is prepared. Element isolation insulating films 2, each having a thickness of about 0.6 μm, are formed on the upper surface of the p-type silicon substrate 1 by a general selective oxidation method.

Figure 14B:
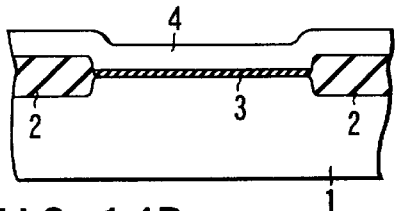

As shown in FIG. 14B, an 8-nm thick gate oxide film 3 is formed on the resultant structure by thermal oxidation using, for example, dry oxygen. In addition, a 200-nm thick polysilicon film 4 is deposited as a gate electrode on the gate oxide film 3. For example, phosphorus ions are implanted into this polysilicon film at an acceleration voltage of 30 keV and a dose of $5 \times 10^{15}$ $cm^{-2}$. In this case, the phosphorus distribution immediately after ion implantation has its peak concentration in the polysilicon film 4. The resultant structure is annealed in a nitrogen atmosphere at 900° C. or 30 min to activate the implanted phosphorus ions. As a result, the resistance of the polysilicon film 4 decreases.

Figure 14C:
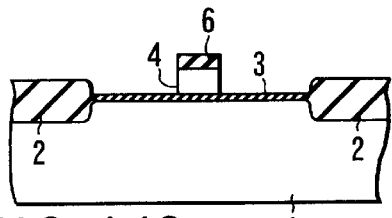

As shown in FIG. 14C, after a CVD silicon oxide film 6 is deposited on the resultant structure, the polysilicon film 4 and the CVD silicon oxide film 6 are etched by reactive ion etching to form a gate portion.

Figure 14D:
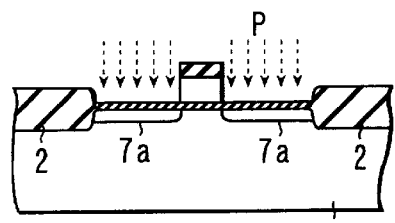

As shown in FIG. 14D, phosphorus ions are implanted at a dose of $1 \times 10^{15}$ $cm^{-2}$. The resultant structure is annealed, for example, at 900° C. for 30 sec to diffuse the phosphorus ions into the silicon substrate and activate them. As a result, the diffusion layers 7a serving as source and drain regions are formed.

Figure 14E:
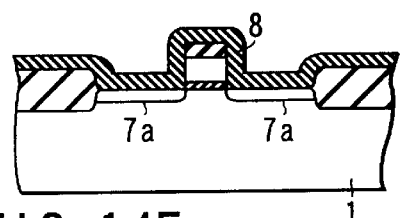

As shown in FIG. 14E, a 50-nm thick silicon nitride film is deposited on the entire surface of the resultant structure by CVD.

Figure 14F:
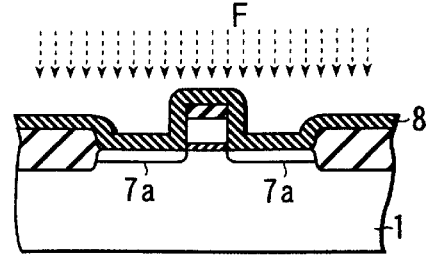

As shown in FIG. 14F, fluorine ions are implanted into the silicon nitride film at an acceleration voltage of 20 keV and a dose of $1 \times 10^{15}$ $cm^{-2}$. In this case, the fluorine distribution immediately after ion implantation has its peak concentration in a silicon nitride film 8.

Figure 14G:
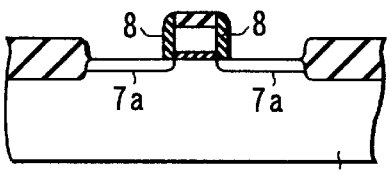

As shown in FIG. 14G, the silicon nitride film is etched by reactive ion etching to form the gate side wall portions 8 containing fluorine. Subsequently, the resultant structure is annealed, for example, in a nitrogen atmosphere at 800° C. for 30 min to diffuse the fluorine ions, which are implanted into the gate side wall portions 8, into the gate oxide film 3.

Figure 14H:
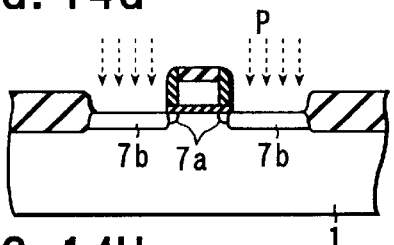
Figure 14I:
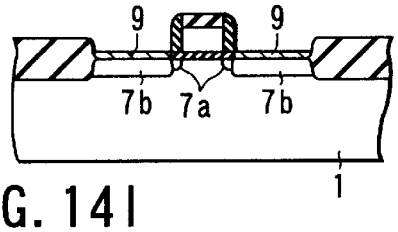
Figure 14J:
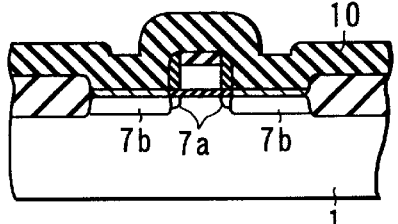
Figure 14K:
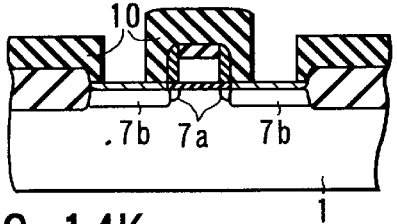
Figure 14L:
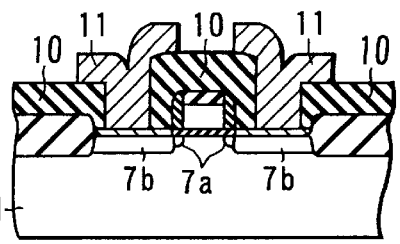

As shown in FIG. 14H, phosphorus ions are implanted into the silicon substrate by using the gate electrode portion as a mask. The resultant structure is annealed, for example, at 950° C. for 30 sec to diffuse the phosphorus ions into the silicon substrate and activate them. As a result, the diffusion layers 7b serving as source and drain regions are formed.

Since the steps in FIGS. 14I to 14L are the same as those in FIGS. 8I to 8L in the first embodiment, a description thereof will be omitted.

In the fifth embodiment, each side wall insulating film 8 made of the silicon oxide film is generally formed by LP-CVD using dichlorosilane ($SiH_2Cl_2$) and ammonia ($NH_3$). In this case, the nitride film contains a large amount of hydrogen, and this hydrogen is diffused into the oxide film in a large amount. This breaks an Si—O—Si network to shorten the dielectric breakdown life. According to the fifth embodiment, an insulating film with a low hydrogen content is formed by using $SiCl_4$ and $N_2O$. Thereafter, fluorine ions are implanted into the insulating film at an acceleration voltage of 5 keV and a dose of $1 \times 10^{15}$ $cm^{-2}$ at an implantation angle of 7° from the normal to the insulating film. As a result, the insulating film contains fluorine.

The same effect as that obtained by implanting fluorine ions into a side wall insulating films with a low hydrogen content, as described above, can also be obtained by using $SiF_4$ gas to form side wall insulating films or mixing fluorine radicals, produced by microwave discharge, in the side wall insulating films.

According to the above embodiment, introduction of fluorine from the side wall insulating films into the gate oxide film improves the reliability of the overall oxide film. In addition, this improves the reliability with respect to hot carriers at the edge portion of the gate electrode in direct contact with the side wall insulating films or the drain terminal where impact ionization tends to occur. In addition, the damaged region of the oxide film with low dielectric breakdown strength which is introduced by reactive ion etching and ion implantation of phosphorus can be efficiently mended.

Sixth Embodiment

FIGS. 15A to 15L are sectional views sequentially showing the steps in a method of manufacturing an n-channel MOSFET according to the sixth embodiment of the present invention.

The steps shown in FIGS. 15A to 15D are executed in the same manner as in those shown in FIGS. 14A to 14D.

Figure 15A:
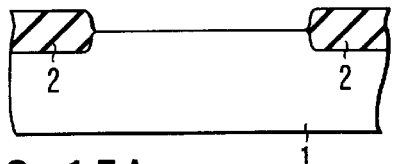
FIGS. 15A to 15L sectional views sequentially showing the steps in manufacturing a MOS transistor according to the sixth embodiment of the present invention.
Figure 15B:
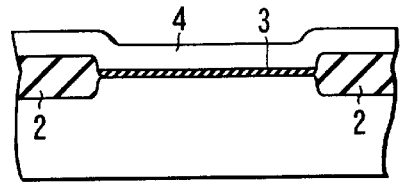
Figure 15C:
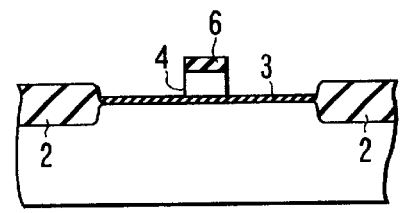
Figure 15D:
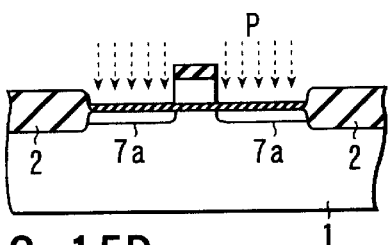
Figure 15E:
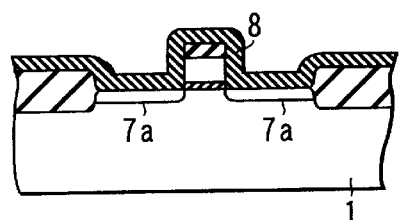

As shown FIG. 15E, a 100-nm thick silicon nitride film 8 is deposited by CVD.

Figure 15F:
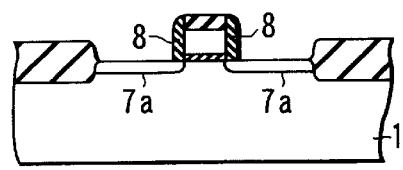

As shown in FIG. 15F, the silicon nitride film is etched by reactive ion etching to form the gate side wall portions 8.

Figure 15G:
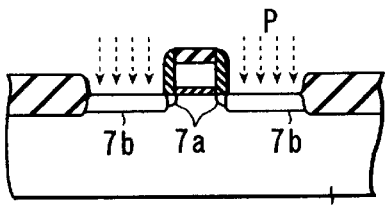

As shown in FIG. 15G, phosphorus ions are implanted into the resultant structure by using the gate electrode as a mask. The implanted phosphorus ions are distributed in the silicon substrate mainly at the peak depth dependent on the acceleration energy. The resultant structure is annealed at 950° C. or 30 sec to diffuse the phosphorus ions into the silicon substrate and activate them. As a result, diffusion layers 7b serving as source and drain regions are formed.

Figure 15H:
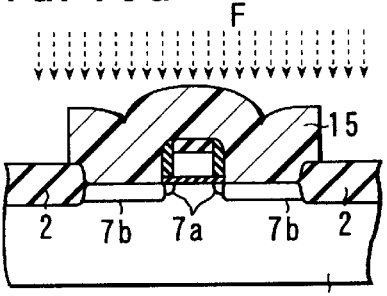
Figure 15I:
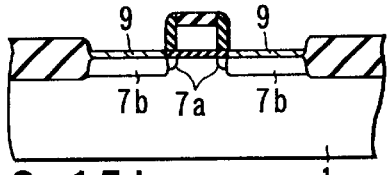
Figure 15J:
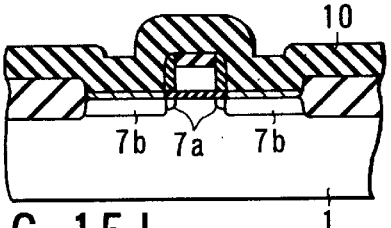
Figure 15K:
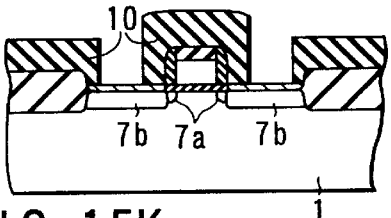
Figure 15L:
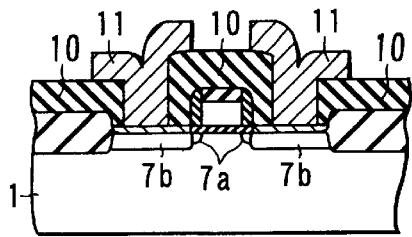

As shown in FIG. 15H, only element isolation silicon oxide films 2 are exposed by using a resist mask 15. Thereafter, for example, fluorine ions are implanted into the entire surface of the resultant structure at an acceleration voltage of 20 keV and a dose of $1 \times 10^{15}$ cm$^{-2}$. In this case, the fluorine distribution immediately after ion implantation has its peak concentration in the upper surface portion of each element isolation oxide film 2. The resultant structure is annealed, for example, in a nitrogen atmosphere at 800° C. for 30 min to diffuse the implanted fluorine ions into the gate oxide film 3.

Since the steps shown FIGS. 15I to 15L are the same as those shown in FIGS. 8I to 8L in the first embodiment, a description thereof will be omitted.

The same effects as those of the first embodiment can also be obtained in this embodiment.

Seventh Embodiment

FIGS. 16A to 16L are sectional views sequentially showing the steps in a method of manufacturing an n-channel MOS transistor according to the seventh embodiment of the present invention.

Figure 16A:
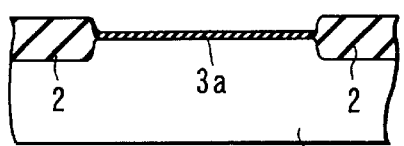
FIGS. 16A to 16L sectional views sequentially showing the steps in manufacturing a MOS transistor according to the seventh embodiment of the present invention.
Figure 16G:
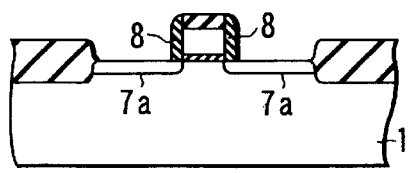

First of all, as shown in FIG. 16A, for example, a (100)-oriented p-type silicon substrate 1 with a resistivity of 4 to 6 Ωcm is prepared. Element isolation insulating films 2, each having a thickness of about 0.6 μm, are formed on the upper surface of the p-type silicon substrate 1 by a general selective oxidation method. In addition, an 8-nm thick gate oxide film 3 is formed on the resultant structure by, for example, thermal oxidation using dry oxygen.

Figure 16B:
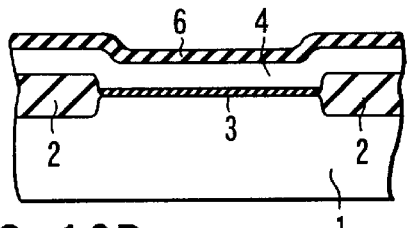
Figure 16H:
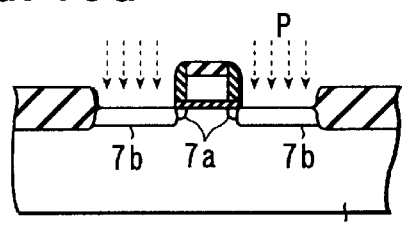

As shown in FIG. 16B, a 200-nm thick polysilicon film 4 is deposited as a gate electrode on the gate oxide film 3. For example, phosphorus ions are implanted into the polysilicon film 4 at an acceleration voltage of 30 keV and a dose of $5 \times 10^{15}$ cm$^{-2}$. In this case, the phosphorus distribution immediately after ion implantation has its peak concentration in the polysilicon film 4. The resultant structure is annealed in a nitrogen atmosphere at 900° C. for 30 min to activate the implanted phosphorus ions. As a result, the resistance of the polysilicon film decreases. In addition, a CVD silicon oxide film 6 is deposited on the polysilicon film 4.

Figure 16C:
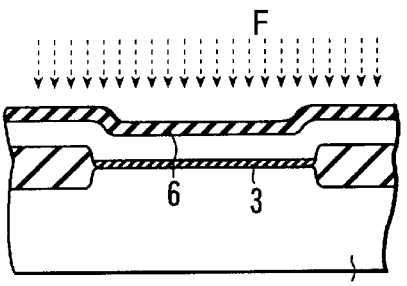

As shown in FIG. 16C, fluorine ions are implanted into the entire surface of the silicon oxide film 6, for example, at an acceleration voltage of 20 keV and a dose of $1 \times 10^{15}$ cm$^{-2}$. In this case, the fluorine distribution immediately after ion implantation has its peak concentration in the upper surface portion of the CVD oxide film 6. The resultant structure is annealed in a nitrogen atmosphere at 800° C. for 30 min. As a result, the fluorine ions implanted into the CVD silicon oxide film 6 are diffused into the gate oxide film 3.

Figure 16I:
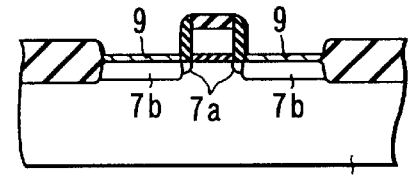
Figure 16D:
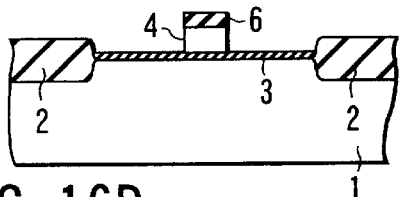
Figure 16J:
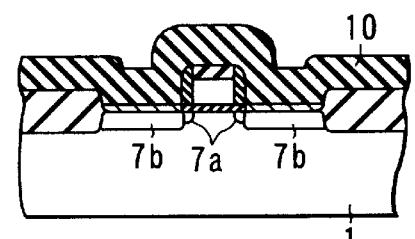

As shown in FIG. 16D, the polysilicon film 4 and the CVD silicon oxide film 6 are etched by reactive ion etching to form a gate portion.

Figure 16E:
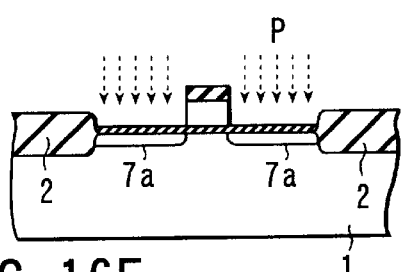
Figure 16K:
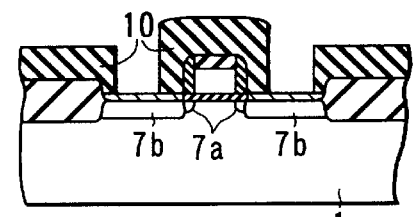
Figure 16F:
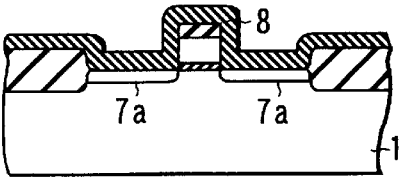
Figure 16L:
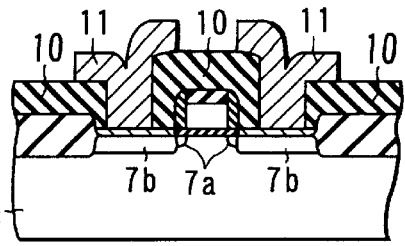

As shown in FIG. 16E, phosphorus ions are implanted into the resultant structure at a dose of $1 \times 10^{15}$ cm$^{-2}$. The resultant structure is annealed, for example, at 950° C. for 30 sec to diffuse the phosphorus ions into the silicon substrate and activate them. As a result, diffusion layers 7a serving as source and drain regions are formed.

Since the steps shown in FIGS. 16F to 16L are the same as those shown in FIGS. 8F to 8L in the first embodiment, a description thereof will be omitted.

Note that the same effect as described above can be obtained even if fluorine is introduced into the silicon oxide film 10 serving as an insulating interlayer in the step shown in FIG. 16I. To introduce fluorine into the silicon oxide film 10 serving as the insulating interlayer, for example, fluorine ions may be implanted into the insulating interlayer. Alternatively, an oxide film containing fluorine may be formed by low-pressure plasma CVD using a gas mixture of a silicon fluoride, e.g., silicon tetrafluoride (SiF$_4$), and oxygen. This oxide film may be used as an insulating interlayer. After the insulating interlayer containing fluorine is formed in this manner, the resultant structure may be annealed, for example, in a nitrogen atmosphere at 800° C. for 30 min to diffuse the implanted fluorine ions into the gate oxide film 3.

Note that a metal material for interconnections into which fluorine is introduced in advance may be used as a diffusion source for diffusing fluorine into the gate oxide film 3. In this case, in the step shown in FIG. 16K, after an aluminum film is formed, fluorine ions may be implanted into the entire surface of the aluminum film, and fluorine may be diffused from the fluorine-containing aluminum film into the gate oxide film 3.

Eighth Embodiment

Figure 17:
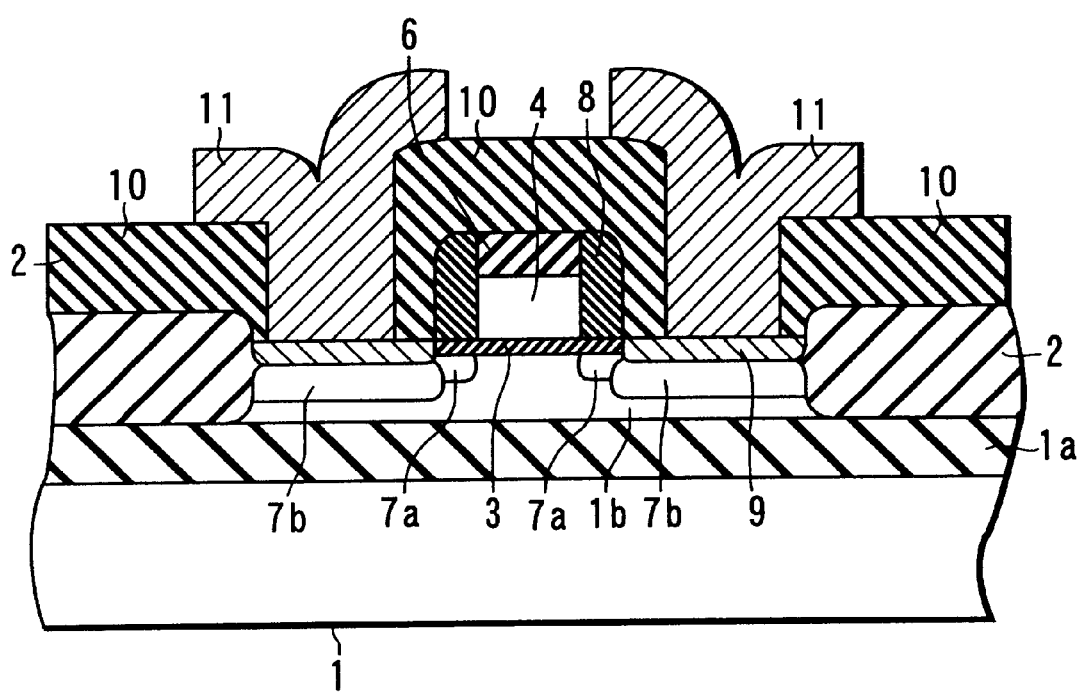
FIG. 17 is a sectional view showing a MOS transistor using an SOI substrate according to the eighth embodiment of the present invention.

FIG. 17 is a sectional view showing an n-channel transistor formed on an SOI substrate according to the eighth embodiment. A p-type semiconductor layer 1b is formed on a silicon substrate 1 through an insulating layer 1a. Silicon thermal oxide films 2 for element isolation are formed on the substrate. N-type source and drain diffusion layers 7a and 7b are formed in the upper surface of the semiconductor layer 1b by ion implantation of phosphorus. In addition, an insulating film mainly containing silicon, oxygen, and nitrogen is formed as a gate insulating film 3 on the upper surface of the semiconductor layer 1b. Fluorine atoms are introduced from the insulating layer 1a on the SOI substrate into the gate insulating film 3 by diffusion.

A CVD silicon oxide film 6 is formed on a polysilicon film 4 serving as a gate electrode. Silicon nitride films 8 are formed on side walls of the gate electrode. In addition, silicide films 9 are formed in the source and drain regions. Contact holes are formed in a CVD silicon oxide film 10. Al electrodes 11 serving as interconnections are formed in the contact holes by sputtering are patterned.

FIGS. 18A to 18L are sectional views sequentially showing the steps in a method of manufacturing an n-channel MOS transistor according to the eighth embodiment.

Figure 18A:
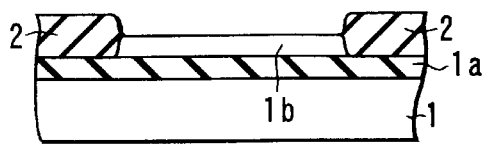
FIGS. 18A to 18L are sectional views sequentially showing the steps in manufacturing the MOS transistor according to the eighth embodiment of the present invention.

First of all, as shown in FIG. 18A, the SOI substrate having the p-type semiconductor layer 1b formed as an upper layer on the p-type silicon substrate 1 through the insulating layer 1a is prepared. The element isolation insulating films 2, each having a thickness of about 0.6 μm, are formed on the upper surface of the p-type semiconductor layer 1b by a general selective oxidation method.

Figure 18G:
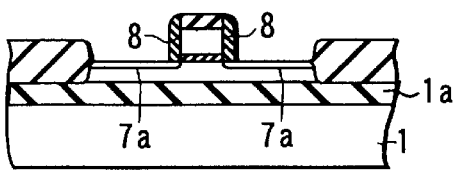
Figure 18B:
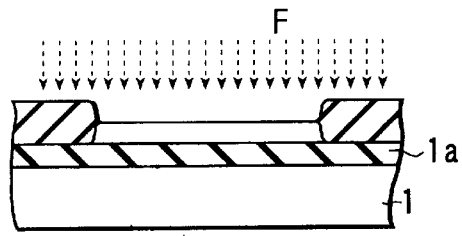

As shown in FIG. 18B, fluorine ions are implanted into the entire surface of the resultant structure at an acceleration voltage of 100 keV and a dose of $5 \times 10^{15}$ cm$^{-2}$. In this case, the fluorine distribution immediately after ion implantation has its peak concentration in the insulating layer 1a of the SOI substrate.

Figure 18H:
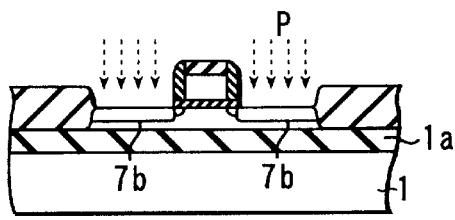
Figure 18C:
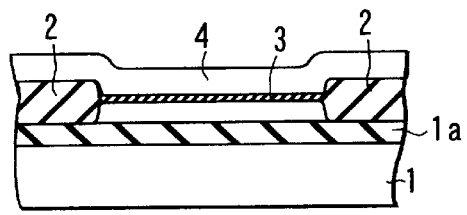

As shown in FIG. 18C, the 8-nm thick gate oxide film 3 is formed by thermal oxidation using dry oxygen. In this case, the implanted fluorine ions are diffused and introduced into the gate oxide film 3, and at the same time, the characteristics associated with the stress in the SOI substrate and crystal defects in the interface between the substrate and the insulating layer 1a are improved. The 200-nm thick phosphorus-doped polysilicon film 4 is deposited as a gate electrode on the gate insulating film 3 by using a gas mixture of silane ($SiH_4$) and phosphine ($PH_3$).

Figure 18I:
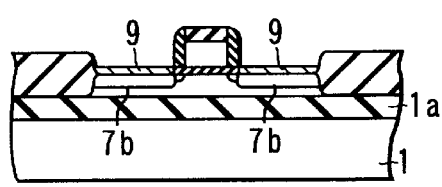
Figure 18D:
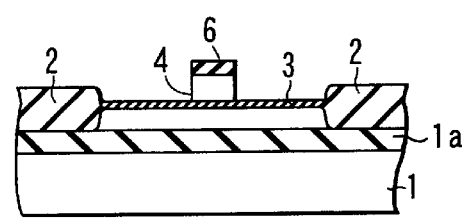

As shown in FIG. 18D, the CVD silicon oxide film 6 is deposited on the polysilicon film 4. The polysilicon film 4 and the CVD silicon oxide film 6 are then etched by reactive ion etching to form a gate portion.

Figure 18J:
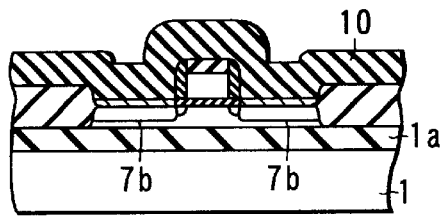
Figure 18E:
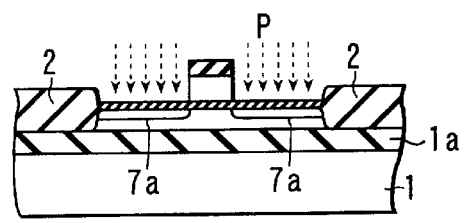

As shown in FIG. 18E, for example, phosphorus ions are implanted into the resultant structure at a dose of $1\times10^{15}$ $cm^{-2}$. The implanted phosphorus ions are distributed into the silicon layer 1b mainly at the peak depth dependent on the acceleration energy. The resultant structure is annealed at 950° C. for 30 sec to diffuse the phosphorus ions into the silicon substrate and activate them. As a result, the diffusion layers 7a serving as source and drain regions are formed.

Figure 18K:
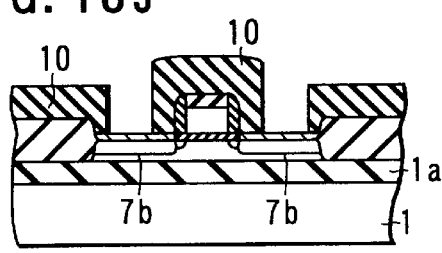
Figure 18F:
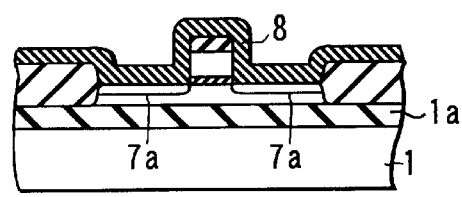

As shown in FIG. 18F, the 100-nm thick silicon nitride film 8 is formed on the resultant structure by CVD.

As shown in FIG. 18G, the silicon nitride film is etched by reactive ion etching to form the gate side wall portions 8.

As shown in FIG. 18H, phosphorus ions are implanted into the resultant structure by using the gate electrode as a mask. The implanted ions are distributed into the silicon layer 1b mainly at the peak depth dependent on the acceleration energy. The resultant structure is annealed, for example, at 950° C. or 30 sec to diffuse the phosphorus ions into the silicon layer 1b and activate them. As a result, the diffusion layers 7b serving as source and drain regions are formed.

As shown in FIG. 18I, a 25-nm thick titanium film and a 50-nm thick titanium nitride film are sequentially stacked on the entire surface of the resultant structure. Annealing is then performed in a nitrogen atmosphere at 700° C. for 1 min to cause the entire thin titanium film to react with the silicon layer 1b. As a result, the titanium silicide films 9 are formed in only the source and drain regions. Thereafter, the titanium nitride film and the unreacted titanium film on the insulating film are selectively peeled off by, for example, an aqueous solution of hydrofluoric acid and a solution mixture of sulfuric acid and hydrogen peroxide.

As shown in FIG. 18J, the 300-nm thick silicon oxide film 10 is deposited on the entire surface of the resultant structure by CVD.

As shown in FIG. 18K, contact holes are formed in the silicon oxide film 10 by anisotropic dry etching.

Figure 18L:
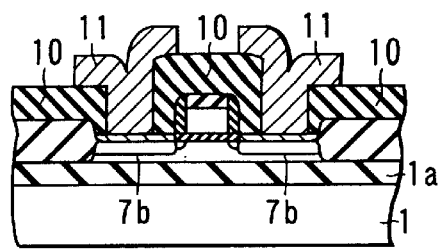

As shown in FIG. 18L, an 800-nm thick aluminum film containing, for example, 0.5% of silicon and 0.5% of copper is formed on the silicon oxide film 10 and is patterned to form the source and drain electrodes 11. Thereafter, the sample is annealed in a nitrogen atmosphere containing hydrogen at 450° C. for 15 min.

The same effects as those of the first embodiment can be obtained by the manufacturing method of this embodiment.

Ninth Embodiment

FIGS. 19A to 19I are sectional views sequentially showing the steps in a method of manufacturing a MOS transistor according to the ninth embodiment of the present invention.

Figure 19A:
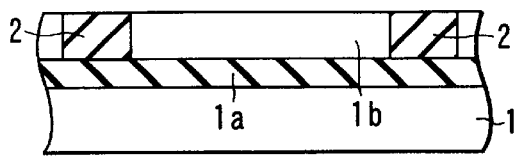
FIGS. 19A to 19I are sectional views sequentially showing the steps in manufacturing a MOS transistor according to the ninth embodiment of the present invention.

First of all, as shown in FIG. 19A, element isolation trenches are formed in a p-type silicon substrate 1 having a semiconductor layer 1b on a buried oxide film 1a by reactive ion etching. For example, the trenches are filled up with LP-TEOS films to form element isolation layers 2.

Figure 19B:
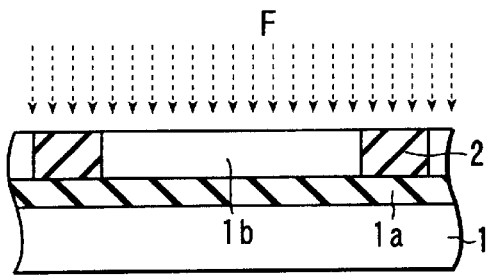

As shown in FIG. 19B, fluorine ions are implanted into the entire surface of the resultant structure at an acceleration voltage of 20 to 50 keV and a dose of $1\times10^{13}$ to $1\times10^{16}$ $cm^{-2}$. In this case, the fluorine atom distribution has its peak in the semiconductor layer 1b or the element isolation layer 2.

Figure 19C:
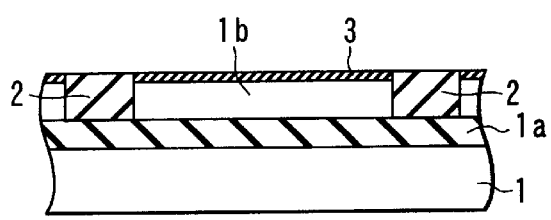

As shown in FIG. 19C, the silicon substrate is exposed to, for example, a gas mixture of oxygen and hydrogen at 750° C. and 1 atm to form a silicon oxide film. Thereafter, the silicon oxide film is exposed to, for example, nitrogen monoxide gas (NO) diluted with nitrogen gas to 10% or dinitrogen monoxide gas ($N_2O$) at 900° C. to introduce nitrogen gas into the silicon oxide film, thereby forming a silicon insulating film 3.

Figure 19D:
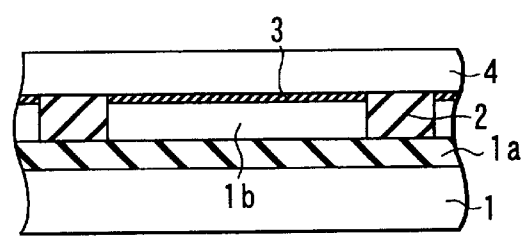

As shown in FIG. 19D, a polysilicon film 4 serving as a gate electrode is deposited by CVD.

Figure 19E:
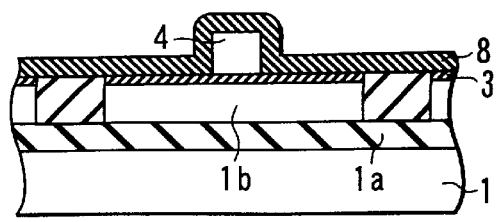

As shown in FIG. 19E, a CVD silicon oxide film 6 is formed on the entire surface of the polysilicon film 4. The silicon oxide film 6 and the polysilicon film 4 are etched by RIE using a resist mask (not shown) to form a gate portion. A CVD silicon nitride film 8 having a thickness of 5 to 200 nm is deposited on the entire surface of the resultant structure by using a gas mixture of $SiH_4$ diluted with nitrogen gas and $NH_3$, for example, at 450° C. and 10 mtorr to 1 atm.

Figure 19F:
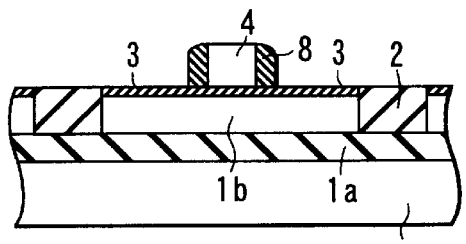

As shown in FIG. 19F, the silicon nitride film is etched by RIE to form the gate side wall insulating films 8.

Figure 19G:
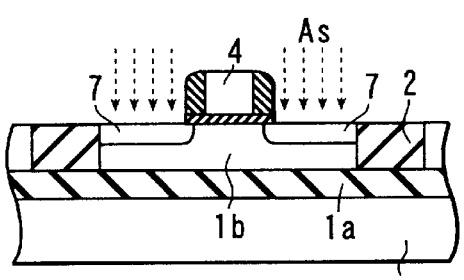

As shown in FIG. 19G, arsenic ions are implanted into the resultant structure at an acceleration voltage of 20 keV and a dose of $1\times10^{15}$ $cm^{-2}$ by using the gate portion as a mask to form source and drain diffusion regions 7.

Figure 19H:
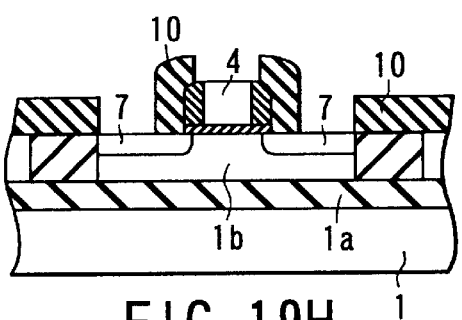

As shown in FIG. 19H, a CVD silicon oxide film 10 is formed on the entire surface of the resultant structure by CVD. Contact holes are formed in the CVD silicon oxide film 10.

Figure 19I:
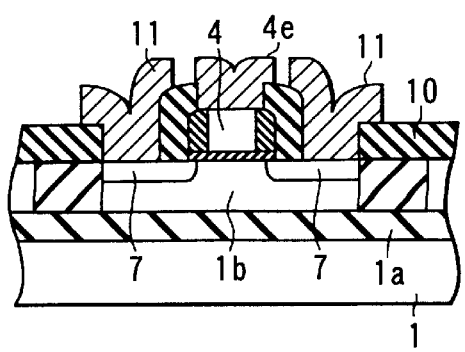

As shown in FIG. 19I, the Al film deposited on the entire surface of the resultant structure by sputtering is etched by RIE to form source and drain electrodes 11 and a gate electrode 4e.

In the ninth embodiment, fluorine is introduced into the SOI layer 1b and the buried oxide films 2 to uniform the interface states in the interface between the SOI layer 1b and the buried oxide films 2. This can decrease the junction leakage current in the source and drain diffusion layers 7, and hence can form a semiconductor device with high reliability.

The method of introducing a halogen element such as fluorine into the interface between the SOI layer and the buried oxide film is not limited to the above method. For example, fluorine may be partially contained in the semiconductor element formed on the semiconductor layer, e.g., the gate electrode, the gate side wall insulating films, the insulating interlayer, or the element isolation insulating films, and may be introduced into the above interface by thermal diffusion or the like.

In addition, the same effects as those of the above embodiment can be obtained by implanting fluorine ions into only desired portions while partially covering the surface with a mask member formed on the upper surface of the silicon substrate, instead of implanting fluorine ions into the entire surface.

10th Embodiment

FIGS. 20A to 20D are sectional views sequentially showing the steps in a method of manufacturing a MOS capacitor according to the 10th embodiment of the present invention.

Figure 20A:
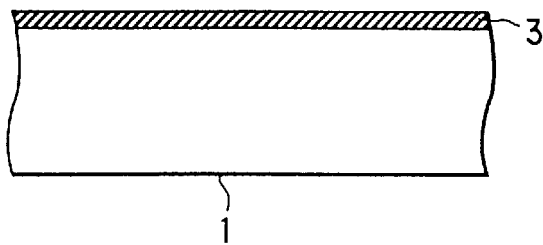
FIGS. 20A to 20D are sectional views sequentially showing the steps in manufacturing the capacitor portion of a MOS transistor according to the 10th embodiment of the present invention.
Figure 20E:
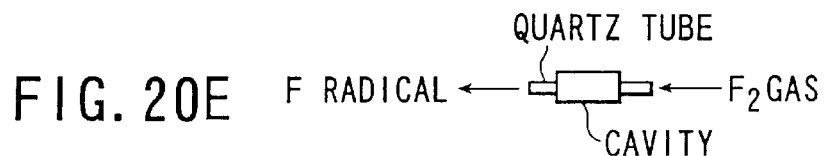
FIG. 20E is a schematic view showing a method of generating F radicals in the step of FIG. 20B.
Figure 20B:
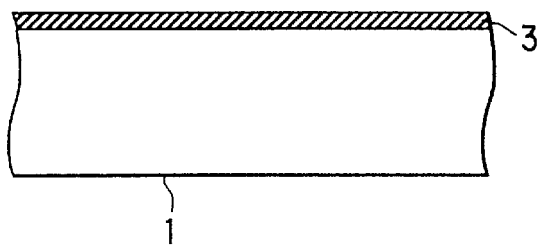

First of all, as shown in FIG. 20A, for example, a (100)-oriented n-type silicon substrate 1 with a resistivity of 4 to 6 Ωcm is prepared. An 8-nm thick oxide film 3 is formed by using, for example, dry oxygen. As shown in FIG. 20B, for example, fluorine gas is activated by microwave discharge. The resultant fluorine radicals are supplied to the upper surface of the oxide film 3 in a vacuum. As a result, the fluorine is adsorbed to the upper surface of the oxide film 3.

Figure 20C:
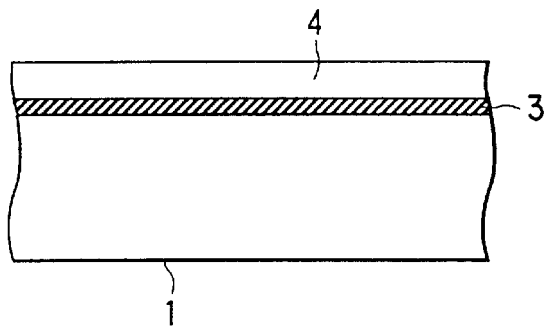

As shown in FIG. 20C, a 200-nm thick phosphorus-doped polysilicon film 4 is formed as an electrode on the oxide film 3 by using a gas mixture of silane and phosphine.

Figure 20D:
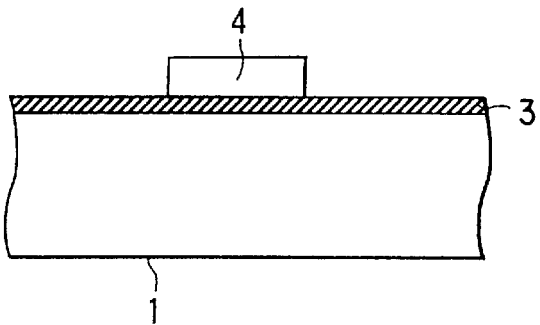

As shown in FIG. 20D, the polysilicon film 4 is patterned to form a MOS capacitor.

In the above case, the fluorine adsorbed to the upper surface of the oxide film 3 can be diffused into the oxide film 3 in the annealing step for the formation of the polysilicon film 4. After the polysilicon film 4 is formed, the resultant structure is annealed, for example, in a nitrogen atmosphere at 800° C. for 30 min. With this, the fluorine adsorbed to the upper surface of the oxide film 3 can be efficiently diffused into the silicon substrate/oxide film interface.

In this embodiment, since ion implantation of fluorine is not required, the cost and time can be saved. It is, however, preferable that the step of adsorbing fluorine to the upper surface of the oxide film and the step of depositing the polysilicon film serving as an electrode be continuously performed in a vacuum. This is because, if the oxide film is exposed to the atmosphere after fluorine is adsorbed to its upper surface, the fluorine reacts with moisture contained in the atmosphere to make it impossible to sufficiently diffuse fluorine into the oxide film in the subsequent step.

In the above embodiment, the fluorine radicals produced by discharging microwaves to fluorine gas are supplied to the upper surface of the oxide film. However, the present invention is not limited to this. For example, the same effect as described above can be obtained by using a halide represented by fluorine trichloride ($ClF_3$).

11th Embodiment

FIGS. 21A to 21D are sectional views sequentially showing the steps in a method of manufacturing a MOS capacitor according to the 11th embodiment of the present invention.

Figure 21A:
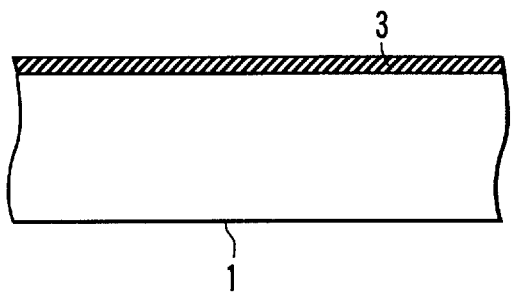
FIGS. 21A to 21D are sectional views sequentially showing the steps in manufacturing the capacitor portion of a CMOS transistor according to the 11th embodiment of the present invention.

First of all, as shown in FIG. 21A, for example, a (100)-oriented n-type silicon substrate 1 with a resistivity of 4 to 6 Ωcm is prepared. An 8-nm thick oxide film 3 is formed by using, for example, dry oxygen.

Figure 21B:
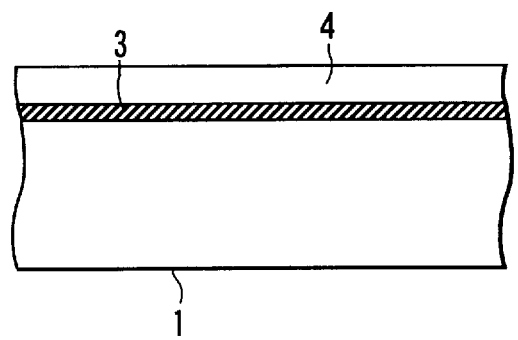

As shown in FIG. 21B, a 200-nm thick polysilicon film 4 is formed as an electrode. For example, phosphorus ions are implanted into the polysilicon film 4 at an acceleration voltage of 30 keV and a dose of $5 \times 10^{15}$ cm$^{-2}$. In this case, the phosphorus distribution immediately after ion implantation has its peak concentration in the polysilicon film 4. The resultant structure is annealed in a nitrogen atmosphere at 900° C. for 30 min to activate the implanted phosphorus ions. As a result, the resistance of the polysilicon film decreases.

Figure 21C:
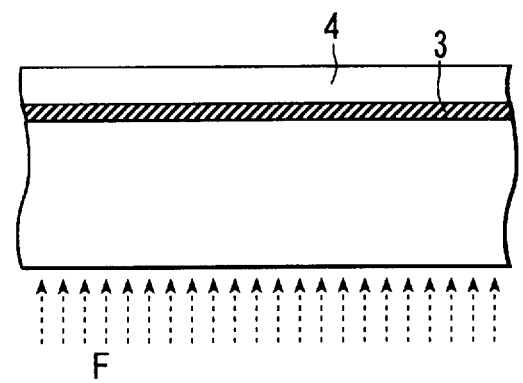

As shown in FIG. 21C, for example, fluorine ions are implanted into the lower surface of the silicon substrate 1 at an acceleration voltage of 50 keV and a dose of $2 \times 10^{15}$ cm$^{-2}$. The resultant structure is annealed in, for example, a nitrogen atmosphere at 800° C. for 30 min to diffuse the implanted fluorine ions into the silicon substrate/oxide film interface.

Figure 21D:
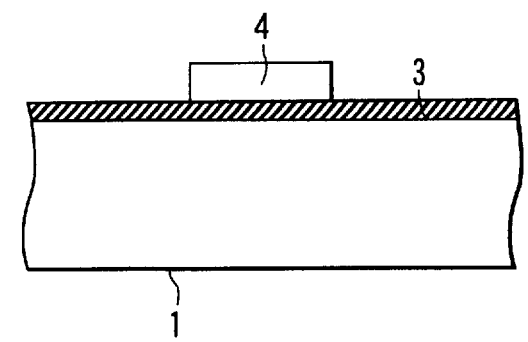

As shown in FIG. 21D, the polysilicon film 4 is etched by dry etching to form a MOS capacitor.

In this embodiment, fluorine can be introduced into only a interface transition layer near the interface between the silicon substrate and the oxide film without diffusing fluorine into the oxide film 3. This improves the reliability. In addition, in this embodiment, fluorine ions are implanted from the lower surface of the silicon substrate. If, however, fluorine is introduced into the polysilicon film serving as an electrode, and diffusion of fluorine therefrom is used, fluorine can be introduced into the two interfaces of the oxide film. This further improves the reliability.

12th Embodiment

FIGS. 22A to 22K are sectional views sequentially showing the steps in a method of manufacturing an n-channel MOS transistor according to the 12th embodiment of the present invention.

The steps in FIGS. 22A to 22E are performed in the same manner as in the steps in FIGS. 14A to 14E in the fifth embodiment. A 150-nm thick CVD silicon oxide film 6 is formed as a gate portion, and a silicon nitride film 8 having a thickness of about 100 nm is formed on the entire surface of the resultant structure by CVD.

Figure 22A:
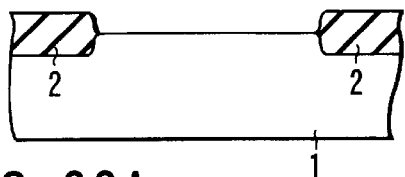
FIGS. 22A to 22K are sectional views sequentially showing the steps in manufacturing a CMOS transistor according to the 12th embodiment of the present invention.
Figure 22B:
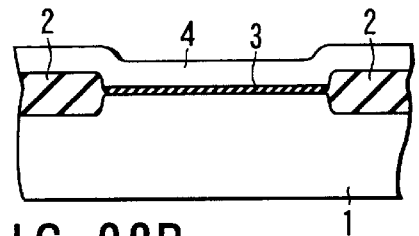
Figure 22C:
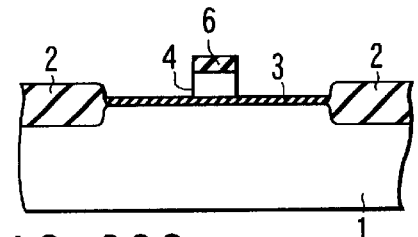
Figure 22D:
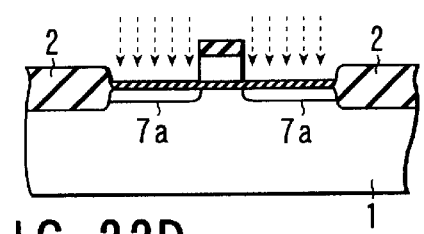
Figure 22E:
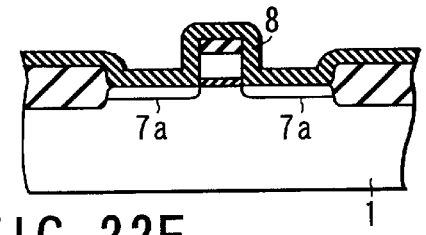
Figure 22F:
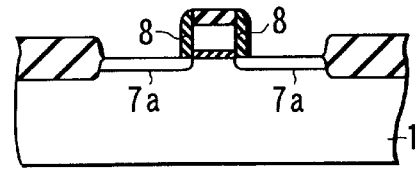

As shown in FIG. 22F, the silicon nitride film is etched by anisotropic dry etching to form the side wall insulating films 8.

Figure 22G:
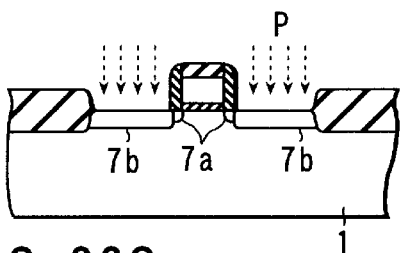

As shown in FIG. 22G, phosphorus ions are implanted into the resultant structure by using the gate electrode portion as a mask. The implanted phosphorus ions are distributed into the silicon substrate at the peak depth dependent on the acceleration energy. The resultant structure is annealed, for example, at 950° C. for 30 sec to diffuse the phosphorus ions into the silicon substrate and activate them. As a result, diffusion layers 7b serving as source and drain regions are formed.

Figure 22H:
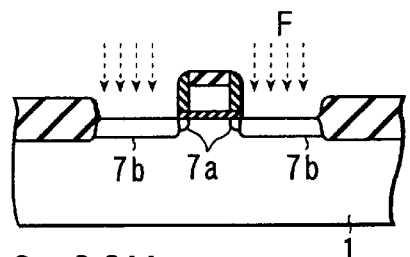

As shown in FIG. 22H, for example, fluorine ions are implanted into the source and drain regions at an acceleration voltage of 10 keV and a dose of $1 \times 10^{15}$ cm$^{-2}$. The resultant structure is annealed, for example, in a nitrogen atmosphere at 800° C. for 10 min to diffuse the implanted fluorine ions into a gate oxide film 3.

Figure 22I:
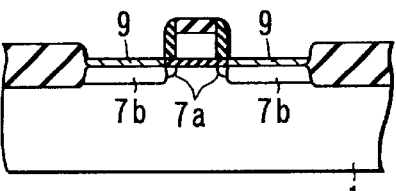
Figure 22J:
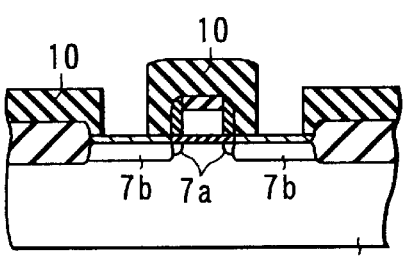
Figure 22K:
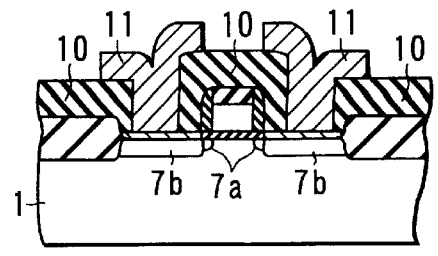

Since the step in FIG. 22I and the subsequent steps are the same as the step in FIG. 8I and the subsequent steps, a description thereof will be omitted.

In the above embodiment, fluorine is introduced into the source and drain regions. However, fluorine may be introduced into the polysilicon film serving as an gate electrode and the source and drain regions at once. In this case, after the polysilicon film is patterned, phosphorus ions are implanted into the polysilicon film as the gate electrode and the source and drain regions at once at a dose of $1 \times 10^{15}$ cm$^{-2}$. The resultant structure is annealed at 900° C. for 30 sec to activate the phosphorus ions in the polysilicon film and the two regions as the source and drain diffusion layers. Thereafter, fluorine ions are implanted into the resultant structure at an acceleration voltage of 10 keV and a dose of $1 \times 10^{15}$ cm$^{-2}$ to simultaneously introduce fluorine into the polysilicon film and the source and drain regions. The resultant structure is annealed in a nitrogen atmosphere at 800° C. for 10 min to introduce fluorine into the gate oxide film.

According to this embodiment, the reliability of the entire gate oxide film can be improved, and the reliability with respect to hot carriers can be improved at the edge portion of the gate electrode or the drain end at which impact ionization tends to occur can be improved. In addition, a damaged region of an oxide film having a low dielectric breakdown strength owing to reactive ion etching or ion implantation of fluorine can be efficiently mended with fluorine.

13th Embodiment

Figure 23A:
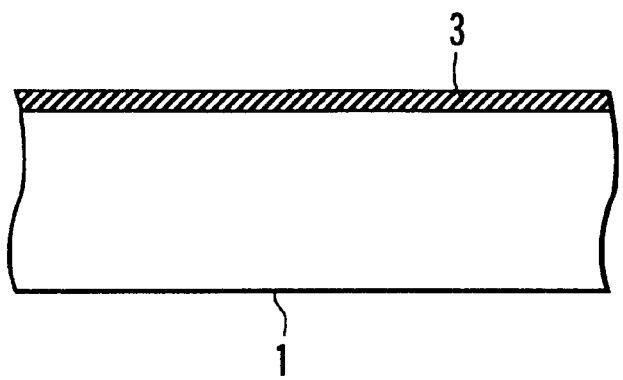
FIGS. 23A to 23C are sectional views sequentially showing the steps in manufacturing the capacitor portion of a CMOS transistor according to the 13th embodiment of the present invention.
Figure 23B:
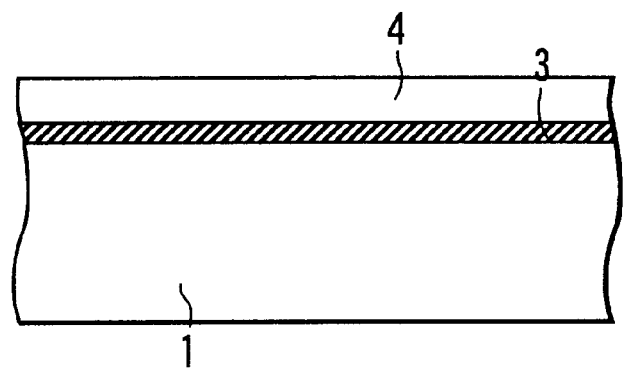
Figure 23C:
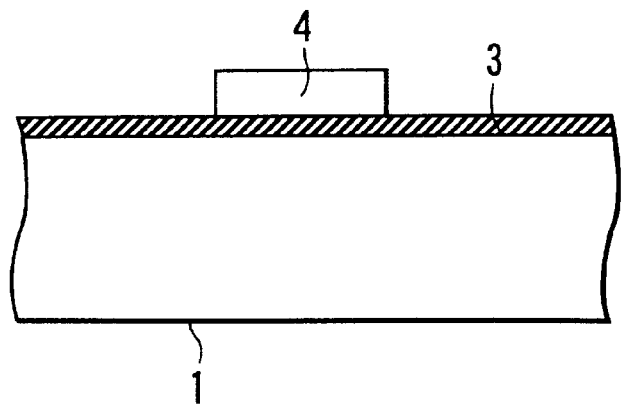

FIGS. 23A to 23C are sectional view sequentially showing the steps in a method of manufacturing a MOS capacitor according to the 13th embodiment of the present invention.

First of all, as shown in FIG. 23A, for example, a (100)-oriented n-type silicon substrate 1 with a resistivity of 4 to 6 Ωcm is prepared. An 8-nm thick oxide film 3 is formed by using, for example, dry oxygen.

As shown in FIG. 23B, a boron-doped amorphous gas silicon film (not shown) is deposited on the oxide film 3 to a thickness of 20 nm at, for example, 500° C. by using disilane ($Si_2H_6$) gas and boron trifluoride ($BF_3$) gas. In this case, since boron trifluoride is used as a deposition gas, the deposited boron-doped amorphous silicon contains fluorine. The resultant structure is continuously heated to 600° C. in an inert gas atmosphere or inoxidizable atmosphere, and a boron-doped polysilicon film 4 is deposited on the oxide film 3 to a thickness of about 200 nm by using silane gas and diborane gas. During deposition of this boron-doped polysilicon film, fluorine in the boron-doped amorphous silicon is diffused into the oxide film 3. This can improve the oxide film characteristics.

As shown in FIG. 23C, the phosphorus-doped polysilicon film 4 is patterned to form a MOS capacitor.

In the above embodiment, disilane gas and boron trifluoride gas are used as gases to be used for deposition of boron-doped amorphous silicon. However, the present invention is not limited this. For example, the same effect as described above can be obtained by using a combination of a silicon halide gas such as $SiH_2F_2$ and disilane gas or a mixture of disilane gas, diborane gas, and a small amount of a halogen-based gas. The amount of fluorine introduced into the oxide film can be controlled by changing the thickness or fluorine concentration of the amorphous silicon film sandwiched between the oxide film and the polysilicon film.

14th Embodiment

FIGS. 24A to 24L are sectional views sequentially showing the steps in a method of manufacturing a CMOS semiconductor device according to the 14th embodiment of the present invention.

Figure 24A:
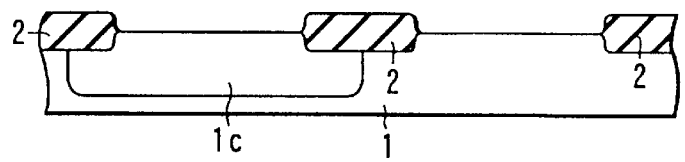
FIGS. 24A to 24L are sectional views sequentially showing the steps in manufacturing a CMOS transistor according to the 14th embodiment of the present invention.

First of all, as shown in FIG. 24A, for example, a (100)-oriented p-type silicon substrate 1 with a resistivity of 4 to 6 Ωcm is prepared. Element isolation insulating films, each having a thickness of about 0.6 µm, are formed on the upper surface of the p-type silicon substrate 1 by a general selective oxidation method.

Subsequently, an n-type dopant is selectively ion-implanted with a high acceleration energy. The resultant structure is continuously annealed at a high temperature to form a well region 1c.

Figure 24B:
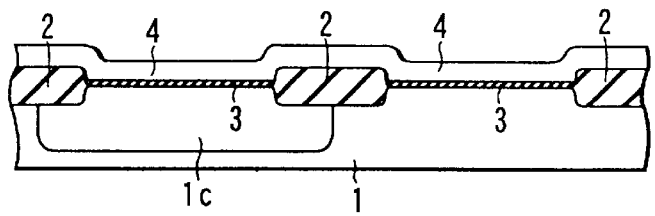

As shown in FIG. 24B, a gate oxide film 3 having a thickness of 3 to 8 nm is formed in the well region 1c by thermal oxidation. A 200-nm thick polysilicon film 4 is formed as a gate electrode on the gate oxide film 3.

Figure 24C:
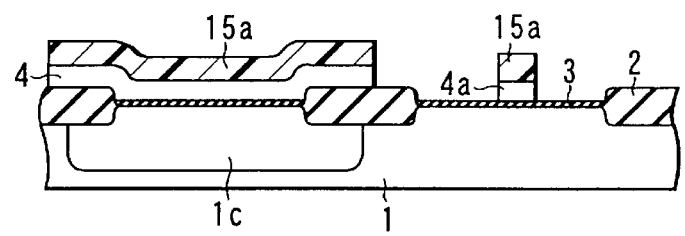

As shown in FIG. 24C, the gate portion of the p-channel MOSFET formation region and the entire surface of the n-channel MOSFET are covered with a resist mask 15a. The polysilicon film is then etched by RIE to form a gate electrode 4a of the p-channel MOSFET.

Figure 24D:
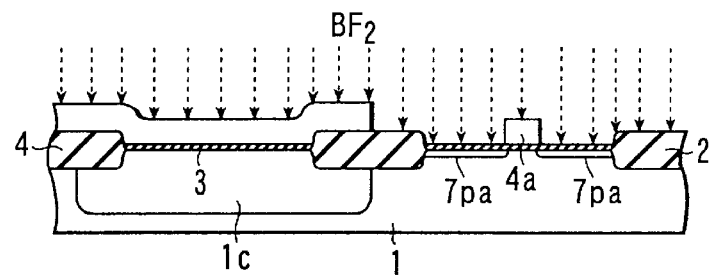

As shown in FIG. 24D, after the resist mask 15a is removed, $BF_2$ ions are implanted into the resultant structure at, for example, at an acceleration voltage of 30 keV and a dose of $5 \times 10^{14}$ cm$^{-2}$ to form impurity diffusion regions 7pa on the p-channel MOSFET side. At the same time, $BF_2$ ions are also implanted into the polysilicon film 4 in the n-channel MOSFET region.

Figure 24E:
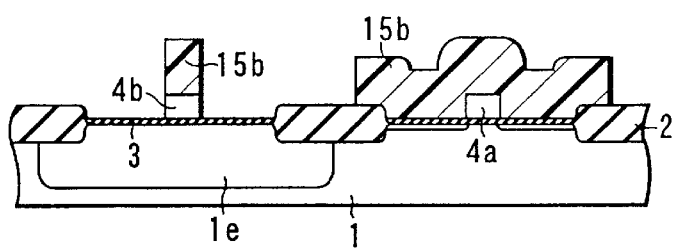

As shown in FIG. 24E, the gate portion of an n-channel MOSFET formation region and the entire surface of the p-channel MOSFET formation region are covered with a resist mask 15b. The polysilicon film 4 is etched by RIE to form a gate electrode 4b of a n-channel MOSFET.

Figure 24F:
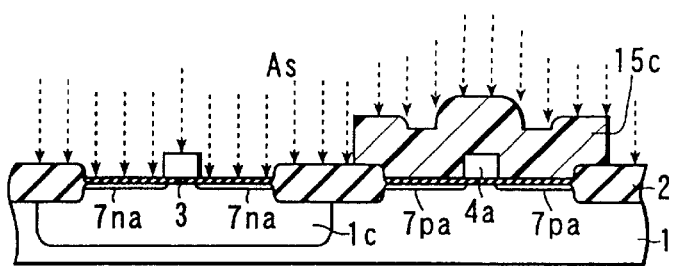

As shown in FIG. 24F, after the resist mask 15b is removed, only the p-channel MOSFET region is masked with a resist 15c. Subsequently, arsenic or phosphorus ions are implanted into the entire surface of the resultant structure, for example, at an acceleration voltage of 30 keV and a dose of $1 \times 10^{15}$ cm$^{-2}$ to form an impurity diffusion region 7na on the n-channel MOSFET side.

Figure 24G:
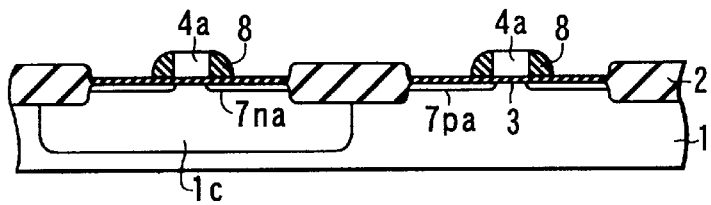

As shown in FIG. 24G, side wall insulating films 12, each consisting of a silicon nitride film having a thickness of about 10 nm, are formed on side walls of the gate electrodes 4a and 4b by LP-CVD. These side wall insulating films are obtained by depositing a 10-nm thick silicon nitride film on the entire surface by CVD and etching the entire surface of the silicon nitride film by anisotropic dry etching.

Figure 24H:
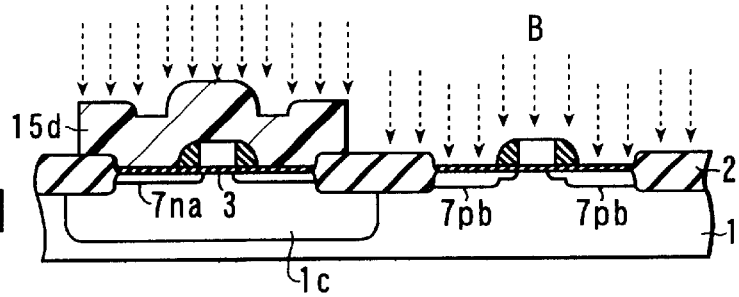

As shown in FIG. 24H, the n-channel MOSFET region is masked with a resist mask 15d. Subsequently, boron ions are implanted into the resultant structure, for example, at an acceleration voltage of 20 keV and a dose of $3 \times 10^{15}$ cm$^{-2}$ to form p-type source and drain diffusion layers 7pb. In this case, since the upper surfaces of the polysilicon film and the substrate are made amorphous upon implantation of the above $BF_2$ ions, the ranges of boron ions can be decreased.

Figure 24I:
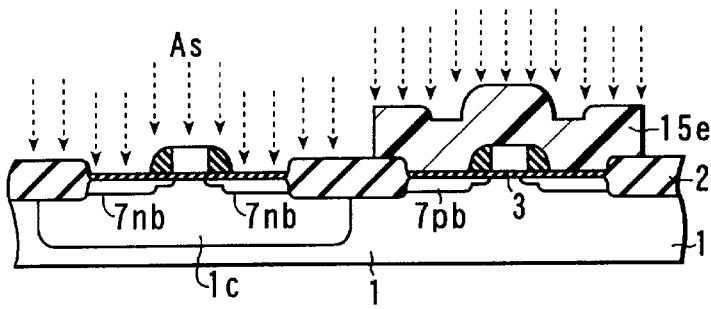

Similarly, as shown in FIG. 24I, the p-channel MOSFET region is masked with a resist mask 15e. Thereafter, arsenic or phosphorus ions are implanted into the resultant structure, for example, at an acceleration voltage of 50 keV and a dose of $3 \times 10^{15}$ cm$^{-2}$ to form n-type source and drain diffusion layers 7nb.

The above silicon substrate is annealed in a nitrogen atmosphere at 950° C. for 1 min to activate the dopant in each gate electrode and the source and drain diffusion layers. In this case, fluorine ions implanted as $BF_2$ ions into the polysilicon films 4a and 4b serving as the gate electrodes of the n- and p-channel MOSFETs are diffused into the gate oxide film 3 by annealing.

Figure 24J:
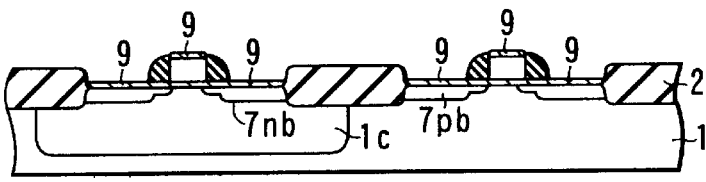

As shown in FIG. 24J, a 25-nm thick titanium film and a 50-nm thick titanium nitride film are sequentially deposited on the entire surface of the resultant structure by sputtering. Subsequently, annealing is performed in a nitrogen atmosphere at 700° C. for 1 min to cause the entire thin titanium film to react with the gate polysilicon and the silicon substrate. As a result, titanium salicide films 9 are formed on the gate electrode and the source and drain diffusion layer regions. Thereafter, the titanium nitride film and the unreacted titanium film on the insulating film are selectively peeled off by, for example, an aqueous solution of hydrofluoric acid and a solution mixture of sulfuric acid and hydrogen peroxide.

Figure 24K:
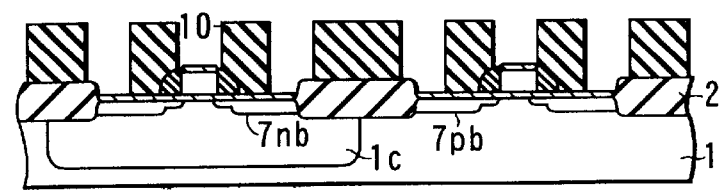

As shown in FIG. 24K, a 300-nm thick silicon oxide film 10 is formed on the entire surface of the resultant structure by CVD, and contact holes are formed in the silicon oxide film 10 by anisotropic dry etching.

Figure 24L:
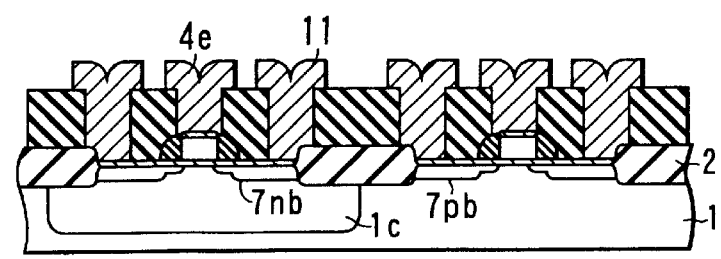

As shown in FIG. 24L, an 800-nm thick aluminum film containing 0.5% of silicon and 0.5% of copper is formed on the silicon oxide film 10 and is patterned to form source and drain electrodes 11 and a gate contact 4e. Thereafter, the resultant structure is annealed in a nitrogen atmosphere containing 10% of hydrogen at 450° C. for 15 min.

In this embodiment, fluorine is introduced into the gate electrode by using $BF_2$ as an ion species. However, the ion species to be used is not limited to $BF_2$. For example, the same effect as described above can be obtained by using silicon fluoride ions or arsenic or phosphorus fluoride ions.

15th Embodiment

FIGS. 25A to 25L are sectional views sequentially showing the steps in a method of manufacturing a MOS semiconductor device according to the 15th embodiment of the present invention.

Figure 25A:
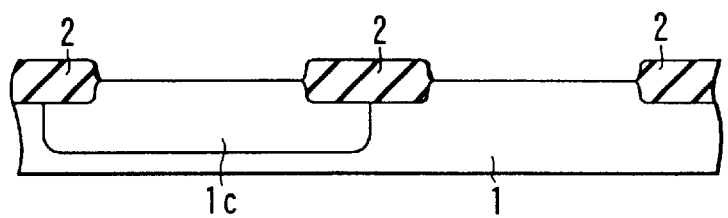
FIGS. 25A to 25M are sectional views sequentially showing the steps in manufacturing a CMOS transistor according to the 15th embodiment of the present invention.
Figure 25B:
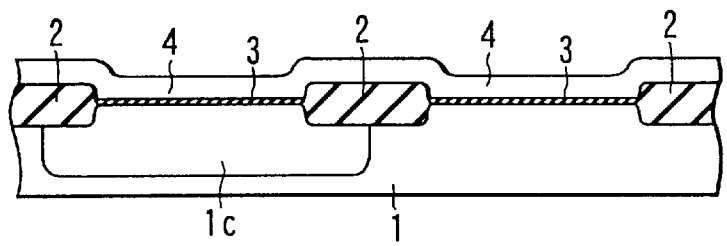

The steps in FIGS. 25A and 25B are executed in the same manner as in the steps in FIGS. 24A and 24B.

Figure 25C:
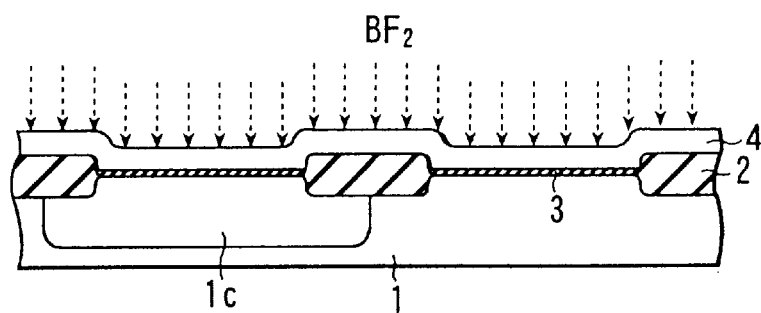

As shown in FIG. 25C, $BF_2$ ions are implanted into the entire surface of the silicon substrate, for example, at an acceleration voltage of 30 keV and a dose of $5 \times 10^{14}$ cm$^{-2}$. In this case, fluorine ions implanted as $BF_2$ ions into the polysilicon film are diffused into the gate oxide film.

Figure 25D:
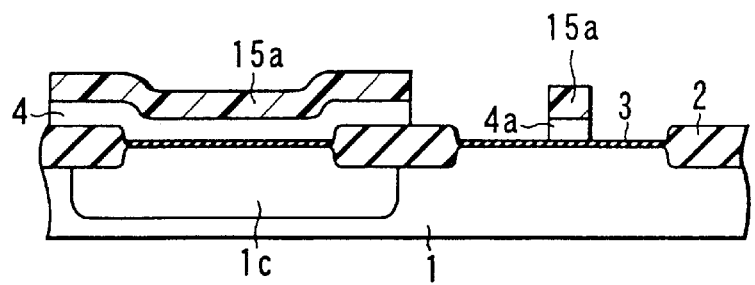

As shown in FIG. 25D, the gate portion of a p-channel MOSFET formation region and the entire surface of an n-channel MOSFET formation region are masked with a resist mask 15a. The polysilicon film is then etched by RIE to form a gate electrode 4a of the p-channel MOSFET.

Figure 25E:
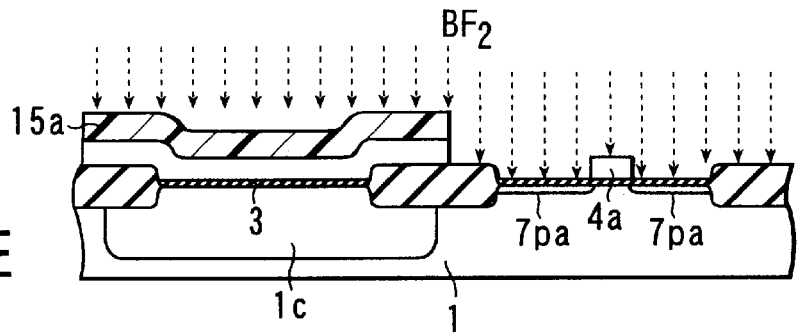
Figure 25F:
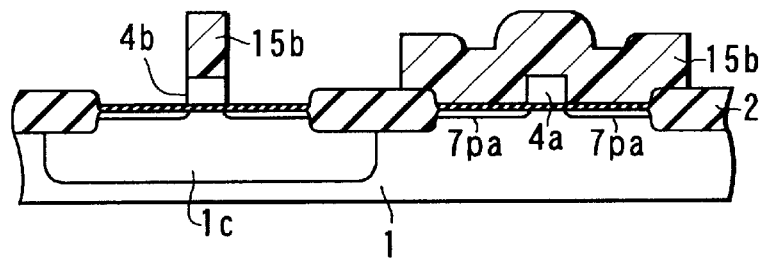
Figure 25G:
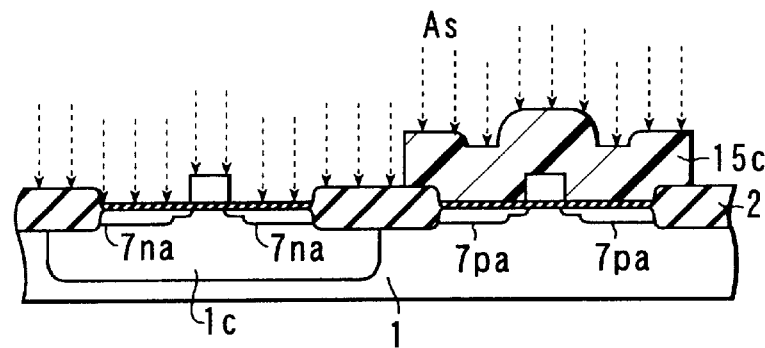
Figure 25H:
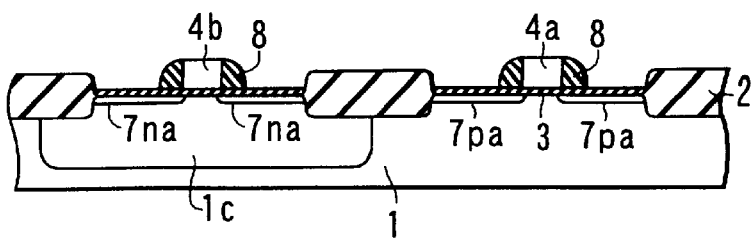
Figure 25I:
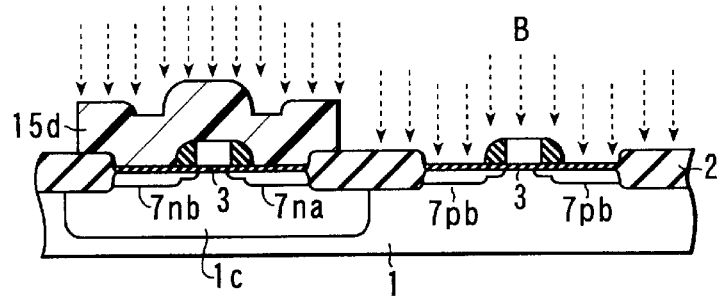
Figure 25J:
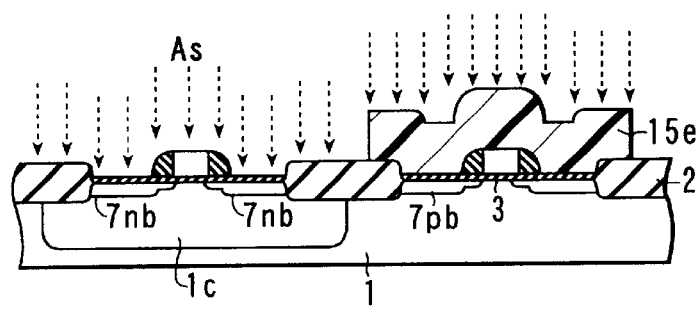
Figure 25K:
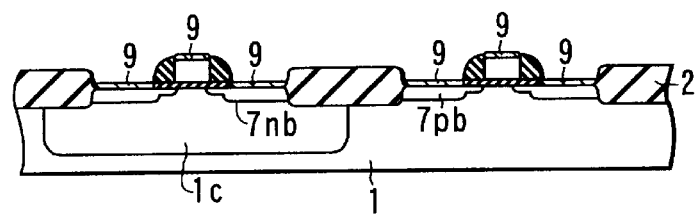
Figure 25L:
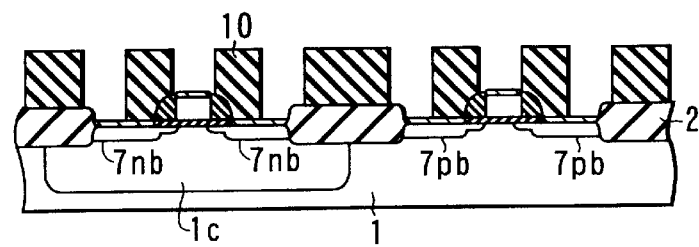
Figure 25M:
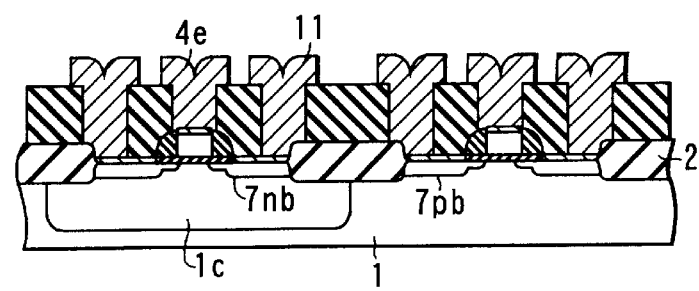

As shown in FIG. 25E, the resist mask 15a on the gate electrode on the p-channel MOSFET side is removed, $BF_2$ ions are implanted into the resultant structure, for example, at an acceleration voltage of 30 keV and a dose of $5 \times 10^{14}$ cm$^{-2}$ to form impurity diffusion regions 7pa on the p-channel MOSFET side.

The steps in FIGS. 25F to 25M are executed in the same manner as the steps in FIGS. 24E to 24L in the 14th embodiment.

In this embodiment as well, fluorine is introduced into the gate electrode by using $BF_2$ as an ion species. However, the ion species to be used is not limited to $BF_2$. For example, the same effect as described above can be obtained by using silicon fluoride ions or arsenic or phosphorus fluoride ions.

In addition, $BF_2$ ions are implanted to form the impurity diffusion layers 7pa in the p-channel MOSFET region. However, boron ions may be implanted at a low acceleration voltage, e.g., 5 keV. In this case, since fluorine is not introduced in large amount from the source and drain diffusion layers into the gate oxide film, a gate oxide film with high reliability can be realized.

16th Embodiment

FIGS. 26A to 26K are sectional views sequentially showing the steps in a method of manufacturing a MOS semiconductor device according to the 16th embodiment of the present invention.

Figure 26A:
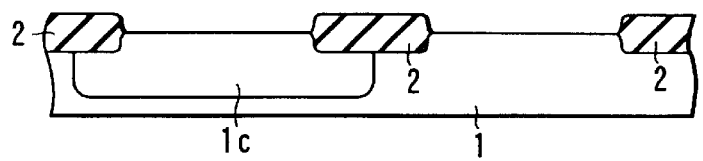
Figure 26B:
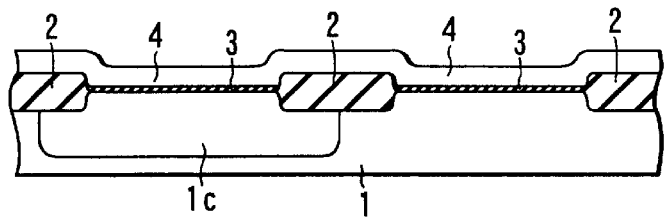

The steps in FIGS. 26A and 26B are executed in the same manner as the steps in FIGS. 24A and 24B in the 14th embodiment.

Figure 26C:
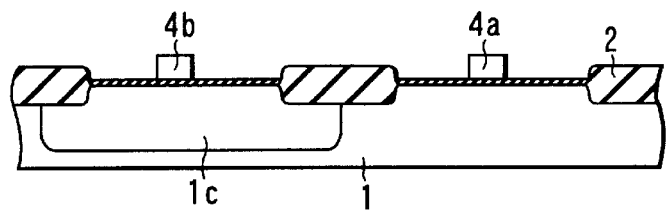

As shown in FIG. 26C, gate electrode 4a and 4b of n- and p-channel MOSFETs are formed by etching the polysilicon film by RIE using a resist mask (not shown).

Figure 26D:
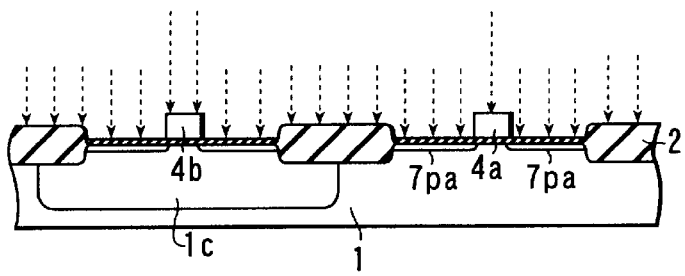

As shown in FIG. 26D, $BF_2$ ions are implanted into the entire surface of the silicon substrate, for example, at an acceleration voltage of 30 keV and a dose of $5 \times 10^{14}$ cm$^{-2}$. Thereafter, fluorine ions implanted as $BF_2$ ions are thermally diffused into the gate oxide film in a nitrogen atmosphere. The same effect as in the above case can be obtained even if this annealing step is performed concurrently with the subsequent annealing step of activating the dopant in the polysilicon films as the gate electrodes and in the source and drain diffusion layers, instead of performing the annealing step at this time.

Figure 26E:
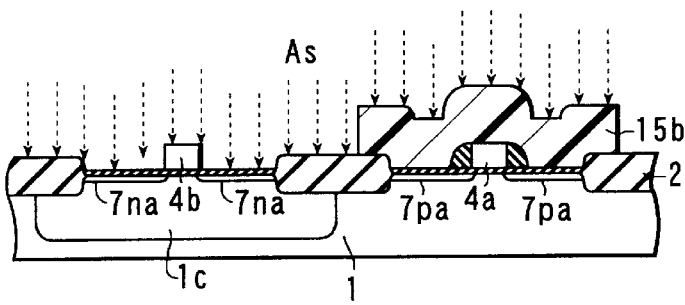
Figure 26F:
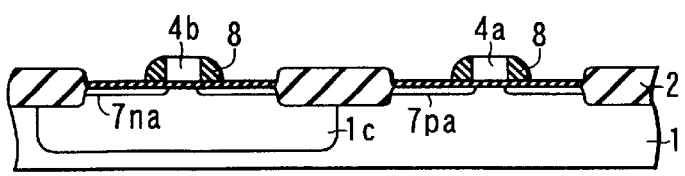
Figure 26G:
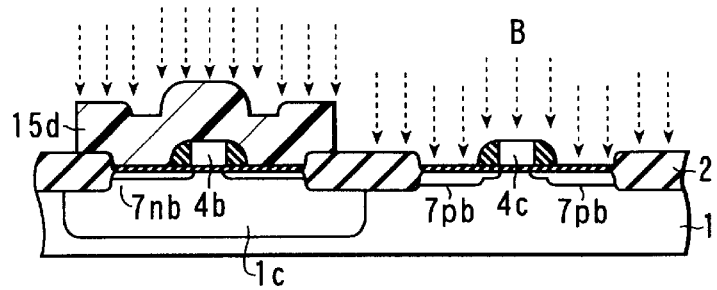
Figure 26H:
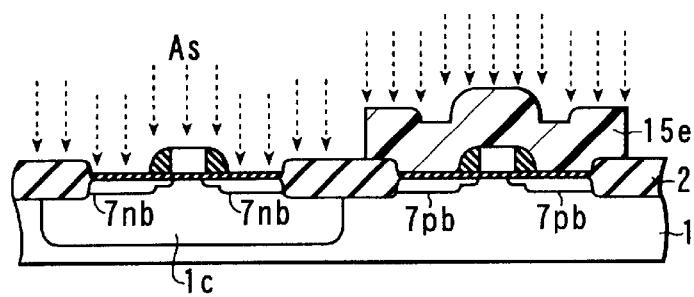
Figure 26I:
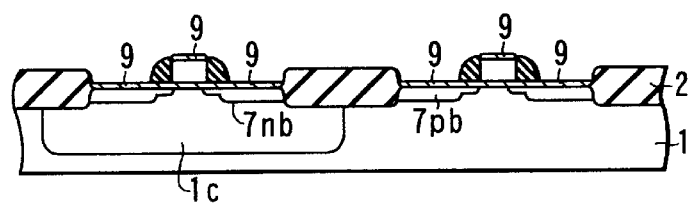
Figure 26K:
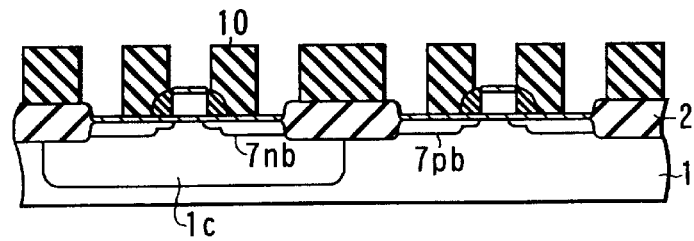
Figure 26K:
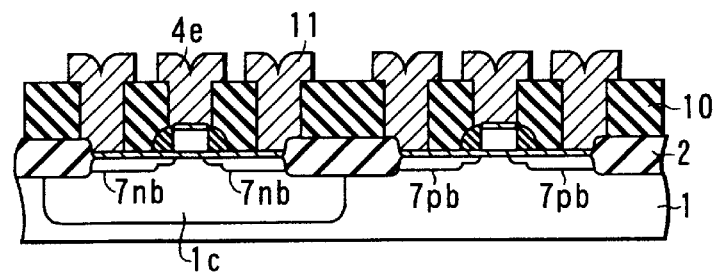

As shown in FIG. 26E, the p-channel MOSFET region is masked with a resist mask 15b. Subsequently, arsenic or phosphorus ions are implanted into the resultant structure, for example, at an acceleration voltage of 30 keV and a dose of $5 \times 10^{15}$ cm$^{-2}$. As a result, diffusion layers 7na are formed on the n-channel MOSFET side.

The subsequent steps in FIGS. 26F to 26K are executed in the same manner as the steps in FIGS. 24F to 24K in the 14th embodiment.

The same effects as those of the 14th embodiment can be obtained in this embodiment.

17th Embodiment

FIGS. 27A to 27E are sectional views sequentially showing the steps in a method of manufacturing a MOS semiconductor device according to the 17th embodiment of the present invention.

In this embodiment, the present invention is applied to a structure in which source and drain regions are formed before the formation of a gate electrode.

Figure 27A:
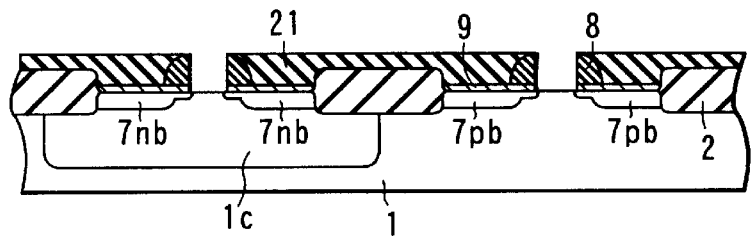
FIGS. 27A to 27E are sectional views sequentially showing the steps in manufacturing a CMOS transistor according to the 17th embodiment of the present invention.

As shown in FIG. 27A, element isolation insulating films 2 are formed on the upper surface of an n-type silicon substrate 1, and a well 1a is formed therein. In addition, source and drain diffusion layers 7na and 7pa are formed on n- and p-channel MOSFETs before the formation of gate electrodes.

Figure 27B:
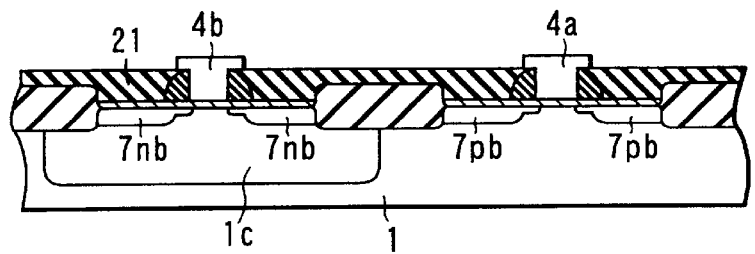

As shown in FIG. 27B, a gate oxide film 3 having a thickness of 3 to 8 nm is formed on this structure, and 200-nm thick polysilicon films 4a and 4b are buried as gate electrodes in the gate oxide film 3.

Figure 27C:
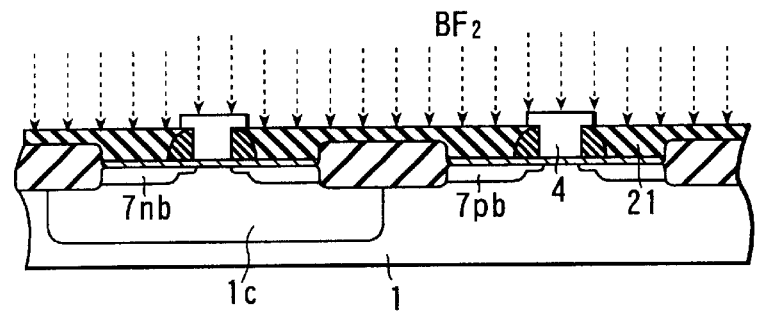

As shown in FIG. 27C, $BF_2$ ions are implanted into the entire surface of the silicon substrate, for example, at an acceleration voltage of 30 keV and a dose of $5 \times 10^{14}$ cm$^{-2}$.

Figure 27D:
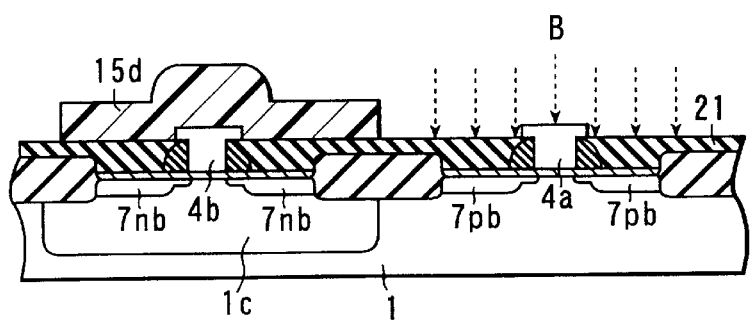

As shown in FIG. 27D, the n-channel MOSFET region is masked with a resist mask 15d, and boron ions are implanted into the resultant structure, for example, at an acceleration voltage of 20 keV and a dose of $3 \times 10^{15}$ cm$^{-2}$. In this case, since $BF_2$ ions are implanted into the polysilicon film in advance, the upper surface of the polysilicon film has become amorphous. This decreases the implanting ranges of boron ions.

Figure 27E:
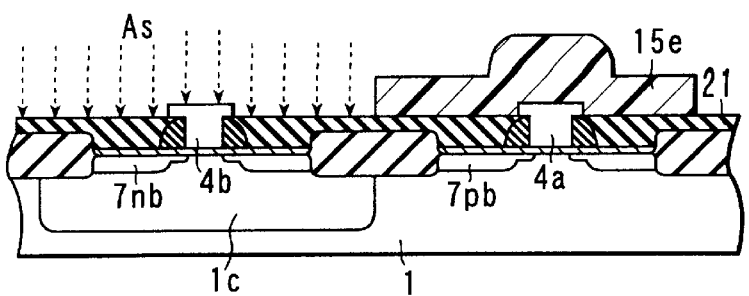

As shown in FIG. 27E, after the resist mask 15d is removed, the p-channel MOSFET region is masked with a resist mask 15e. Subsequently, arsenic or phosphorus ions are implanted into the resultant structure, for example, at an acceleration voltage of 40 keV and a dose of $5 \times 10^{15}$ cm$^{-2}$ to form n-type source and drain diffusion layers 7nb.

In this case, a dopant is ion-implanted into the polysilicon film as the gate electrode of the n-channel MOSFET. However, the present invention is not limited to this. For example, a polysilicon film containing phosphorus may be deposited by using a gas mixture of $SiH_4$ and $PH_3$.

After the resist mask 15e is removed, the above silicon substrate is annealed in a nitrogen atmosphere at 850° C. for 30 min. In this case, fluorine ions implanted as $BF_2$ ions into the polysilicon film are diffused into a gate oxide film 3 by annealing.

The subsequent steps are performed in the same manner as the steps in FIGS. 24J to 24L in the 14th embodiment. As a result, a semiconductor device is completed.

According to the element structure of this embodiment, since the source and drain diffusion layers are formed before the formation of the gate electrodes, the annealing step of thermally diffusing fluorine ions implanted into the gate electrode into the gate oxide film can be performed at a low temperature, e.g., in the temperature range of 300 to 800° C.

In this embodiment, fluorine ions are introduced as $BF_2$ ions. However, the present invention is not limited to this. For example, the same effect as described above can be obtained by using a single halogen element, silicon halide, or a phosphorus or arsenic halide.

In this embodiment of the present invention, a silicon thermal oxide film is used as a gate insulating film. However, the present invention is not limited to this. For example, an oxide film containing nitrogen, a nitride film, or another ferroelectric film can be used. In addition, the same effect as described above can be obtained by using an oxide film other than a thermal oxide film, e.g., an oxide film using oxygen activated by microwave discharge or laser irradiation.

18th Embodiment

The 18th embodiment of the present invention will be described next with reference to FIGS. 28 and 29A to 29L.

Figure 28:
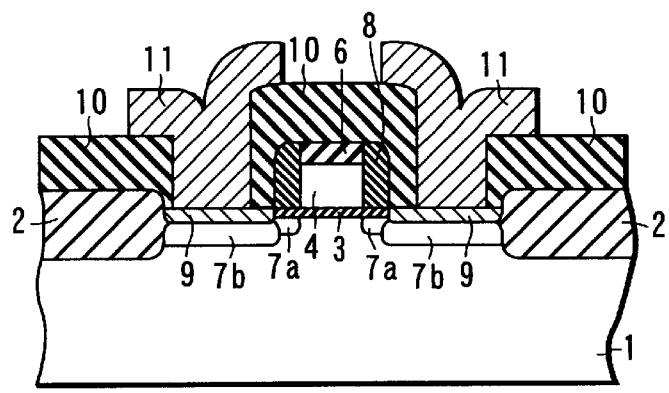
FIG. 28 is a sectional view showing the structure of a MIS transistor according to the 18th (and 19th) embodiment of the present invention.

The structure in FIG. 28 is basically the same as that in FIG. 7. In this embodiment, however, the distribution of fluorine (in general, a halogen element) concentration in a gate oxide film 3 (oxynitride film) is set such that the concentrations near the two interfaces of the gate oxide film 3 are equal to or higher than the concentration near the central portion of the gate oxide film 3. In addition, the maximum element concentration of the halogen element in the gate oxide film 3 is $10^{20}$ to $10^{21}/cm^{-3}$.

A manufacturing process for the n-channel MIS transistor shown in FIG. 28 will be described below with reference to FIGS. 29A to 29L.

Figure 29A:
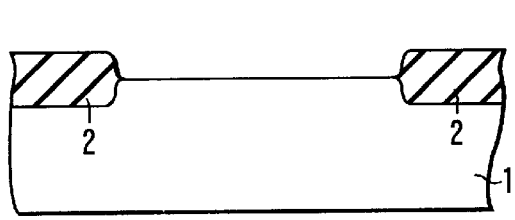
FIGS. 29A to 29L are sectional views sequentially showing the steps in manufacturing the MOS transistor according to the 18th embodiment of the present invention.
Figure 29D:
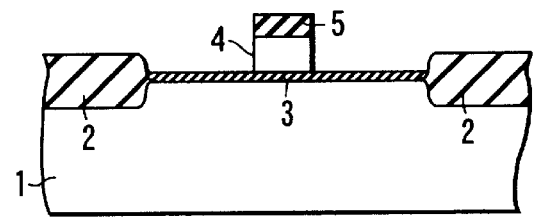

First of all, as shown in FIG. 29A, for example, a (100)-oriented p-type silicon substrate 1 with a resistivity of 4 to 6 Ωcm is prepared. Element isolation insulating films 2, each having a thickness of about 0.6 μm, are formed on the upper surface of the p-type silicon substrate 1 by a general selective oxidation method.

Figure 29B:
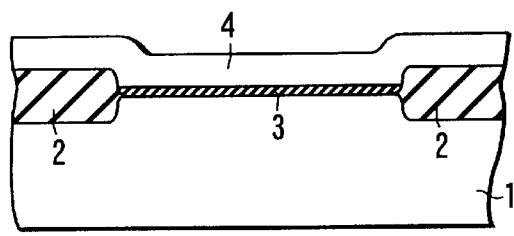
Figure 29E:
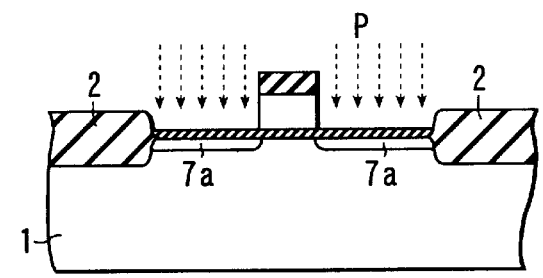

As shown in FIG. 29B, after a 6-nm thick silicon oxide film is formed by thermal oxidation using dry oxygen, the silicon oxide film is exposed to, for example, an ammonia ($NH_3$) gas atmosphere to form the oxynitride film 3 as a gate insulating film in which nitrogen atoms are introduced.

A 200-nm thick polysilicon film 4 serving as a gate electrode is deposited on the gate insulating film 3. Phosphorus is diffused (at 850° C. for 30 min) into this polysilicon film by using, for example, phosphorus oxychloride ($POCl_3$) to decrease the resistance of the polysilicon film 4.

Figure 29C:
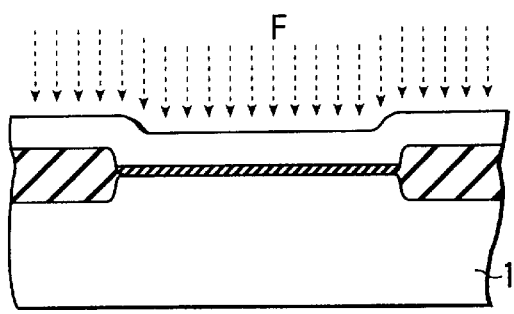
Figure 29F:
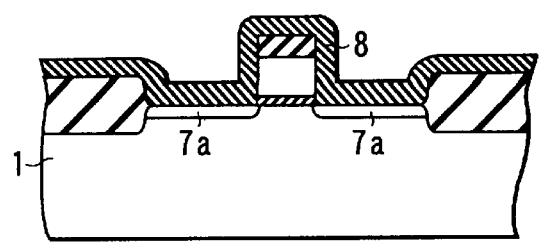
Figure 29G:
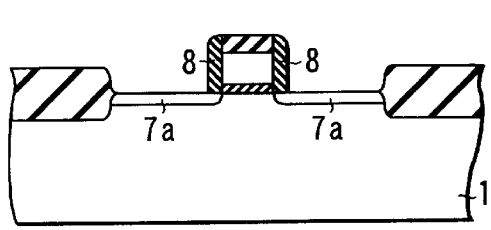
Figure 29J:
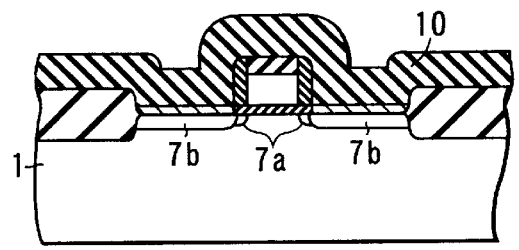
Figure 29H:
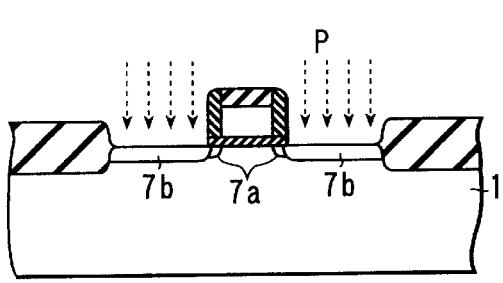
Figure 29K:
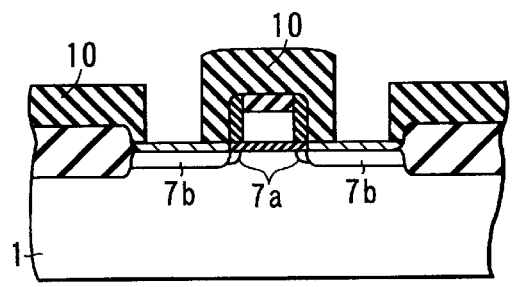
Figure 29I:
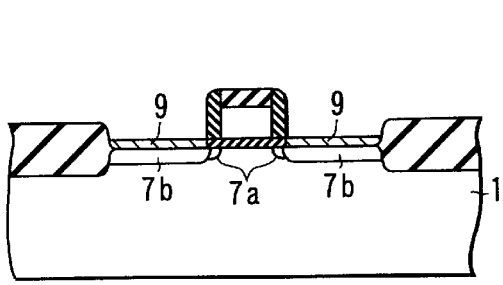
Figure 29L:
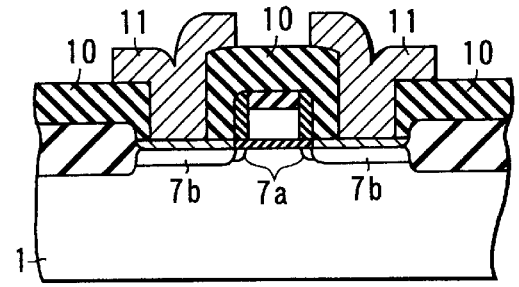

As shown in FIG. 29C, fluorine ions are implanted into the entire surface of the polysilicon film 4, for example, at an acceleration voltage of 80 keV and a dose of $1 \times 10^{15}$ $cm^{-2}$. In this case, the fluorine concentration distribution immediately after ion implantation has its peak concentration in the oxynitride film 3, while fluorine is diffused into the silicon substrate 1 and the polysilicon film 4. The resultant structure is then annealed, for example, in a nitrogen atmosphere at 850° C. for 30 min. As a result, the fluorine implanted into the silicon substrate 1, the gate insulating film 3, and the polysilicon film 4 is diffused into the two interfaces of the gate insulating film 3. The fluorine concentrations near the two interfaces of the gate insulating film 3 become equal to or higher than the fluorine concentration near the central portion of the gate insulating film 3 owing to diffusion of the fluorine and pileup of the diffused fluorine.

The steps in FIGS. 29D to 29L are executed in the same manner as the steps in FIGS. 8D to 8L in the first embodiment.

In this embodiment, fluorine ions are directly implanted into the polysilicon film serving as a gate electrode. However, to prevent a metal impurity from mixing into fluorine during ion implantation, for example, a 20-nm thick oxide film may be formed on the polysilicon film, and fluorine ions may be implanted through this oxide film.

In this embodiment, fluorine ions are implanted to have a peak concentration in the gate insulating film. However, fluorine ions may be implanted to have peak concentrations in the gate electrode, the gate insulating film, and the substrate, respectively, by controlling the acceleration voltage for ion implantation.

19th Embodiment

The 19th embodiment of the present invention will be described next with reference to FIGS. 30A to 30N. Since the final structure of this embodiment is the same as that shown in FIG. 28, a description thereof will be omitted.

Figure 30A:
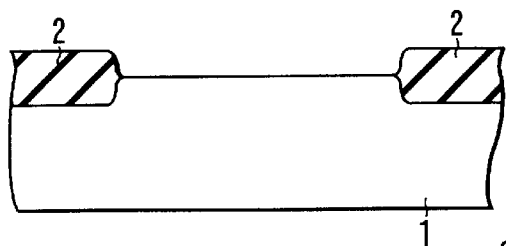
FIGS. 30A to 30N are sectional views sequentially showing the steps in manufacturing a MOS transistor according to the 19th embodiment of the present invention.

First of all, as shown in FIG. 30A, for example, a (100)-oriented p-type silicon substrate 1 with a resistivity of 4 to 6 Ωcm is prepared. Element isolation insulating films 2, each having a thickness of about 0.6 μm, are formed on the upper surface of the p-type silicon substrate 1 by a general selective oxidation method.

Figure 30B:
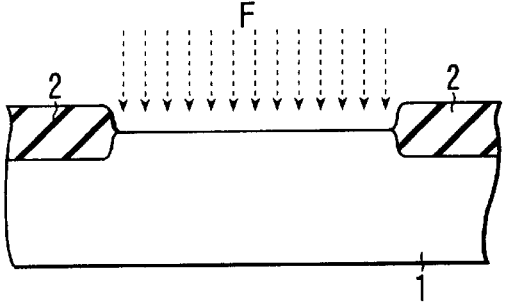

As shown in FIG. 30B, fluorine ions are implanted into the upper surface of the silicon substrate 1, for example, at an acceleration voltage of 10 keV and a dose of $1 \times 10^{15}$ $cm^{-2}$.

Figure 30C:
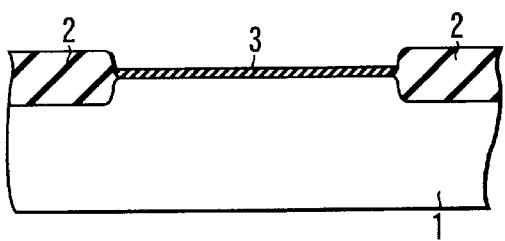

As shown in FIG. 30C, a 6-nm thick silicon oxide film is formed on the substrate by, for example, thermal oxidation using dry oxygen. This silicon oxide film is exposed to an ammonia atmosphere to introduce nitrogen atoms into the film. As a result, an oxynitride film 3 serving as a gate insulating film is formed.

Figure 30D:
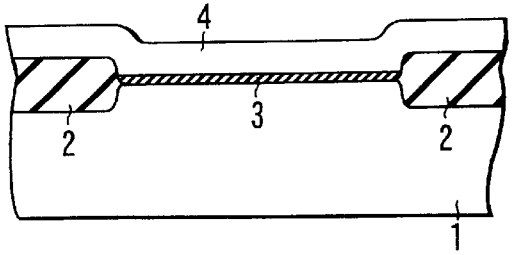

As shown in FIG. 30D, after a polysilicon film 4 is formed, phosphorus is diffused (at 850° C. for 30 min) into the polysilicon film 4 by using, for example, phosphorus oxychloride. As a result, the phosphorus is introduced into the polysilicon film 4 to decrease its resistance.

Figure 30E:
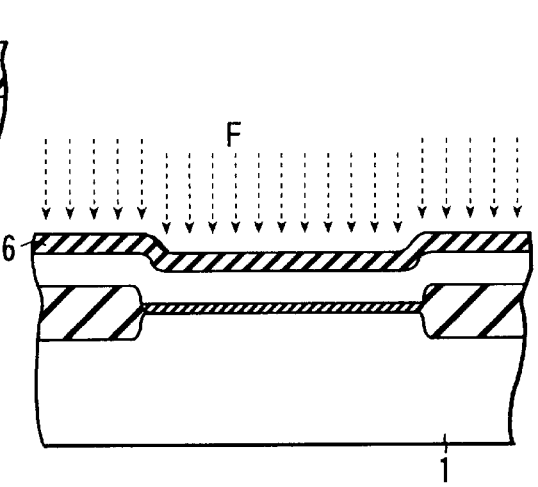

As shown in FIG. 30E, a CVD silicon oxide film 6 is deposited on the polysilicon film 4. Subsequently, fluorine ions are implanted into the silicon oxide film 6, for example, at an acceleration voltage of 30 keV and a dose of $1 \times 10^{15}$ $cm^{-2}$. This ion implantation is performed to have a peak fluorine concentration in the polysilicon film 4.

The resultant structure is annealed, for example, in a nitrogen atmosphere at 850° C. for 30 min. As a result, the implanted fluorine ions introduced into the silicon substrate 1 and the polysilicon film 4 are diffused into the two interfaces of the oxynitride film 3. With this process, the fluorine concentrations near the two interfaces of the gate insulating film 3 become equal to or higher than the fluorine concentration near the central portion of the gate insulating film 3.

Figure 30F:
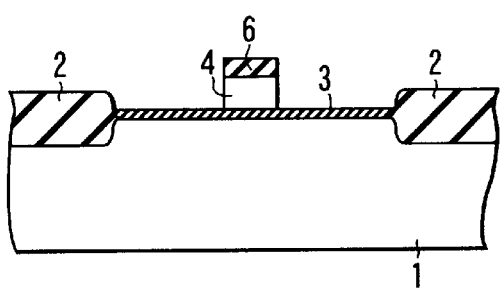

As shown in FIG. 30F, the polysilicon film 4 and the CVD silicon oxide film 6 are etched by reactive ion etching using a resist mask to form a gate portion.

Figure 30G:
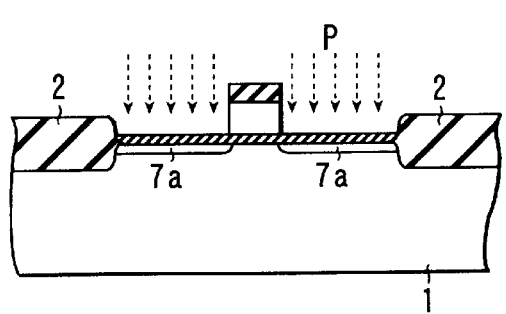
Figure 30H:
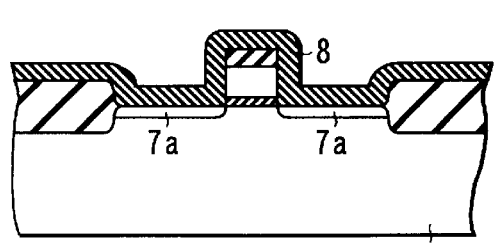
Figure 30L:
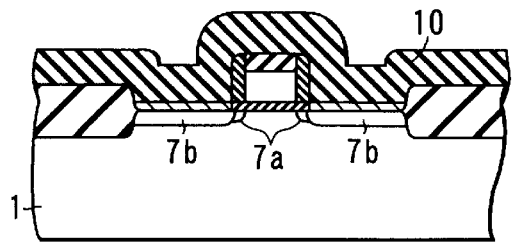
Figure 30I:
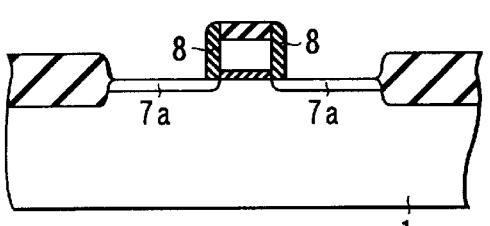
Figure 30M:
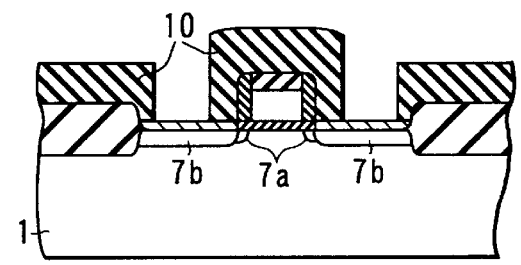
Figure 30J:
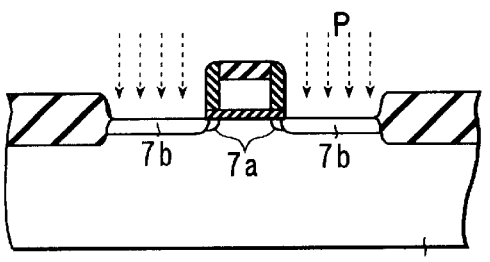
Figure 30N:
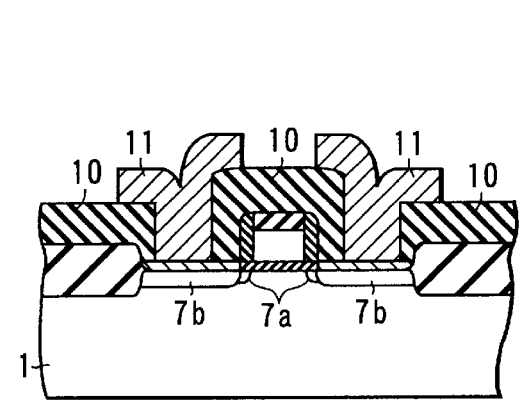
Figure 30K:
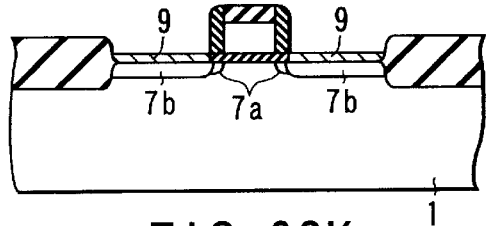

As shown in FIG. 30G, phosphorus ions are implanted into the resultant structure, for example, at a dose of $1 \times 10^{15}$ $cm^{-2}$ by using the gate portion as a mask. The implanted phosphorus ions are distributed into the silicon substrate mainly at the peak depth dependent on the acceleration energy. The resultant structure is annealed, for example, at 950° C. for 30 sec to diffuse phosphorus ions into the silicon substrate and activate them. As a result, diffusion layers 7a serving as source and drain regions are formed.

Since the steps in FIGS. 30H to 30N are the same as those in FIGS. 8F to 8L in the first embodiment, a description thereof will be omitted.

Assume that the present invention is applied to a device that cannot be annealed at a high temperature after ion implantation of fluorine. In this case, when fluorine ions are implanted through a gate insulating film, a gate insulating film structure cannot be reconstructed. When, however, fluorine is introduced into a silicon substrate and a polysilicon film serving as a gate electrode as in the above embodiment, fluorine can be effectively introduced into the two interfaces of the gate insulating film without breaking bonds in the gate insulating film upon ion implantation.

In the 18th and 19th embodiments, an oxynitride film is used as a gate insulating film. However, the same effect as described above can be obtained by using a silicon nitride film formed by using $SiH_2Cl_2$ or $SiCl_4$ and $NH_3$, a silicon nitride film formed by directly nitriding the upper surface of a silicon substrate with $NH_3$, or the like. In addition, the same effect can also be obtained by using a ferroelectric film such as a BSTO (Barium Strontium Titanate) film.

20th Embodiment

The 20th embodiment of the present invention will be described with reference to FIGS. 31 and 32A to 32M. In this embodiment, the present invention is applied to an electrically programmable and erasable nonvolatile semiconductor memory (EEPROM).

Figure 31:
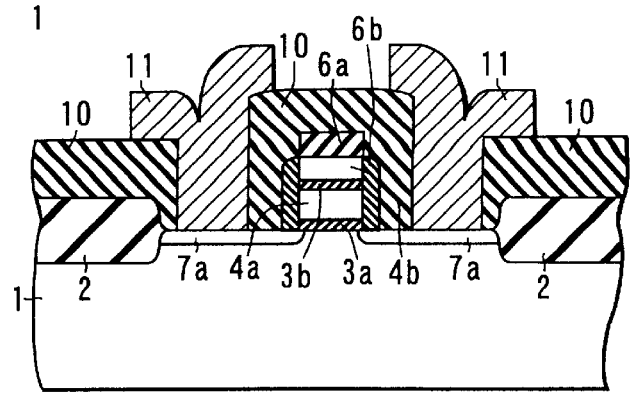
FIG. 31 is a sectional view showing a nonvolatile semiconductor memory according to the 20th embodiment of the present invention.

Referring to FIG. 31, silicon thermal oxide films 2 serving as element isolation insulating films are formed on a p-type silicon substrate 1. A first gate insulating film 3a is formed on the upper surface of the silicon substrate 1. A first polysilicon film 4a serving as a first gate electrode (floating gate) is formed on the first gate insulating film 3a. Fluorine atoms (in general, a halogen element) are introduced into the first gate insulating film 3a. The fluorine concentrations near the two interfaces of the first gate insulating film 3a become equal to or higher than the fluorine concentration near the central portion of the first gate insulating film 3a.

A second gate insulating film 3b is formed on the first polysilicon film 4a. A second polysilicon film 4b serving as a second gate electrode (control gate) is formed on the second gate insulating film 3b. Fluorine atoms (in general, a halogen element) are introduced into the second gate insulating film 3b. The fluorine concentrations near the two interfaces of the second gate insulating film 3b become equal to or higher than the fluorine concentration near the central portion of the second gate insulating film 3b.

A CVD silicon oxide film 6a is formed on the second polysilicon film 4b, and silicon oxide films 6b are formed on side walls of the gate portion. In addition, n-type source and drain diffusion layers 7a are formed on the upper surface of the silicon substrate 1 near the two ends of the first polysilicon film 4a by ion implantation of phosphorus. Furthermore, contact holes are formed in a CVD silicon oxide film 10 formed on the entire surface of the resultant structure and serving as an insulating interlayer, and Al electrodes 11 serving as interconnections are formed in the contact holes.

By introducing fluorine into the two interfaces of each of the first and second gate insulating films 3a and 3b in this manner, the dielectric breakdown strength and stress leakage characteristics of the first gate insulating film that cause electrons to tunnel with a high electric field can be improved.

In addition, the characteristics of the second gate insulating film 3b formed under the second polysilicon film 4b for controlling implantation/discharge of electrons can be made uniform. The first gate insulating film 3a, in particular, serves to inject electrons from the substrate 1 into the first polysilicon film 4a or discharge electrons from the first polysilicon film 4a to the substrate 1.

By introducing fluorine into the two interfaces of the first gate insulating film 3a, therefore, the dielectric breakdown strength with respect to stresses in the two directions can be improved, thereby attaining high performance and high reliability.

A manufacturing process for the nonvolatile semiconductor memory in FIG. 31 will be described below with reference to FIGS. 32A to 32M.

Figure 32A:
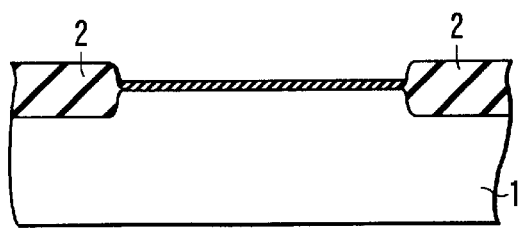
FIGS. 32A to 32M are sectional views sequentially showing the steps in manufacturing the nonvolatile semiconductor memory according to the 20th embodiment of the present invention.

First of all, as shown in FIG. 32A, for example, a (100)-oriented p-type silicon substrate 1 with a resistivity of 4 to 6 Ωcm is prepared. Element isolation insulating films 2, each having a thickness of about 0.6 μm, are formed on the upper surface of the p-type silicon substrate 1 by a general selective oxidation method.

Figure 32E:
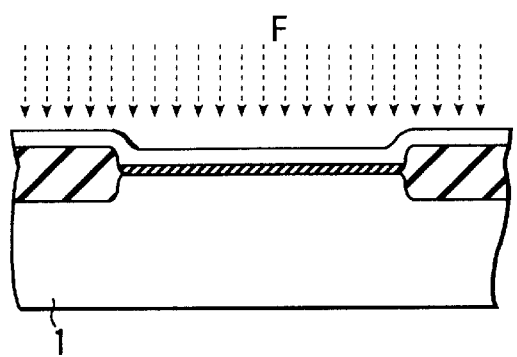
Figure 32B:
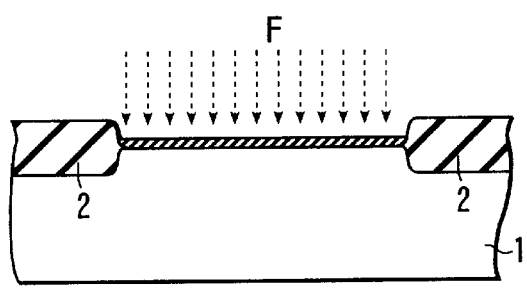

As shown in FIG. 32B, for example, fluorine ions are implanted into the upper surface region of the silicon substrate through a buffer thermal oxide film at an acceleration voltage of 10 keV and a dose of $1 \times 10^{15}$ cm$^{-2}$.

Figure 32F:
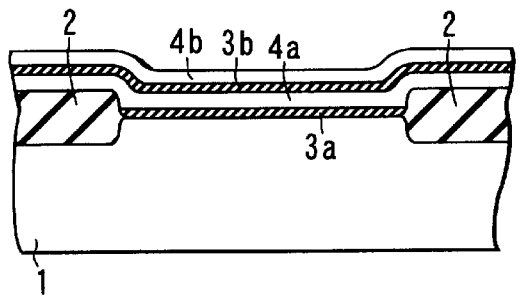
Figure 32C:
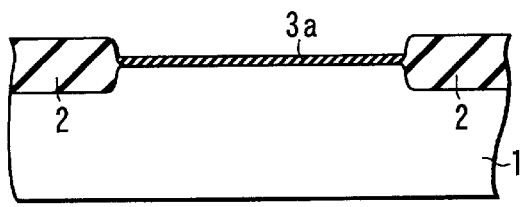

As shown in FIG. 32C, the buffer thermal oxide film is removed by using an ammonium fluoride solution or the like. Thereafter, a 6-nm thick silicon oxide film is formed on the resultant structure by thermal oxidation using dry oxygen. This silicon oxide film is exposed to, for example, ammonia ($NH_3$) gas to introduce nitrogen atoms into the film, thereby forming the oxynitride film 3a serving as the first gate insulating film.

Figure 32G:
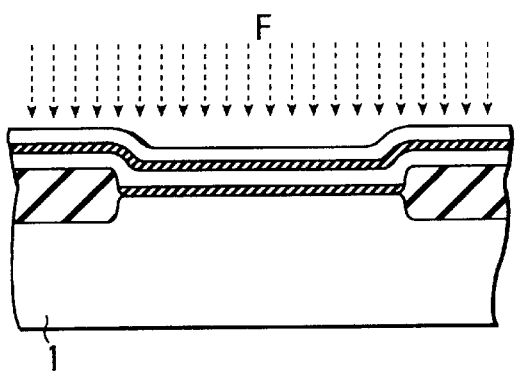
Figure 32D:
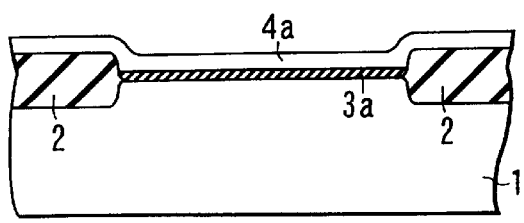

As shown in FIG. 32D, the 200-nm thick polysilicon film 4a serving as a floating gate is deposited on the first gate insulating film 3a. Phosphorus is diffused into the polysilicon film 4a at 850° C. for 30 min by using, for example, phosphorus oxychloride ($POCl_3$) to dope the polysilicon film 4a with phosphorus. As a result, the resistance of the polysilicon film 4a decreases. Note that a polysilicon film containing phosphorus may be deposited by causing silane ($SiH_4$) gas and phosphine ($PH_3$) gas to reach with each other. Alternatively, phosphorus ions may be implanted into the polysilicon film 4a, and the resultant structure may be annealed, for example, in a nitrogen atmosphere at 900° C. for 30 min to activate the phosphorus ions, thereby decreasing the resistance of the polysilicon film.

As shown in FIG. 32E, for example, fluorine ions are implanted into the polysilicon film 4a at an acceleration voltage of 30 keV and a dose of $1 \times 10^{15}$ cm$^{-2}$.

As shown in FIG. 32F, the 5-nm CVD silicon oxide film 3b serving as the second gate insulating film and the 200-nm thick polysilicon film 4b serving as the control gate are continuously deposited on the polysilicon film 4a. Phosphorus is diffused into the polysilicon film 4b at 850° C. for 30 min by using, for example, phosphorus oxychloride ($POCl_3$) to dope the polysilicon film 4b with phosphorus. As a result, the resistance of the polysilicon film 4b decreases.

As shown in FIG. 32G, fluorine ions are implanted into the polysilicon film 4b, for example, at an acceleration voltage of 30 keV and a dose of $1 \times 10^{15}$ cm$^{-2}$. The resultant structure is annealed in a nitrogen atmosphere 850° C. for 30 min. With this annealing, finally, the fluorine introduced into the polysilicon film 4a is diffused into the oxynitride film 3a and the silicon oxide film 3b, and the fluorine introduced into the polysilicon film 4b is diffused into the silicon oxide film 3b. In addition, the fluorine introduced into the silicon substrate 1 is diffused into the oxynitride film 3a. As a result, the fluorine concentrations near the two interfaces of the oxynitride film 3a become equal to or higher than the fluorine concentration near the central portion of the oxynitride film 3a. In addition, the fluorine concentrations near the two interfaces of the silicon oxide film 3b become equal to or higher than the fluorine concentration near the central portion of the silicon oxide film 3b.

Figure 32H:
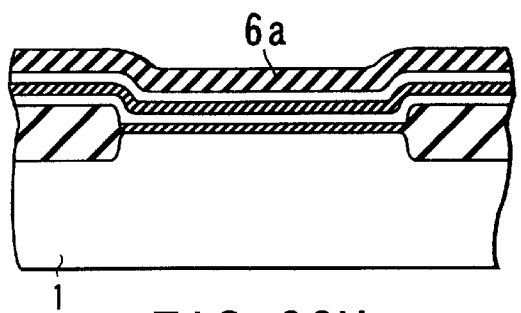

As shown in FIG. 32H, the CVD oxide film 6a is deposited on the entire surface of the resultant structure.

Figure 32L:
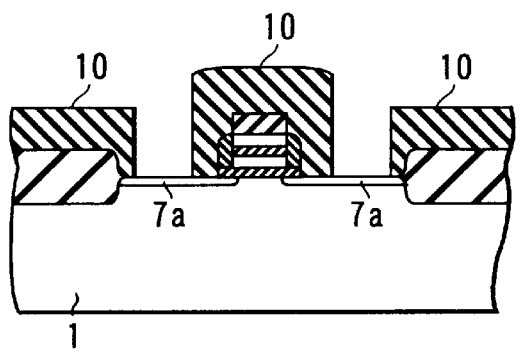
Figure 32I:
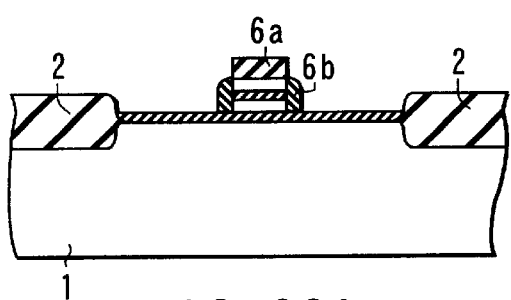

As shown in FIG. 32I, the CVD oxide film 6a, the polysilicon film 4b, the silicon oxide film 3b, and the polysilicon film 4a are etched by reactive ion etching to form a gate portion. The oxide film 6b is then formed by pyrogenic oxidation using a gas mixture of hydrogen and oxygen.

Figure 32M:
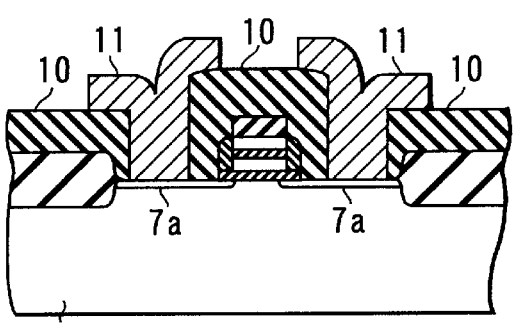
Figure 32J:
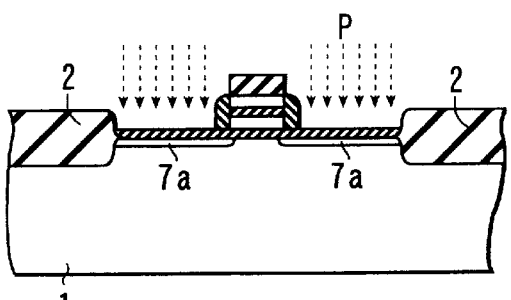

As shown in FIG. 32J, for example, phosphorus ions are implanted into the resultant structure at a dose of $5 \times 10^{15}$ cm$^{-2}$. Thereafter, annealing is performed, for example, at 950° C. for 30 sec to diffuse the phosphorus ions into the silicon substrate and activate them, thereby forming the diffusion layers 7a serving as source and drain regions.

Figure 32K:
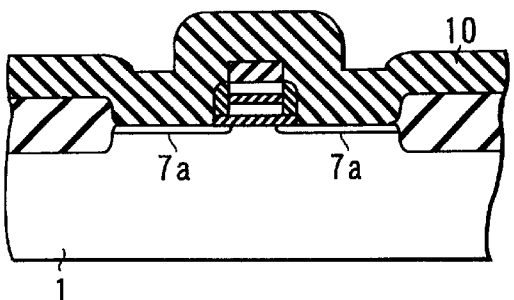

As shown in FIG. 32K, the 300-nm thick silicon oxide film 10 is deposited on the entire surface of the resultant structure by CVD.

As shown in FIG. 32L, contact holes are formed in the silicon oxide film 10 by anisotropic dry etching.

Finally, as shown in FIG. 32M, an 800-nm thick aluminum film containing, for example, 0.5% of silicon and 0.5% of copper is formed on the resultant structure. This aluminum film is patterned to form the source and drain electrodes 11. The resultant structure is annealed in a nitrogen atmosphere containing 10% of hydrogen at 450° C. for 15 min.

With this process, fluorine can be introduced into the two interfaces of the first gate insulating film 3a and the two interfaces of the second gate insulating film 3b. The amounts of fluorine in the respective interfaces can be controlled by changing the doses of fluorine to be ion-implanted. Therefore, the reliability with respect to electrical stresses in write/erase operations can be greatly improved.

21st Embodiment

The 21st embodiment of the present invention will be described next with reference to FIGS. 33A to 33K. Since the final structure is the same as that shown in FIG. 31, a description thereof will be omitted.

Figure 33A:
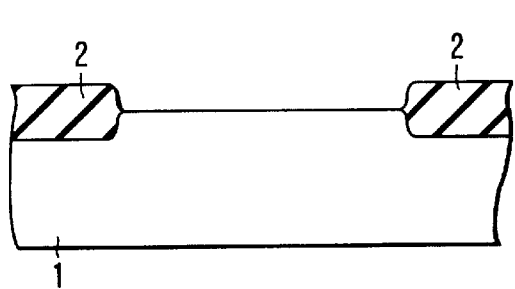
FIGS. 33A to 33K are sectional views sequentially showing the steps in manufacturing a nonvolatile semiconductor memory according to the 21st embodiment of the present invention.

First of all, as shown in FIG. 33A, for example, a (100)-oriented p-type silicon substrate 1 with a resistivity of 4 to 6 Ωcm is prepared. Element isolation insulating films 2, each having a thickness of about 0.6 μm, are formed on the upper surface of the p-type silicon substrate 1 by a general selective oxidation method.

Figure 33D:
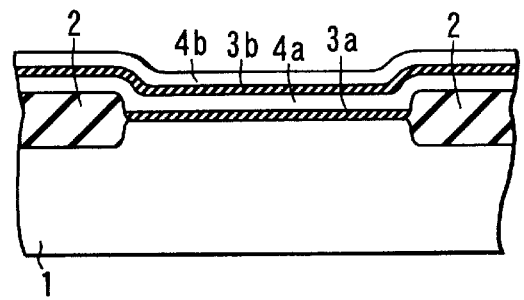
Figure 33B:
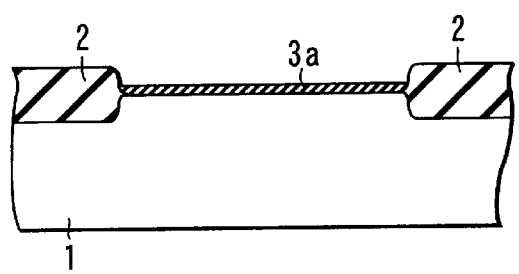

As shown in FIG. 33B, a 6-nm thick silicon oxide film is formed by thermal oxidation using dry oxygen. This silicon oxide film is exposed to, for example, an ammonia gas atmosphere to introduce nitrogen atoms into the silicon oxide film. As a result, an oxynitride film 3a serving as a first gate insulating film is formed on the substrate.

Figure 33E:
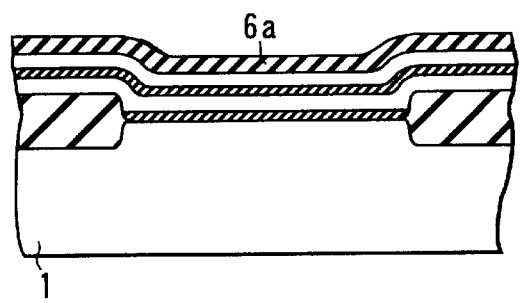
Figure 33C:
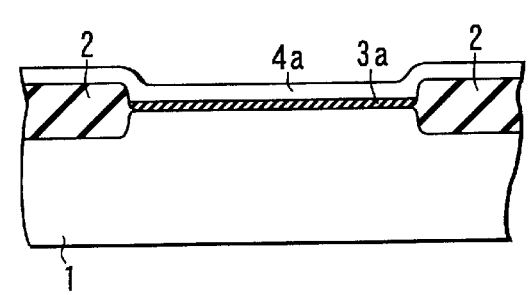

As shown in FIG. 33C, a 200-nm thick polysilicon film 4a serving as a first gate electrode is deposited on the oxynitride film 3a. Phosphorus is diffused into the resultant structure at 850° C. for 30 min by using, for example, phosphorus oxychloride (POCl$_3$) to dope the polysilicon film 4a with phosphorus. As a result, the resistance of the polysilicon film 4a decreases.

As shown in FIG. 33D, a 5-nm thick CVD silicon oxide film 3b serving as a second gate insulating film and a 200-nm thick polysilicon film 4b serving as a second gate electrode are continuously deposited on the polysilicon film 4a. Subsequently, phosphorus is diffused into the polysilicon film 4b at 850° C. for 30 min by using, for example, phosphorus oxychloride (POCl$_3$) to dope the polysilicon film 4b with phosphorus. As a result, the resistance of the polysilicon film 4b decreases.

As shown in FIG. 33E, a CVD oxide film 6a is deposited on the entire surface of the polysilicon film 4b.

Figure 33F:
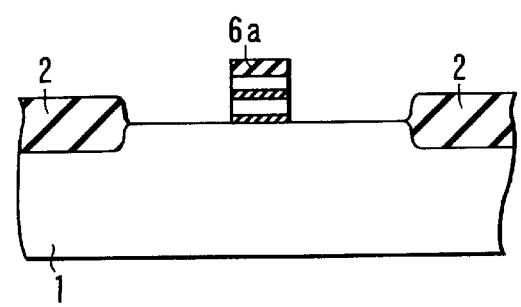

As shown in FIG. 33F, the CVD oxide film 6a, the polysilicon film 4b, the silicon oxide film 3b, the polysilicon film 4a, and the oxynitride film 3a are etched by reactive ion etching using a resist mask to form a gate portion.

Figure 33G:
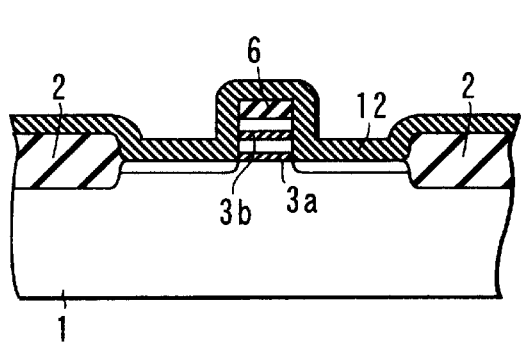

As shown in FIG. 33G, a silicon oxide film 12 containing fluorine is formed on the entire surface of the resultant structure by plasma CVD using, for example, a gas mixture of SiF$_4$ and oxygen. Annealing is then performed, for example, in a nitrogen atmosphere at 850° C. for 30 min to diffuse fluorine from the silicon oxide film 12. As a result, the fluorine concentrations near the two interfaces of the oxynitride film 3a become equal to or higher than the fluorine concentration near the central portion of the oxynitride film 3a. In addition, the fluorine concentrations near the two interfaces of the silicon oxide film 3b become equal to or higher than the fluorine concentration near the central portion of the silicon oxide film 3b.

Figure 33J:
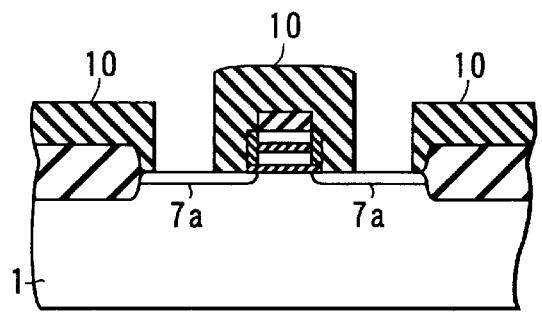
Figure 33H:
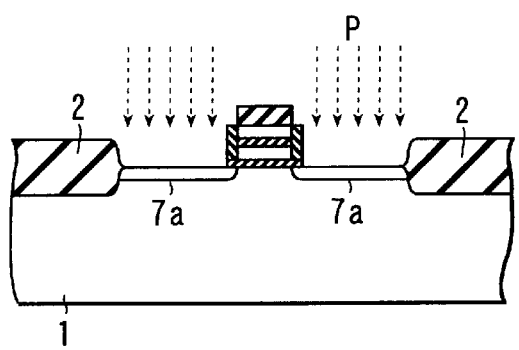

As shown in FIG. 33H, an oxide film 6b is formed by pyrogenic oxidation or the like using a gas mixture of hydrogen and oxygen. For example, phosphorus ions are implanted into the resultant structure at a dose of $5 \times 10^{15}$ cm$^{-2}$. Annealing is then performed at 950° C. for 30 sec to diffuse the phosphorus ions into the silicon substrate and activate them. As a result, diffusion layers 7a serving as source and drain regions are formed.

Figure 33K:
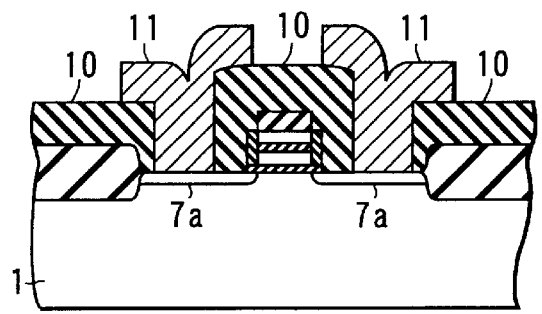
Figure 33I:
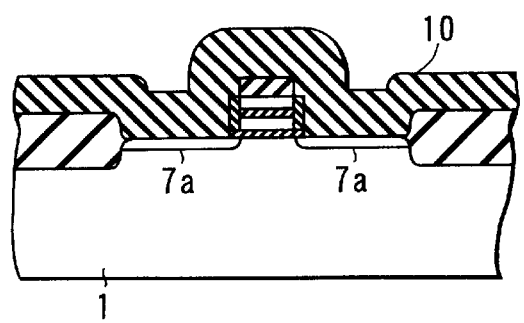

As shown in FIG. 33I, a 300-nm thick silicon oxide film 10 is deposited on the entire surface of the resultant structure by CVD.

As shown in FIG. 33J, contact holes are formed in the silicon oxide film 10 by anisotropic dry etching.

Finally, as shown in FIG. 33K, an 800-nm thick aluminum film containing, for example, 0.5% of silicon and 0.5% of copper is formed. This film is patterned to form source and drain electrodes 11. The resultant structure is annealed in a nitrogen atmosphere containing 10% of hydrogen at 450° C. for 15 min.

By diffusing fluorine contained in the fluorine-containing silicon oxide film 12 from the side surfaces of the gate portion in this manner, the fluorine can be introduced into the two interfaces of the first gate insulating film 3a and the two interfaces of the second gate insulating film 3b. The amounts of fluorine in the respective interfaces can be controlled by changing the fluorine concentration in the fluorine-containing silicon oxide film to be deposited.

Figure 34:
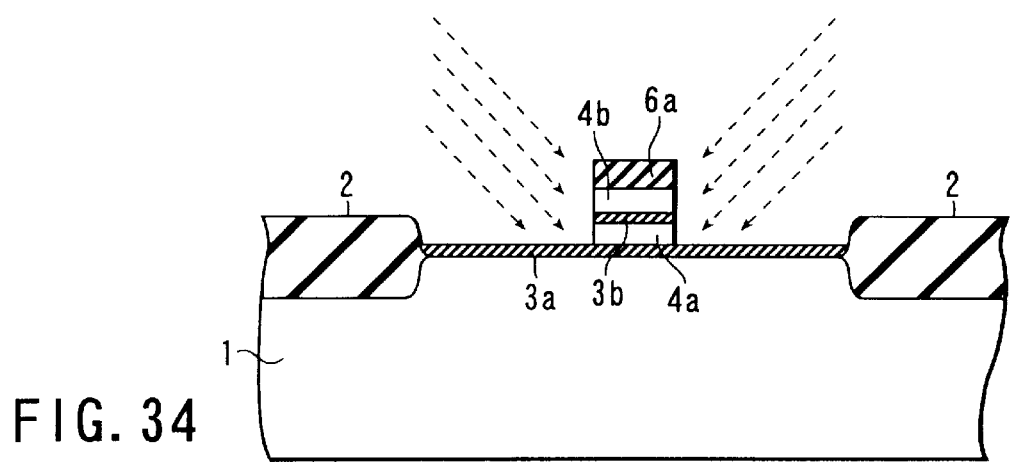
FIG. 34 is a sectional view for explaining another method of manufacturing the nonvolatile semiconductor memory according to the 21st embodiment.

In this embodiment, the fluorine-containing silicon oxide film is deposited after the gate formation process, and fluorine is diffused from the deposited film. However, as shown in FIG. 34, after the gate formation process, fluorine ions may be implanted obliquely into the substrate 1 to introduce the fluorine into the polysilicon films 4a and 4b and the gate insulating films 3a and 3b.

By introducing a halogen element into the interfaces of the gate insulating films in this manner, the problems associated with dielectric breakdown of an insulating film, low-electric-field leakage currents, and the like can be solved to a great extent, and the device characteristics and reliability can be improved.

22nd Embodiment

In each of the subsequent embodiments, the halogen element concentration in a gate insulating film reaches its maximum value at the two ends in the channel direction. In this case as well, the maximum halogen element concentration in the gate insulating film ranges from $10^{20}$ cm$^{-3}$ to $10^{21}$ cm$^{-3}$. This value appears at the two ends in the channel direction.

Figure 35:
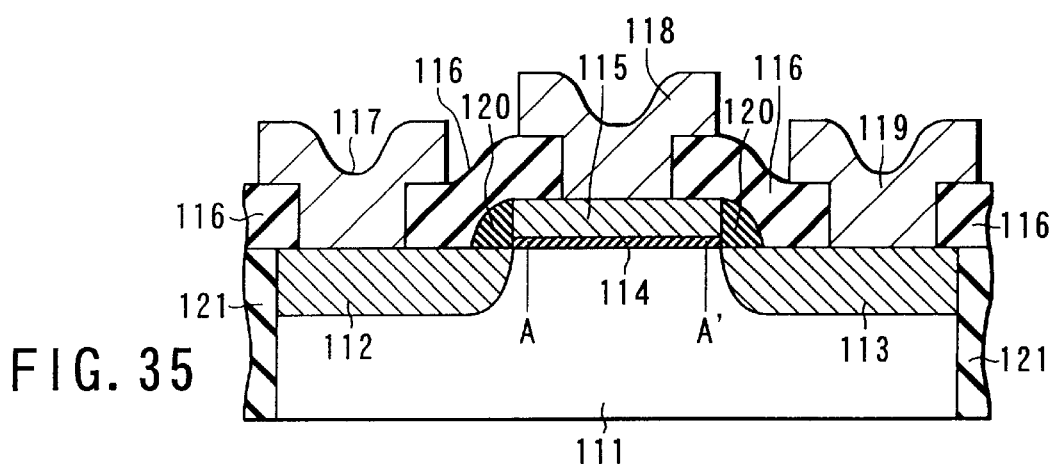
FIG. 35 is a sectional view showing a MOS transistor according to the 22nd embodiment of the present invention.

FIG. 35 is a sectional view showing an n-channel MOS transistor according to the 22nd embodiment of the present invention.

Figure 36:
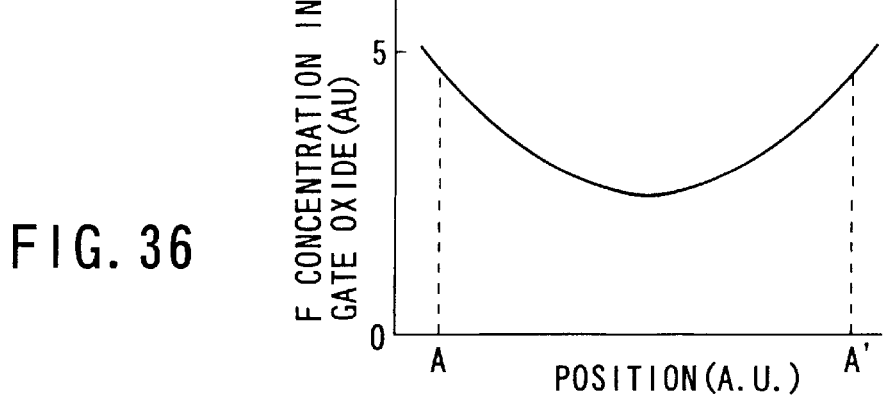
FIG. 36 is a graph showing the concentration distribution of fluorine in a gate insulating film in the channel direction in the present invention.

An element region is formed on a p-type silicon substrate 111 which is surrounded with element isolation regions 121. In this element region, a source region 112, a drain region 113, a gate insulating film 114, a gate electrode 115 made of a polysilicon film, and the like are formed. As the gate insulating film 114, a gate oxide film formed in a hydrogen burning atmosphere is used. F atoms are introduced into this gate oxide film such that the F concentration becomes high near the source and drain regions (near "A" and "A'") and low near the central portion of the channel region sandwiched between the source and drain regions, as shown in FIG. 36. Side wall films 120 (which are not necessarily required) made of a silicon nitride film are formed on side walls of the gate electrode 115. Al electrodes (a source electrode 117, a drain electrode 119, and an upper gate electrode 118) are formed on the substrate. These electrodes are respectively connected to the source region 112, the drain region 113, and the gate electrode 115 through the contact holes formed in a CVD silicon oxide film 116.

A method of manufacturing a MOS transistor according to the 22nd embodiment in FIG. 35 will be described next with reference to FIGS. 37A to 37F. Note that the gate side wall insulating films shown in FIG. 35 are omitted in this case.

Figure 37A:
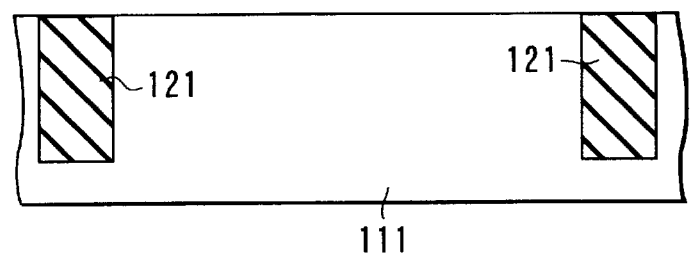
FIGS. 37A to 37F are sectional views sequentially showing the steps in manufacturing the MOS transistor according to the 22nd embodiment of the present invention.

As shown in FIG. 37A, trenches for element isolation are formed in the p-type silicon substrate 111 by reactive ion etching. The trenches are filled up with, for example, LP-TEOS films to form the element isolation regions 121.

Figure 37B:
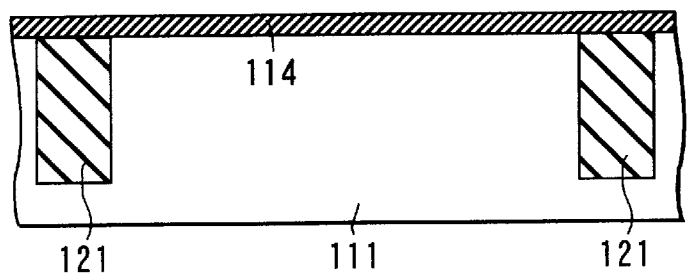

As shown in FIG. 37B, the gate insulating film 114 is formed on the p-type silicon substrate 111 by, for example, hydrogen pyrogenic oxidation at 750° C.

Figure 37C:
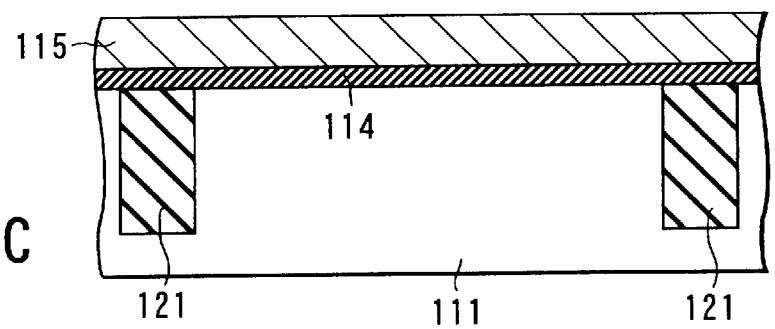

As shown in FIG. 37C, the polysilicon film 115 serving as a gate electrode is formed on the entire surface of the gate insulating film 114 by CVD.

Figure 37D:
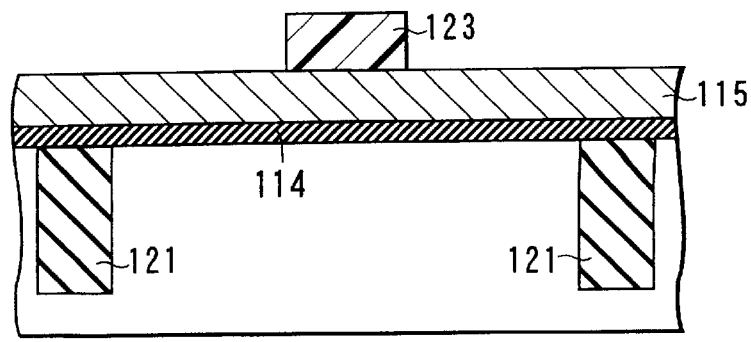

As shown in FIG. 37D, the entire surface of the gate electrode 115 is coated with a photoresist 123. The photoresist 123 is patterned. The gate electrode 115 is patterned into a gate pattern by reactive ion etching using the patterned photoresist 123 as a mask. Arsenic ions are implanted into the resultant structure, for example, at an acceleration voltage of 20 keV and a dose of $1\times10^{16}$ cm$^{-2}$ to form the source region 112 and the drain region 113.

Figure 37E:
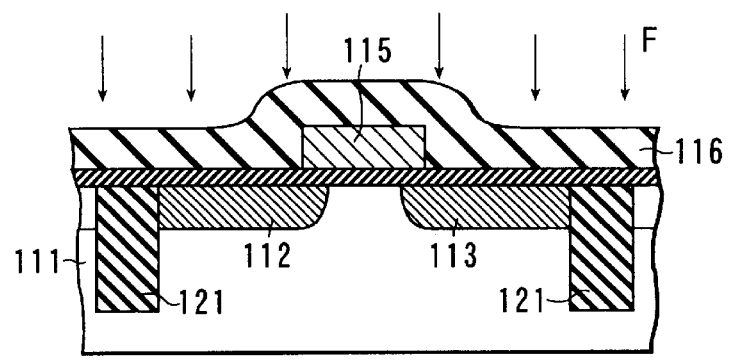

As shown in FIG. 37E, the CVD silicon oxide film 116 is deposited on the entire surface of the resultant structure. Thereafter, fluorine ions are implanted into the CVD silicon oxide film 116, for example, at an acceleration voltage of 20 keV and a dose of $1\times10^{14}$ cm$^{-2}$. The resultant structure is annealed, for example, in a nitrogen atmosphere at 850° C. for 30 min. As a result, the fluorine atoms in the CVD silicon oxide film 116 are diffused into the gate oxide film 114. In this case, since the gate electrode 115 is formed in the channel region on the upper surface of the silicon substrate 111, the concentration of fluorine atoms introduced into the gate oxide film 114 gradually decreases from the source region 112 and the drain region 113 toward the central portion of the channel region.

Figure 37F:
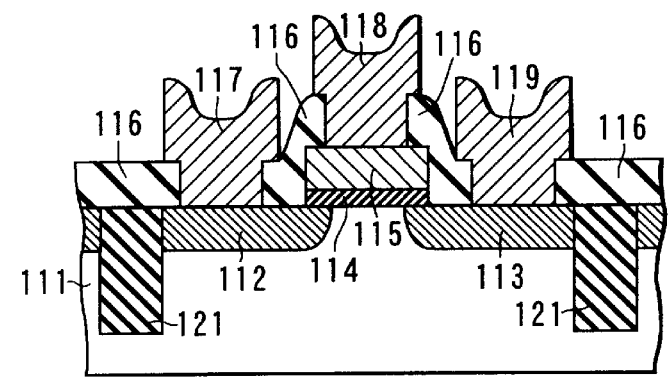

Finally, as shown in FIG. 37F, contact holes are formed in the CVD silicon oxide film 116, and Al is deposited on the entire surface of the resultant structure by sputtering. The Al film is then patterned by reactive ion etching to form the source electrode 117, the upper gate electrode 118, and the drain electrode 119.

With the above process, a MOS transistor with the maximum halogen element concentration at the two ends of the gate oxide film in the channel direction is finished.

23rd Embodiment

Figure 38:
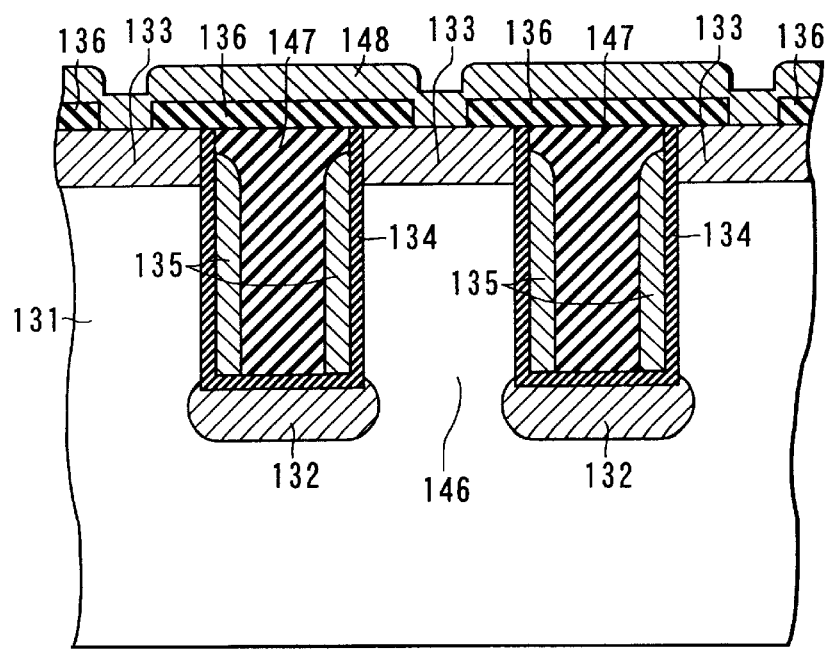
FIG. 38 is a sectional view showing a MOS transistor according to the 23rd of the present invention.

FIG. 38 is a sectional view showing an n-channel MOS transistor according to the 23rd embodiment of the present invention.

In this embodiment, trenches are formed in a p-type silicon substrate 131 by RIE, together with projections 146 surrounding the trenches. A MOS transistor is formed in a region near each trench. More specifically, a source region 132 is formed under the trench, and a drain region 133 is formed in the upper portion of the projection 146 of the p-type silicon substrate 131.

A gate oxide film 134 is formed on the inner wall of each trench by, for example, hydrogen pyrogenic oxidation. A gate electrode 135 made of a polysilicon film is formed inside the gate oxide film 134. The trench is filled up with, for example, an LP-TEOS film 147. An Al electrode 148 is formed through the contact holes formed in a CVD silicon oxide film 136 formed on the entire surface of the resultant structure.

The first method of manufacturing the MOS transistor in FIG. 38 will be described next with reference to FIGS. 39A to 39F.

Figure 39A:
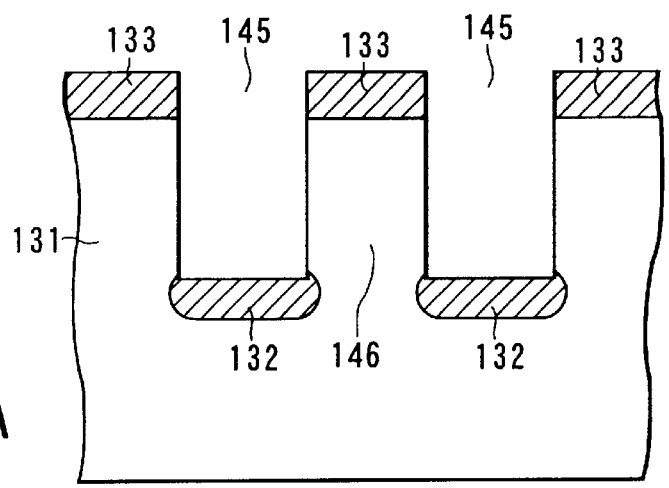
FIGS. 39A to 39F are sectional views sequentially showing the steps in manufacturing the MOS transistor according to the 23rd embodiment of the present invention.

As shown in FIG. 39A, trenches 145 are formed in the p-type silicon substrate 131 by reactive ion etching, together with the projections 146 surrounding the trenches. Arsenic ions are implanted into the substrate, for example, at an acceleration voltage of 20 keV and a dose of $1\times10^{16}$ cm$^{-2}$ to form the source region 132 and the drain region 133.

Figure 39B:
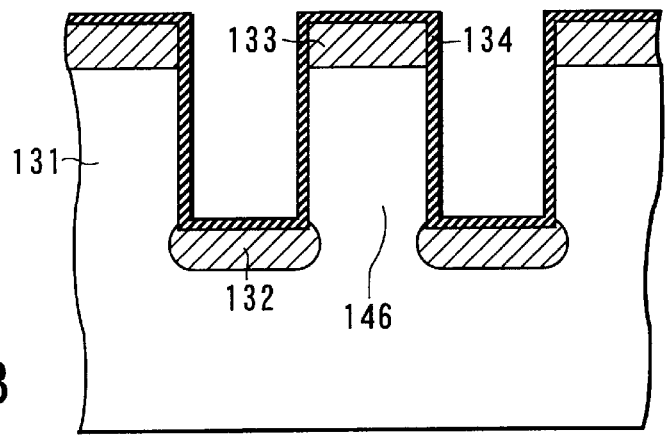

As shown in FIG. 39B, the gate oxide film 134 is grown on the upper surface of the substrate 131 by, for example, hydrogen pyrogenic oxidation at 750° C.

Figure 39C:
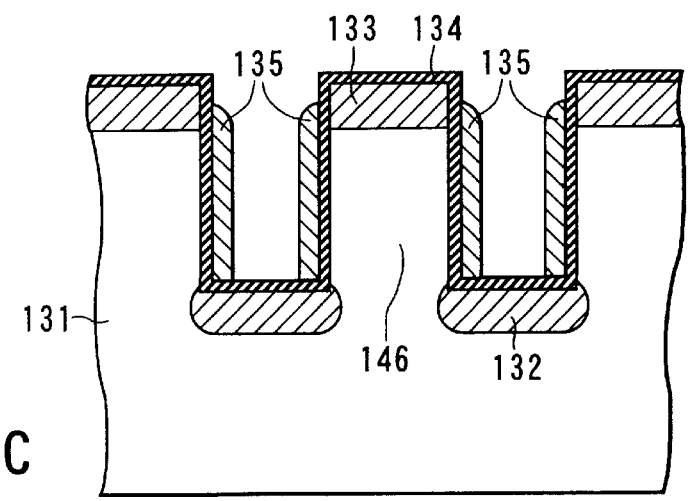

As shown in FIG. 39C, the polysilicon film 135 serving as a gate electrode is deposited on the entire surface of the resultant structure. Thereafter, the gate electrode 135 is patterned into a gate electrode by reactive ion etching.

Figure 39D:
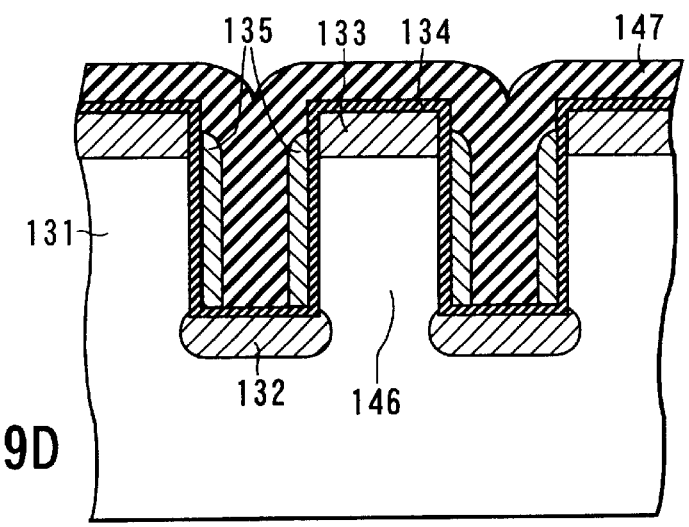

As shown in FIG. 39D, the LP-TEOS film 147 containing fluorine atoms is deposited on the entire surface of the resultant structure to fill up each trench. The fluorine (fluoride) concentration in a film formation gas is controlled with the lapse of time such that the concentration of fluorine atoms to be added becomes high at the start and end of the formation of the LP-TEOS film 147. With this process, the fluorine concentration in the LP-TEOS film 147 deposited near the source region 132 and the drain region 133 becomes higher than the fluorine concentration in the LP-TEOS film 147 between these regions.

Figure 39E:
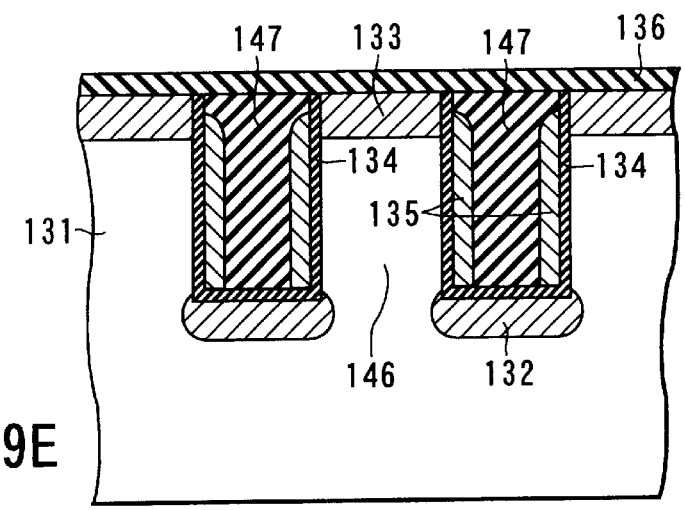

As shown in FIG. 39E, the buried LP-TEOS film 147 is etched back by a resist etch back method to be planarized. The CVD silicon oxide film 136 is deposited on the entire surface of the resultant structure. Annealing is then performed, for example, in a nitrogen atmosphere at 850° C. for 30 min to introduce fluorine atoms in the LP-TEOS film 147 into the gate oxide film 134. With this process, fluorine atoms can be introduced into the gate oxide film 134 with a profile in which the fluorine concentration is high near the source region 132 and the drain region 133.

Figure 39F:
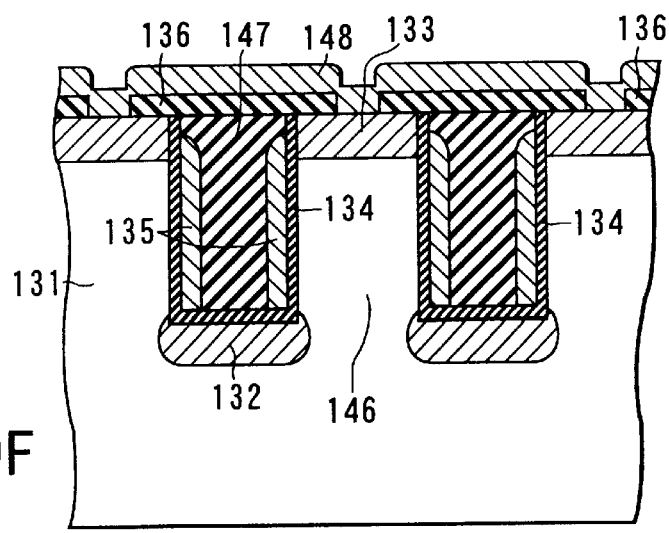

Finally, as shown in FIG. 39F, contact holes are formed in the CVD silicon oxide film 136, and Al is deposited on the entire surface of the resultant structure by sputtering. The deposited Al film is patterned by reactive ion etching to form the Al electrode 148.

In this embodiment, the fluorine concentration is set to be high near the source region 132 and the drain region 133. However, the concentration of fluorine atoms added to form the LP-TEOS film 147 may be set to be high only near the end of the formation of the LP-TEOS film 147, thereby introducing a high concentration of fluorine atoms into only the gate oxide film 134 near the drain region 133.

The second method of manufacturing the MOS transistor shown in FIG. 38 will be described next with reference to FIGS. 40A to 40D.

Figure 40A:
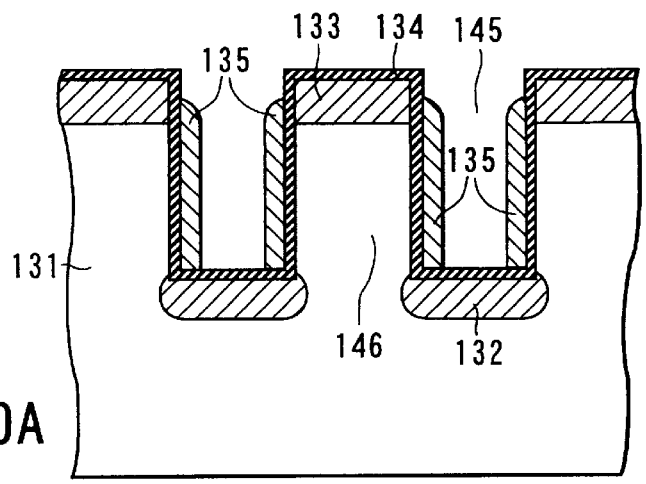
FIGS. 40A to 40D are sectional views sequentially showing other steps in manufacturing the MOS transistor according to the 23rd embodiment of the present invention.

First of all, the steps shown in FIGS. 39A to 39C are executed to form the structure shown in FIG. 40A.

Figure 40B:
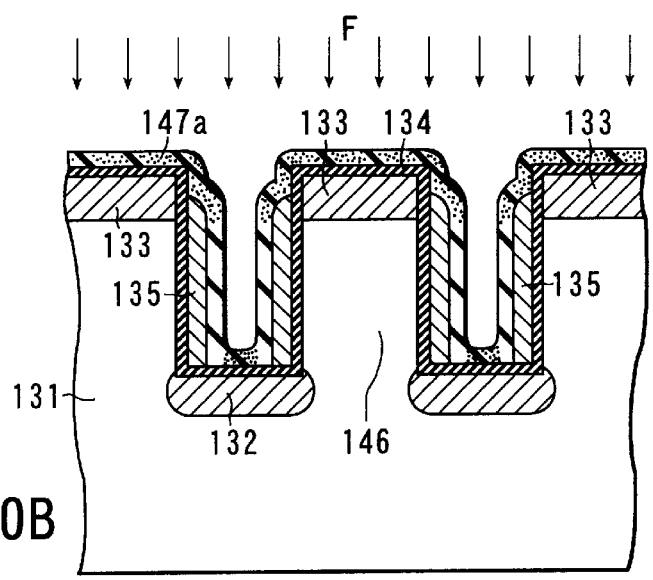

Subsequently, as shown in FIG. 40B, an LP-TEOS film 147a is deposited on the entire surface of the structure. In this case, the LP-TEOS film 147a does not fill up each trench, and a space is formed above the bottom portion of the trench. Thereafter, fluorine ions are implanted into the LP-TEOS film 147a, for example, at an acceleration voltage of 25 keV and a dose of $1 \times 10^{14}$ cm$^{-2}$. In this case, since the fluorine ions are implanted from above the substrate, fluorine atoms are not implanted much into a portion of the LP-TEOS film 147a which is formed on the middle portion of the side wall of the trench. That is, as indicated by the dots in FIG. 40B, fluorine atoms are implanted into the bottom and upper portions of the trench at high concentrations.

Figure 40C:
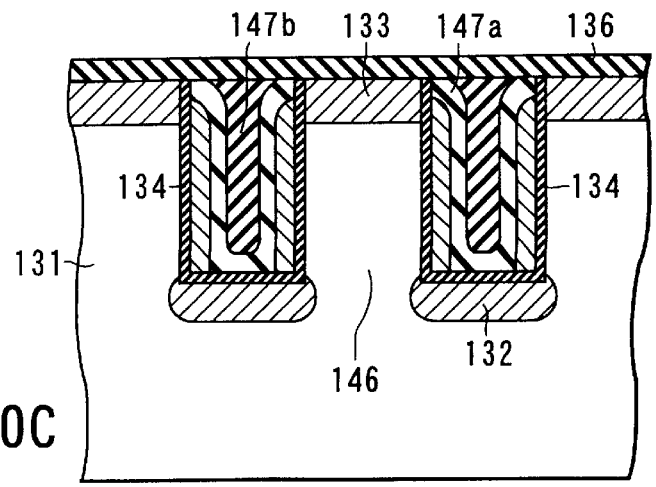

As shown in FIG. 40C, an LP-TEOS film 147b is deposited on the entire surface of the resultant structure to fill up the space of each trench. Thereafter, the LP-TEOS films 147a and 147b are etched back by a resist etch back method to be planarized. The CVD silicon oxide film 136 is deposited on the entire surface of the resultant structure. Annealing is then performed, for example, in a nitrogen atmosphere at 850° C. for 30 min to diffuse the fluorine atoms in the LP-TEOS film 147a into the gate oxide film 134. With this process, fluorine atoms can be introduced into the gate oxide film 134 with a profile in which the fluorine concentrations near the source region 132 and the drain region 133 become high.

Figure 40D:
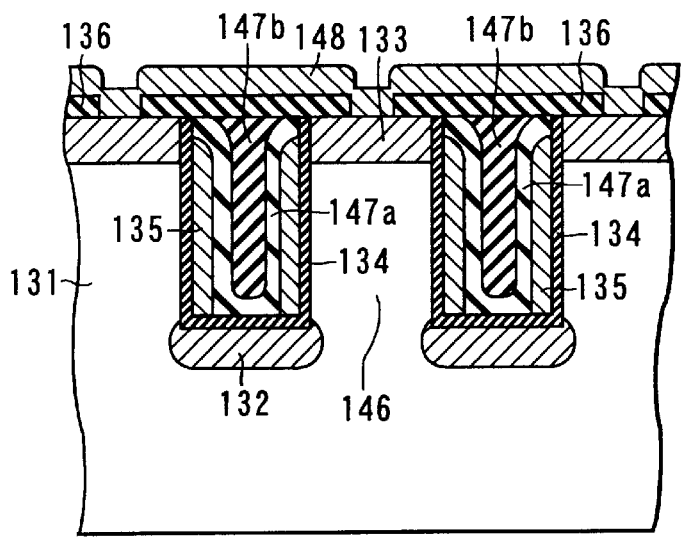

As shown in FIG. 40D, after contact holes are formed in the CVD silicon oxide film 136, Al is deposited on the entire surface of the resultant structure by sputtering. The deposited Al film is patterned by reactive ion etching to form the Al electrode 148.

24th Embodiment

The 24th embodiment of the present invention will be described next with reference to FIGS. 41A and 41B. In this embodiment, the present invention is applied to a nonvolatile semiconductor memory (EEPROM).

Figure 41A:
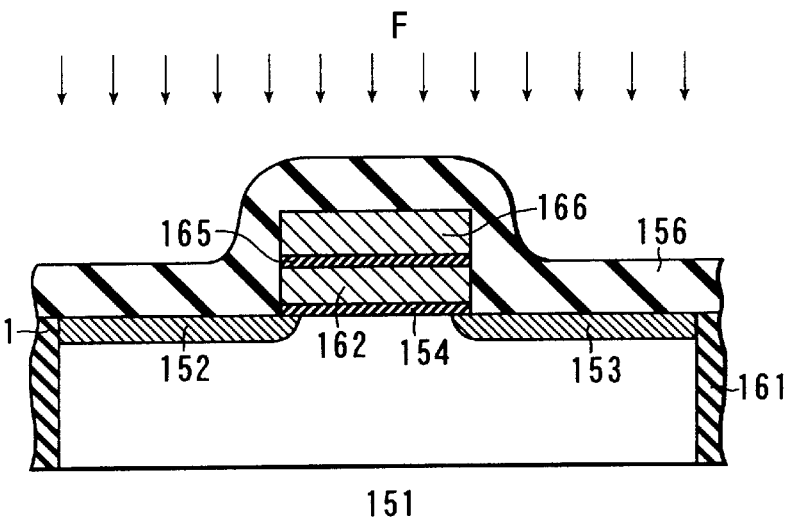
FIGS. 41A and 41B are sectional views sequentially showing other steps in manufacturing a MOS transistor according to the 24th embodiment of the present invention.

First of all, as shown in FIG. 41A, a tunnel oxide film 154, a polysilicon film 162 serving as a floating gate, which is deposited while being doped with an impurity, an interpoly insulating film 165, and a polysilicon film 166 serving as a control gate, which is deposited while being doped with an impurity, are continuously formed on a p-type silicon substrate 151 in which element isolation regions 161 are formed. Thereafter, these stacked films are patterned by reactive ion etching. N-type impurity ions are implanted into the resultant structure to form a source region 152 and a drain region 153. A CVD silicon oxide film 156 is deposited on the entire surface of the resultant structure.

Fluorine ions are implanted into the CVD silicon oxide film 156. The resultant structure is annealed in a nitrogen atmosphere to diffuse the fluorine atoms in the CVD silicon oxide film 156 into the tunnel oxide film 154. In this case, since the polysilicon film 162 and the polysilicon film 166 are formed in the channel region on the upper surface of the silicon substrate 151, the concentration of fluorine atoms introduced into the tunnel oxide film 154 gradually decreases from the source region 152 and the drain region 153 toward the central portion of the channel region.

Figure 41B:
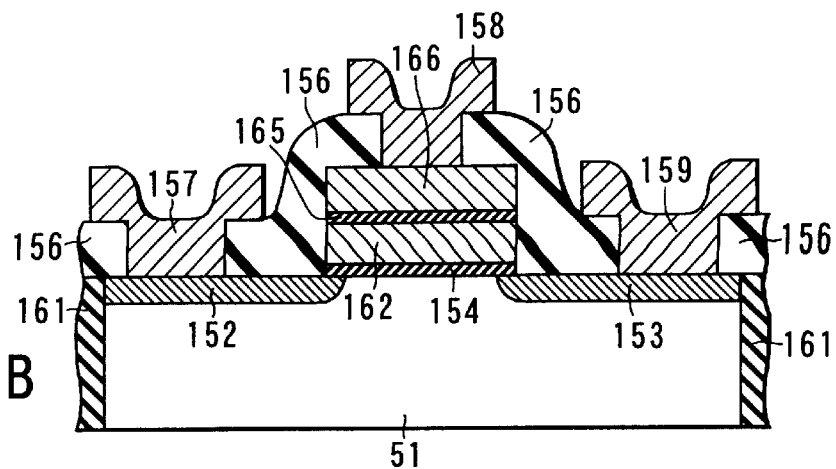

Finally, as shown in FIG. 41B, contact holes are formed in the CVD silicon oxide film 156. A source electrode 157, an upper gate electrode 158, and a drain electrode 159 are formed through these contact holes.

Such a halogen element concentration distribution in the gate oxide film can suppress an increase in the number of traps in the gate insulating film and a deterioration in dielectric breakdown strength. This can improve the characteristics and reliability of the semiconductor device.

25th Embodiment

FIGS. 42A to 42I are sectional views sequentially showing the steps in manufacturing a MOSFET according to the 25th embodiment of the present invention.

Figure 42A:
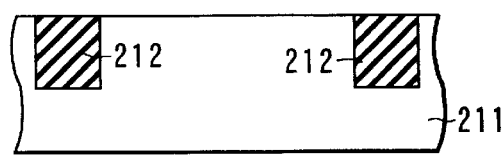
FIGS. 42A to 42I are sectional views sequentially showing the steps in manufacturing a MOS transistor according to the 25th embodiment of the present invention.

First of all, as shown in FIG. 42A, trenches are formed in a p-type silicon substrate 211 by RIE. These trenches are filled up with, for example, an LP-TEOS film to form element isolation films 212.

Figure 42F:
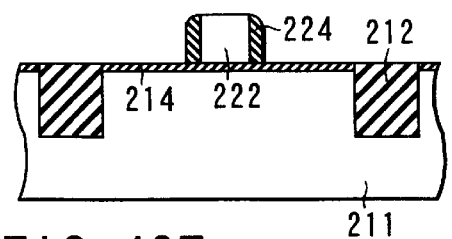
Figure 42B:
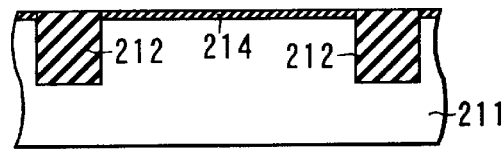

As shown in FIG. 42B, the silicon substrate is exposed to a gas mixture of oxygen and hydrogen, for example, at 750° C. and 1 atm to form a silicon oxide film. The silicon oxide film is then exposed to nitrogen monoxide gas (NO) diluted with nitrogen gas to 10% or nitrous oxide gas ($N_2O$), for example, at 900° C. As a result, nitrogen atoms are introduced into the silicon oxide film, and a silicon insulating film 214 is formed.

Figure 42G:
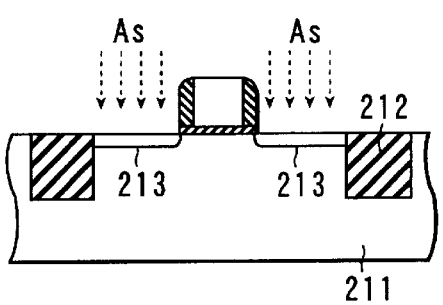
Figure 42C:
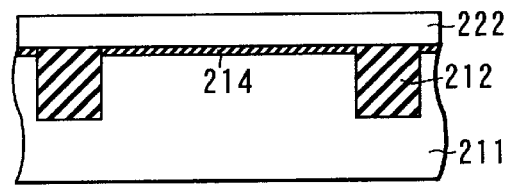

As shown in FIG. 42C, a polysilicon film 222 serving as a gate electrode is deposited on the entire surface of the silicon insulating film 214 by CVD.

Figure 42D:
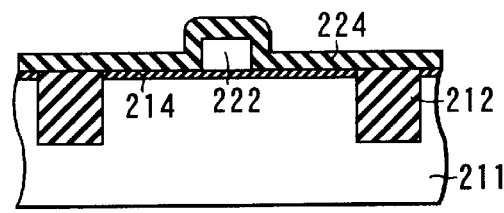

As shown in FIG. 42D, the polysilicon film 222 is processed in the form of a gate electrode by using a resist mask (not shown). A CVD silicon nitride film 224 having a thickness of 5 to 200 nm is deposited on the entire surface of the resultant structure, for example, at 450° C. and 10 mTorr to 1 atm by using a gas mixture of $SiH_4$ gas diluted with nitrogen gas and $NH_3$ gas.

Figure 42H:
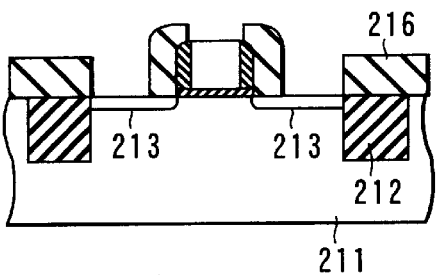
Figure 42E:
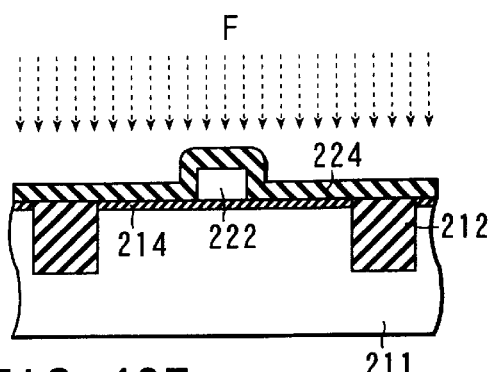

As shown in FIG. 42E, fluorine ions are implanted into the entire surface of the silicon nitride film 224 at an acceleration voltage of 10 to 50 keV and a dose of $1 \times 10^{13}$ cm$^{-2}$ to $1 \times 10^{16}$ cm$^{-2}$. The sample is then exposed to a nitrogen atmosphere at 800 to 850° C. for 1 to 60 min. As a result, the implanted fluorine atoms are introduced into the p-type silicon substrate 211 and the silicon insulating film 214.

Figure 42I:
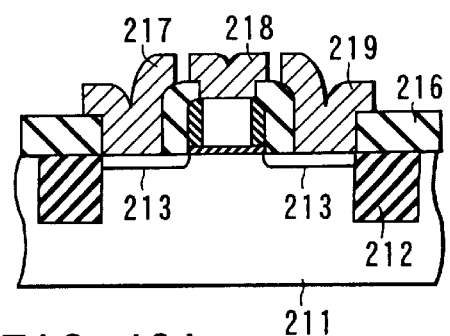

After this step, the silicon nitride film 224 is etched by RIE to form the gate side wall films 224 (FIG. 42F). Arsenic ions are implanted into the resultant structure, for example, at an acceleration voltage of 20 keV and a dose of 1×10 cm to form source and drain regions 213 (FIG. 42G). A CVD silicon oxide film 216 is deposited on the entire surface of the resultant structure, and contact holes are formed in this film (FIG. 42H). Finally, Al is deposited on the entire surface of the resultant structure by sputtering to fill up the contact holes. Thereafter, this Al film is patterned by RIE to form source and drain electrodes 217 and 219 and a gate electrode 218 (FIG. 42I).

With the above process, a semiconductor device having a fluorine concentration distribution in which the fluorine concentration changes in the channel direction of the gate insulating film is formed.

26th Embodiment

FIGS. 43A to 43I are sectional views sequentially showing the steps in manufacturing a MOSFET according to the 26th embodiment of the present invention.

Figure 43A:
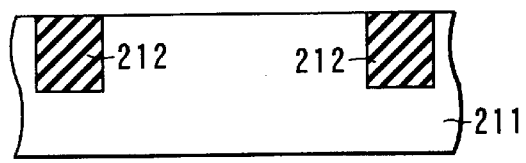
FIGS. 43A to 43I are sectional views sequentially showing the steps in manufacturing a MOS transistor according to the 26th embodiment of the present invention.
Figure 43F:
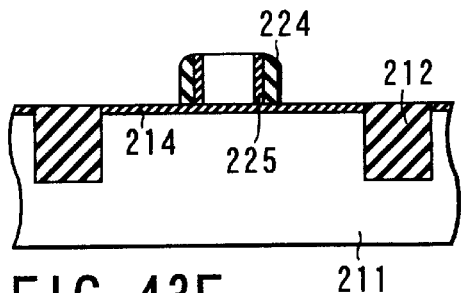
Figure 43B:
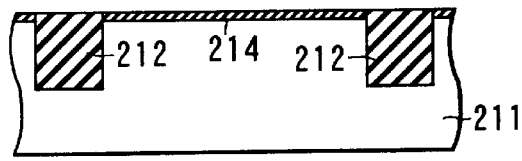
Figure 43G:
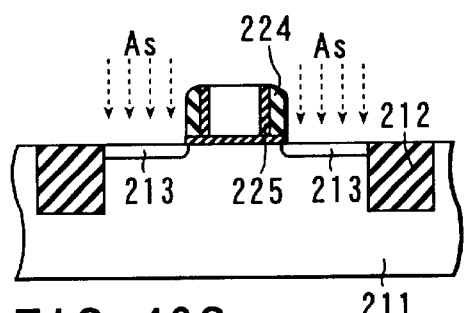
Figure 43C:
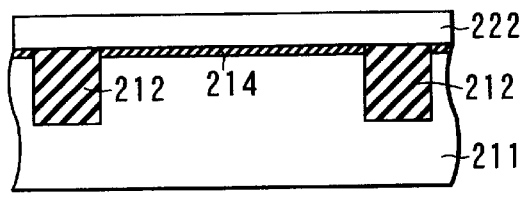

The steps shown in FIGS. 43A to 43C are executed in the same manner as those shown in FIGS. 42A to 42C in the 25th embodiment.

Figure 43H:
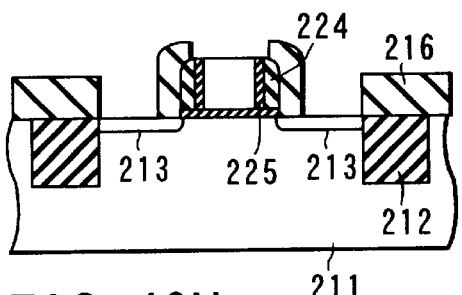
Figure 43D:
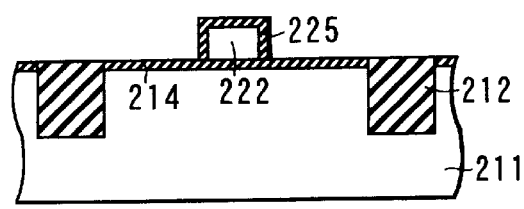

As shown in FIG. 43D, a polysilicon film 222 is processed in the form of a gate electrode by using a resist mask (not shown). The polysilicon film 222 is then exposed to a gas mixture of oxygen and $NF_3$ at 600 to 1,000° C. and 10 mTorr to 1 atm. As a result, a fluorine-containing silicon oxide film 225 having a thickness of 1 to 20 nm is formed around the polysilicon film (gate electrode) 222.

Figure 43I:
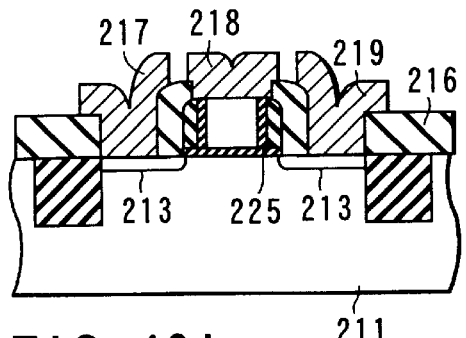
Figure 43E:
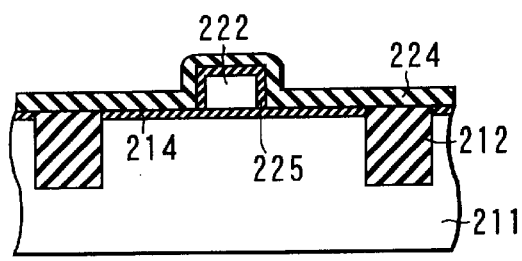

As shown in FIG. 43E, a CVD silicon nitride film 224 having a thickness of 5 to 200 nm is deposited on the entire surface of the resultant structure, for example, at 450° C. and 10 mTorr to 1 atm by using a gas mixture of $SiH_4$ gas diluted with nitrogen gas and $NH_3$ gas.

As shown in FIG. 43F, the silicon nitride film 224 is etched by RIE to form gate side wall insulating films.

The steps shown in FIGS. 43G to 43I are executed in the same manner as those shown in FIGS. 42G to 42I in the 25th embodiment.

In the step in FIG. 43D, the polysilicon film 222 is then exposed to a gas mixture of oxygen and $NF_3$ at 600 to 1,000° C. and 10 mTorr to 1 Torr. As a result, the fluorine-containing silicon oxide film 225 having a thickness of 1 to 20 nm is formed around the polysilicon film (gate electrode) 222. However, the present invention is not limited to this. For example, a portion around the polysilicon film serving as the gate electrode may be oxidized by doping it with a halogen compound such as $NF_3$ at 850 to 1,050° C. using a gas mixture of oxygen and hydrogen. Alternatively, a fluorine-containing silicon oxide film may be formed first, and then the resultant structure may be annealed, for example, in a nitrogen atmosphere at 300 to 850° C. for 1 to 60 min.

As shown in FIG. 44A, the fluorine-containing silicon oxide films 225 is brought into direct contact with the gate electrode polysilicon film. Instead of this structure, the following structures may be formed. As shown in FIG. 45A, after a gate polysilicon film is processed, the CVD silicon nitride films 224, each having a thickness of 1 to 50 nm, are deposited, for example, at 450° C. and 10 mTorr to 1 atm by using a gas mixture of $SiH_4$ diluted with nitrogen gas and $NH_3$ gas, and fluorine-containing silicon oxide films 225' are formed by using a gas mixture of oxygen and $NF_3$ or a gas mixture of oxygen, hydrogen, and $NF_3$, or fluorine-containing silicon nitride films 225' are formed by using a gas mixture of $SiH_4$ and $NH_3$.

FIGS. 44B and 45B respectively show halogen element concentration distributions corresponding to FIGS. 44A and 45A.

A fluorine concentration profile in the channel direction can be controlled by implanting fluorine ions at a desired concentration ($1 \times 10^{13}$ to $1 \times 10^{16}$ cm$^{-2}$), instead of controlling the fluorine concentrations at the gate side walls in this manner.

As shown in FIG. 46, layers 230a, 230b, 230c, and 230d having different concentrations can be stacked to constitute the gate side walls, thereby allowing control of the concentration profile.

It is noted that dotted lines under the gate side wall insulators in FIGS. 44A, 45A and 46 indicate the F diffusion areas diffused from the respective gate side wall insulators.

A channel with a desired fluorine concentration and a desired profile can be formed by controlling the fluorine concentrations in the silicon oxide film on the gate side walls and the silicon nitride film and also controlling the annealing conditions in the annealing step of diffusing fluorine.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A semiconductor device comprising:
   a semiconductor substrate;
   a first insulating film formed on said semiconductor substrate;
   an electrode formed on said first insulating film, said electrode comprising a first sub-electrode formed on said first insulating film, a second insulating film formed on said first sub-electrode, and a second sub-electrode formed on said second insulation film; and
   a pair of impurity diffusion layers containing a halogen element and formed on said semiconductor substrate extending along two ends of said electrode so as to interpose said electrode therebetween,
   wherein each of said first insulating film and second insulating film contains the halogen element and any one of a combination of silicon and nitrogen and a combination of silicon, oxygen, and nitrogen, and a maximum concentration of the halogen element in said first insulating film ranges from $10^{20}$ atoms/cm$^3$ to $10^{21}$ atoms/cm$^3$ inclusive.

2. A device according to claim 1, wherein the halogen element is fluorine.

3. A device according to claim 1, wherein said semiconductor substrate, said insulating film, and said electrode constitute a capacitor.

4. A semiconductor device comprising:
   a semiconductor substrate;
   a first insulating film formed on said semiconductor substrate and containing a halogen element;
   a gate electrode formed on said first insulating film, said gate electrode comprising a first electrode formed on said first insulating film, a second insulating film formed on said first electrode and containing the halogen element, and a second electrode formed on said second insulation film; and
   a pair of impurity diffusion layers formed on said semiconductor substrate extending along two end portions of said electrode,
   wherein halogen element concentrations near an interface between said first insulating film and said semiconductor substrate and an interface between said first insulating film and said gate electrode are not less than a halogen element concentration near a central portion of said first insulating film in a direction of thickness, halogen element concentrations near an interface between said second insulating film and said first electrode and an interface between said second insulating film and said second electrode are not less than a halogen element concentration near a central portion of said second insulating film in a direction of thickness, each of said first insulating film and second insulating film further contains any one of a combination of silicon and nitrogen and a combination of silicon, oxygen, and nitrogen, and a concentration of the halogen element throughout said first insulating film and said second insulating film ranges from $10^{20}$ atoms/cm$^3$ to $10^{21}$ atoms/cm$^3$ inclusive.

5. A device according to claim 4, wherein a maximum concentration of the halogen element in said first insulating film ranges from $10^{20}$ atoms/cm$^3$ to $10^{21}$ atoms/cm$^3$ inclusive.

6. A device according to claim 4, wherein a maximum concentration of the halogen element in said second insulating film ranges from $10^{20}$ atoms/cm$^3$ to $10^{21}$ atoms/cm$^3$ inclusive.

7. A semiconductor device comprising:

a semiconductor substrate;

a first insulating film formed on said semiconductor substrate;

an electrode formed on said first insulating film; and a pair of impurity diffusion layers containing a halogen element and formed on said semiconductor substrate extending along two ends of said electrode so as to interpose said electrode therebetween, wherein said first insulating film contains the halogen element and any one of a combination of silicon and nitrogen and a combination of silicon, oxygen, and nitrogen, and a maximum concentration of the halogen element in said first insulating film ranges from $10^{20}$ atoms/cm$^3$ to $10^{21}$ atoms/cm$^3$ inclusive.

8. A semiconductor device comprising:

a semiconductor substrate;

a first insulating film formed on said semiconductor substrate; and an electrode formed on said first insulating film, wherein said first insulating film contains a halogen element and any one of a combination of silicon and nitrogen and a combination of silicon, oxygen, and nitrogen, and a concentration of the halogen element throughout said first insulating film ranges from $10^{20}$ atoms/cm$^3$ to $10^{21}$ atoms/cm$^3$ inclusive, and said semiconductor substrate, said insulating film, and said electrode constituting a capacitor.

9. A semiconductor device comprising:

a semiconductor substrate;

a gate insulating film formed on said semiconductor substrate; and an electrode formed on said gate insulating film, wherein said gate insulating film contains fluorine and any one of a combination of silicon and nitrogen and a combination of silicon, oxygen, and nitrogen, and a concentration of fluorine throughout said gate insulating film ranges from $10^{20}$ atoms/cm$^3$ to $10^{21}$ atoms/cm$^3$ inclusive.

10. A semiconductor device comprising:

a semiconductor substrate;

a first insulating film formed on said semiconductor substrate;

an electrode formed on said first insulating film; and a pair of impurity diffusion layers formed on said semiconductor substrate extending along two ends of said electrode so as to interpose said electrode therebetween, wherein said first insulating film contains a halogen element and any one of a combination of silicon and nitrogen and a combination of silicon, oxygen and nitrogen, and a concentration of the halogen element throughout said first insulating film ranges from $10^{20}$ atoms/cm$^3$ to $10^{21}$ atoms/cm$^3$ inclusive.

11. The device according to claim 10, wherein said impurity diffusion layers contain the halogen element.

* * * * *